United States Patent
Shibazaki

(10) Patent No.: US 9,946,171 B2
(45) Date of Patent: *Apr. 17, 2018

(54) MOVABLE BODY APPARATUS, EXPOSURE APPARATUS, EXPOSURE METHOD, AND DEVICE MANUFACTURING METHOD

(71) Applicant: NIKON CORPORATION, Tokyo (JP)

(72) Inventor: Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 240 days.

This patent is subject to a terminal disclaimer.

(21) Appl. No.: 14/854,933

(22) Filed: Sep. 15, 2015

(65) Prior Publication Data

US 2016/0004169 A1 Jan. 7, 2016

Related U.S. Application Data

(62) Division of application No. 12/851,929, filed on Aug. 6, 2010, now Pat. No. 9,164,400.

(Continued)

(30) Foreign Application Priority Data

Aug. 7, 2009 (JP) ................. 2009-184395
Aug. 7, 2009 (JP) ................. 2009-184434

(Continued)

(51) Int. Cl.
G03B 27/62 (2006.01)
G03F 7/20 (2006.01)

(52) U.S. Cl.
CPC .......... *G03F 7/70866* (2013.01); *G03F 7/707* (2013.01); *G03F 7/70133* (2013.01);

(Continued)

(58) Field of Classification Search
CPC .............. G03F 7/7015; G03F 7/70716; G03F 7/70725; G03F 7/70825; G03F 7/70866;

(Continued)

(56) References Cited

U.S. PATENT DOCUMENTS 4,780,617 A 10/1988 Umatate et al.
5,448,332 A 9/1995 Sakakibara et al.
(Continued)

FOREIGN PATENT DOCUMENTS

EP 1 420 298 A2 5/2004
JP H09-92613 A 4/1997
(Continued)

OTHER PUBLICATIONS

International Search Report issued in International Application No. PCT/JP20101004971 dated Nov. 16, 2010.

(Continued)

*Primary Examiner* — Christina Riddle
(74) *Attorney, Agent, or Firm* — Oliff PLC

(57) ABSTRACT

One pair each of a Y linear motor (a total of four) on the +X side and the −X side that drive a reticle stage include one pair each of a stator section (a total of four) and three each of a mover section (a total of six) on the +X side and the −X side. In this case, the three each of the mover sections on the +X side and the −X side configure one each of a mover. The mover section located in the center in the Z-axis direction of each of the movers is used in common by each pair of the Y linear motors. Therefore, the weight of the mover section (reticle stage) of the reticle stage device is reduced, which allows a higher acceleration. Further, the mover section located in the center in the Z-axis direction of each of the movers coincides with a neutral plane of the reticle stage.

24 Claims, 18 Drawing Sheets

Related U.S. Application Data

(60) Provisional application No. 61/272,097, filed on Aug. 14, 2009, provisional application No. 61/272,096, filed on Aug. 14, 2009, provisional application No. 61/272,094, filed on Aug. 14, 2009, provisional application No. 61/272,075, filed on Aug. 13, 2009.

(30) Foreign Application Priority Data

| Aug. 7, 2009 | (JP) | 2009-184451 |
|---|---|---|
| Aug. 7, 2009 | (JP) | 2009-184472 |

(52) U.S. Cl.
CPC ...... *G03F 7/70716* (2013.01); *G03F 7/70725* (2013.01); *G03F 7/70758* (2013.01); *G03F 7/70775* (2013.01); *G03F 7/70858* (2013.01); *G03F 7/70933* (2013.01); *G03F 7/70941* (2013.01); *Y10T 74/20354* (2015.01)

(58) Field of Classification Search
CPC ............ G03F 7/70875; G03F 7/70933; G03F 7/70975; G03F 7/70841; G03F 7/70775
USPC ... 355/30, 52, 53, 55, 67–71, 72–74, 75–77; 250/492.1, 492.2, 492.22, 493.1, 548; 430/5
See application file for complete search history.

(56) References Cited

U.S. PATENT DOCUMENTS

| 5,534,970 | A | 7/1996 | Nakashima et al. | |
|---|---|---|---|---|
| 5,646,413 | A | 7/1997 | Nishi | |
| 5,721,605 | A | 2/1998 | Mizutani | |
| 5,969,441 | A | 10/1999 | Loopstra et al. | |
| 6,208,407 | B1 | 3/2001 | Loopstra | |
| 6,480,260 | B1 | 11/2002 | Donders et al. | |
| 6,590,634 | B1 | 7/2003 | Nishi et al. | |
| 6,611,316 | B2 | 8/2003 | Sewell | |
| 6,952,253 | B2 | 10/2005 | Lof et al. | |
| 7,023,610 | B2 | 4/2006 | Ohtsuki et al. | |
| 7,489,389 | B2 | 2/2009 | Shibazaki | |
| 7,561,280 | B2 | 7/2009 | Schluchter et al. | |
| 7,589,822 | B2 | 9/2009 | Shibazaki | |
| 2001/0028456 | A1* | 10/2001 | Nishi | G03F 7/70733 356/400 |
| 2002/0018190 | A1* | 2/2002 | Nogawa | G03F 7/70525 355/30 |
| 2002/0041377 | A1* | 4/2002 | Hagiwara | G03F 7/706 356/399 |
| 2003/0197841 | A1 | 10/2003 | Araki et al. | |
| 2004/0048174 | A1 | 3/2004 | Roux et al. | |
| 2004/0048400 | A1 | 3/2004 | Roux et al. | |
| 2005/0062980 | A1 | 3/2005 | Roux et al. | |
| 2005/0248744 | A1* | 11/2005 | Shibazaki | G03F 7/70716 355/72 |
| 2006/0082743 | A1* | 4/2006 | Yonekawa | G03F 7/70925 355/30 |
| 2006/0098184 | A1 | 5/2006 | Shibazaki | |
| 2007/0288121 | A1* | 12/2007 | Shibazaki | G03F 7/70516 700/213 |
| 2007/0291261 | A1 | 12/2007 | Kobayashi | |
| 2008/0088843 | A1 | 4/2008 | Shibazaki | |
| 2009/0059190 | A1* | 3/2009 | Tanaka | F16C 29/025 355/30 |
| 2010/0073661 | A1 | 3/2010 | Shibazaki et al. | |
| 2012/0057140 | A1 | 3/2012 | Aoki | |

FOREIGN PATENT DOCUMENTS

| JP | H10-55953 | A | 2/1998 |
|---|---|---|---|
| JP | 2001196303 | A | 7/2001 |
| JP | 2001-513267 | A | 8/2001 |
| JP | 2001284217 | A | 10/2001 |
| JP | 2003068620 | A | 3/2003 |
| JP | 2004104130 | A | 4/2004 |
| JP | 2005-079368 | A | 3/2005 |
| JP | 2006-005114 | A | 1/2006 |
| JP | 2006178318 | A | 7/2006 |
| JP | 2007-093546 | A | 4/2007 |
| JP | 2008-078377 | A | 4/2008 |
| JP | 2008166614 | A | 7/2008 |
| JP | 2008277579 | A | 11/2008 |
| WO | 99/32940 | A1 | 7/1999 |
| WO | 99/49504 | A1 | 9/1999 |
| WO | 01/35168 | A1 | 5/2001 |
| WO | 02/093626 | A1 | 11/2002 |
| WO | 03/054936 | A1 | 7/2003 |
| WO | 2004/055803 | A1 | 7/2004 |
| WO | 2005/074014 | A1 | 8/2005 |
| WO | 2007/087301 | A2 | 8/2007 |
| WO | 2009/125867 | A1 | 10/2009 |

OTHER PUBLICATIONS

Written Opinion of the International Searching Authority issued in International Application No. PCT/JP2010/004971 dated Nov. 16, 2010.
Office Action issued in Korean Application No. 2011-7022316 dated Feb. 19, 2014.
Office Action issued in Japanese Application No. 2013-175341 dated May 20, 2014.
Nov. 14, 2014 Office Action issued in U.S. Appl. No. 12/851,929.
Jul. 10, 2015 Notice of Allowance issued in U.S. Appl. No. 12/851,929.
Jul. 27, 2015 Corrected Notice of Allowance issued in U.S. Appl. No. 12/851,929.
Jul. 24, 2014 Restriction Requirement issued in U.S. Appl. No. 12/851,929.

* cited by examiner

MOVABLE BODY APPARATUS, EXPOSURE APPARATUS, EXPOSURE METHOD, AND DEVICE MANUFACTURING METHOD

CROSS-REFERENCE TO RELATED APPLICATIONS

This is a Divisional of U.S. patent application Ser. No. 12/851,929 filed Aug. 6, 2010 (now U.S. Pat. No. 9,164,400), which claims the benefit of Provisional Application No. 61/272,075 filed Aug. 13, 2009, Provisional Application No. 61/272,094 filed Aug. 14, 2009, Provisional Application No. 61/272,096 filed Aug. 14, 2009, and Provisional Application No. 61/272,097 filed Aug. 14, 2009. The disclosure of each of the above-identified applications is hereby incorporated herein by reference in its entirety.

BACKGROUND OF THE INVENTION

Field of the Invention

The present invention relates to movable body apparatuses, exposure apparatus, exposure methods, and device manufacturing methods, and more particularly, to a movable body apparatus including a movable body which holds an object and is movable in a direction parallel to a first axis in a two-dimensional plane, an exposure apparatus which is equipped with the movable body apparatus and is used in a lithography process to produce electronic devices (microdevices) such as a semiconductor device, a liquid crystal display devices and the like and an exposure method of the exposure apparatus, and a device manufacturing method which uses the exposure apparatus or the exposure method to manufacture an electronic device (microdevice).

Description of the Background Art

Conventionally, in a lithography process for manufacturing electronic devices (microdevices) such as a semiconductor device, a liquid crystal display devices and the like, a projection exposure apparatus is mainly used that reduces and transfers a pattern formed on a mask or a reticle (hereinafter generally referred to as a "reticle") onto an object subject to exposure (hereinafter generally referred to as a "wafer") such as a wafer or a glass plate and the like, via a projection optical system. As the projection exposure apparatus, a step-and-repeat type reduction projection exposure apparatus (a so-called stepper), and a step-and-scan type projection exposure apparatus (a so-called scanning stepper) are used in relatively large numbers.

In recent years, a scanning type exposure apparatus such as a scanning stepper which synchronously moves in a predetermined scanning direction (scan direction) with respect to illumination light, and transfers a pattern formed on a reticle on a wafer via an optical system has become mainstream.

In the scanning type exposure apparatus such as a scanning stepper, a drive device to drive the reticle is also necessary for the reticle side, as well as the wafer side. In the recent scanning type exposure apparatus, as the driver of the reticle side, a reticle stage device is employed which drives a reticle stage supported by levitation on a reticle surface plate by air bearings and the like using, for example, a linear motor in the scanning direction in a predetermined stroke range, as well as finely drive the reticle stage in the scanning direction and a direction besides the scanning direction.

However, because scanning steppers are used when performing mass production of microdevices, improvement of throughput is inevitably requested. Therefore, in recent reticle stage devices, a reticle stage device is used in which an upper and lower pair of linear motors is provided for drive in the scanning direction on both sides of the reticle stage in a direction besides the scanning direction, and by these two pair of linear motors, the reticle stage is driven in the scanning direction with a neutral surface including the center of gravity of the reticle stage serving as a drive plane (refer to, for example, Kokai (Japanese Patent Unexamined Application Publication) No. 2008-166614). In the reticle stage device disclosed in Kokai (Japanese Patent Unexamined Application Publication) No. 2008-166614, in between the pair of linear motors on one side in the direction besides the scanning direction, a linear motor used for drive in the direction besides the scanning direction is provided, and an extended portion is provided between the pair of linear motors on one side in the direction besides the scanning direction, and a mirror used by the interferometer use was fixed to the extended portion.

In the reticle stage device disclosed in Kokai (Japanese Patent Unexamined Application Publication) No. 2008-166614, high acceleration and speedup can be realized, and by being driven in the center of gravity, generation of pitching moment can be effectively suppressed.

However, in the exposure apparatus, requirements are pressing for further improvement in throughput, and to achieve such requirements, in the scanning type exposure apparatus, a much higher acceleration of the reticle stage needs to be realized. Furthermore, in the exposure apparatus, it is required that (the image of) the pattern of a reticle is transferred (formed) on a substrate such as a wafer faithfully, without the image being blurred.

However, the device rule (practical minimum line width) of semiconductor devices and the like is becoming finer, and accompanying this, deformation of a patterned surface which occurs due to deformation of the reticle caused by its own weight and the like brings about defocus, distortion of the pattern image and the like, which in turn are becoming an obstacle when a desired exposure accuracy (including overlay accuracy) is to be achieved.

Further, in the projection exposure apparatus, the exposure wavelength has been shifted more to the short wavelength side so as to achieve high resolution in correspondence with finer integrated circuits. Currently, the mainstream of the wavelength is 248 nm of the KrF excimer laser, or 193 nm of an ArF excimer laser which belongs to the vacuum ultraviolet region having a shorter wavelength than the 248 nm. However, in ArF lithography, haze (fog) defect of the reticle has come to be a serious influence on the productivity and the production cost, and is becoming a major problem.

In the exposure apparatus, as a method to realize effective measures to comprehensively suppress the haze formation on the reticle, surrounding the space around the reticle and purging the space with the purge gas such as clean dry air or other purge gases so as to remove moisture, for example, to no more than a ppm order, can be performed.

And because the moisture is removed to no more than a ppm order, the inside of the purge space turns into a state where static electricity can very easily occur. The reticle is a representative of an object which is loaded and unloaded many times in the exposure apparatus. Therefore, with the reticle, the stage on which the reticle is mounted, and a carrier hand of the reticle and the like, a floating state occurs where there is no discharge for the electrostatic charges which are generated by being electrically insulated. By the electrostatic charge that is generated, the pattern on the reticle is vulnerable to damage by a so-called ESD (Electrostatic Discharge). It is said that the withstand pressure of a silicon nitride film is 0.1 V/A in general, and recent oxide films are thinned to several A. Therefore, because pattern destruction may occur even in a voltage of 1V or less, sufficient countermeasures against static electricity are necessary. Further, for example, the electrostatic charge generated on the reticle attracts undesirable substances which are referred to as a contamination, and such contamination becomes an interfering substance upon exposure.

As described above, in the exposure apparatus using ultraviolet rays, especially the ArF excimer laser beam, because water absorption in the wavelength of the ArF excimer laser beam is strong, water concentration is reduced and the concentration is strictly controlled in order to obtain enough transmittance, which can easily damage the pattern on the reticle by the so-called ESD (Electrostatic Discharge) due to the electrostatic charge which has been generated. On the other hand, because the exposure apparatus is used to perform mass production of semiconductor devices and the like, a high throughput is naturally required.

SUMMARY OF THE INVENTION

According to a first aspect of the present invention, there is provided a movable body apparatus, comprising: a movable body which holds an object and is movable in a direction parallel to a first axis in a two-dimensional plane; and a drive system which includes a first and second mover provided on both sides of a direction parallel to a second axis perpendicular to the first axis within the two-dimensional plane of the movable body, and a first and second stator which each generates a drive force that drives the movable body at least in a direction parallel to the first axis by performing an electromagnetic interaction between the first and second movers, respectively, wherein at least one of the first and second movers includes three mover sections which are placed at a predetermined distance in a direction parallel to a third axis orthogonal to the two-dimensional plane, and of the first and second stators, the stator corresponding to the at least one of the first and second movers includes a pair of stator sections which shares a mover section positioned in the center in a direction parallel to the third axis.

According to the apparatus, with the stators corresponding to the specific movers, of the three movers, by two mover sections in the center and on one side in a direction parallel to the third axis direction and one of a pair of stator sections, an electromagnetic driver which drives the movable body along a direction parallel to the first axis is structured, and by two mover sections in the center and on the other side in a direction parallel to the third axis direction and the other of a pair of stator sections, another electromagnetic driver which drives the movable body along a direction parallel to the first axis is structured. Therefore, by these two electromagnetic drivers, the movable body can be driven in a direction parallel to the first axis with high output. In addition to this, because the mover section which is located in the center of the direction parallel to the first axis is used in common by the two electromagnetic drive devices, it becomes possible to reduce the weight of the entire movable body apparatus when compared with the case where the two electromagnetic drive devices are completely separate. This allows a much higher acceleration of the movable body and the object held by the movable body and an improvement in position controllability.

According to a second aspect of the present invention, there is provided a first exposure apparatus which transfers a pattern formed on a mask on an object subject to exposure, the apparatus comprising: the movable body apparatus of the present invention on which the mask serving as the object is mounted on the movable body. According to the apparatus, because the mask can be driven with high precision, it becomes possible to transfer the pattern formed on the mask with high precision on the object subject to exposure with good precision by scanning exposure.

According to a third aspect of the present invention, there is provided a second exposure apparatus which synchronously moves a mask and an object subject to exposure in a predetermined direction and transfers a pattern formed on the mask onto the object subject to exposure, the apparatus comprising: a surface plate; a slider which holds the mask and moves in predetermined strokes in a direction parallel to a first axis corresponding to the predetermined direction on the surface plate; an illumination system which illuminates the mask by an illumination light; a first measurement system which obtains a positional information of the slider when the slider is in a predetermined range including an irradiation area of the illumination light in a direction parallel to the first axis; and a destaticizing apparatus which is provided on the surface plate on a carrier path of the mask positioned on one side of a direction parallel to the first axis with respect to the irradiation area of the illumination light, and removes static electricity with which the mask mounted on the slider is charged.

According to the apparatus, the apparatus is equipped with a destaticizing apparatus which is provided on the surface plate on the carrier path of the mask positioned on one side of the direction parallel to the first axis in the irradiation area of the illumination light, and removes static electricity with which the mask mounted on the slider is charged. Therefore, by the destaticizing apparatus, the static electricity which with the mask mounted on the slider is charged is removed on the carrier path of the mask, or in other words, before the slider which holds the mask moves to the irradiation area of the illumination light. Further, in this case, the destaticizing apparatus removes the static electricity with which the mask is charged from the surface plate side. Accordingly, the mask can be de-electrified effectively, without decreasing the throughput.

According to a fourth aspect of the present invention, there is provided a third exposure apparatus which synchronously moves a mask and an object subject to exposure in a predetermined direction and transfers a pattern formed on the mask onto the object subject to exposure via a projection optical system, while illuminating an illumination light on the mask on which the pattern is formed, the apparatus comprising: a movable body which holds the mask and moves in a direction parallel to a first axis corresponding to the predetermined direction on a two-dimensional plane orthogonal to a substantial optical axis of the projection optical system; a surface position measurement system which has a measurement area at a position distanced from the projection optical system on one side in a direction parallel to the first axis, and measures a first surface position information in a direction parallel to the optical axis of the patterned surface of the mask held by the movable body at a first measurement point inside the measurement area; a first measurement system which measures a second surface position information in a direction parallel to the optical axis of the movable body at a second measurement point which is in a predetermined positional relation with the measurement area; a second measurement system which measures a third surface position information in a direction parallel to the optical axis of the movable body at a third measurement point which is in the same positional relation as the measurement area and the second measurement point, with respect to an irradiation area of the illumination light corresponding to an area on the patterned plane projected on the object by the projection optical system; and a control system which controls a position of the movable body, based on measurement information of the surface position measurements system, the first measurement system, and the second measurement system.

According to the apparatus, the control system obtains the first surface position information based on the second surface position information using the surface position measurement system and the first measurement system in advance, and the surface position of the movable body holding the mask in the direction parallel to the substantial optical axis of the projection optical system can be controlled, using the first surface position information based on the second surface position information which has been obtained beforehand, while obtaining the third surface position information using the second measurement system on exposure. This allows the pattern formed on the mask to be transferred precisely on the object subject to exposure via the projection optical system, while suppressing the occurrence of exposure defects due to defocus.

According to a fifth aspect of the present invention, there is provided a fourth exposure apparatus which synchronously moves a mask and an object subject to exposure in a predetermined direction and transfers a pattern formed on the mask onto the object subject to exposure via a projection optical system, while illuminating an illumination light on the mask on which the pattern is formed, the apparatus comprising: a movable body which holds the mask and moves in a direction parallel to a first axis corresponding to the predetermined direction on a two-dimensional plane; a drive system which has a pair of movers fixed to both ends of the movable body in a direction parallel to a second axis perpendicular to the first axis within the two-dimensional plane, and a pair of stators engaging with the pair of movers, and makes a drive force generated between the mover and the stator act on the movable body to drive the movable body in a direction parallel to the first axis and to deform the movable body; and a measurement system which obtains positional information of the movable body at a plurality of measurement points within the two-dimensional plane by an optical method, and also obtains shape information of the movable body using the positional information at least in three measurement points which are distanced apart from each other in a direction parallel to the second axis of the plurality of measurement points.

According to the apparatus, the measurement system obtains positional information of the movable body at a plurality of measurement points within the two-dimensional plane by an optical method, and also obtains shape information of the movable body using the positional information at least in three measurement points which are distanced apart from each other in the direction parallel to the second axis of the plurality of measurement points. And, the drive system can deform the movable body, based on the shape information obtained by the drive system. This allows the drive system to deform the movable body so that, for example, the patterned surface of the mask held by the movable body becomes ideal. Accordingly, it becomes possible to transfer the pattern of the mask onto the object subject to exposure with good precision.

According to a sixth aspect of the present invention, there is provided forming (transferring) a pattern on an object to be exposed using the exposure apparatus according any one of the first to fourth exposure apparatus of the present invention; and developing the object subject to exposure on which the pattern is formed (transferred).

According to a seventh aspect of the present invention, there is provided a first exposure method in which a mask and an object is synchronously moved in a predetermined direction and a pattern formed on the mask is transferred onto the object via a projection optical system, while illuminating an illumination light on the mask on which the pattern is formed, the method comprising: obtaining a first surface position information in a direction parallel to the optical axis of a patterned surface of the mask held by a movable body at a first measurement point within a measurement area placed apart from the projection optical system on one side of a direction parallel to a first axis, and a second surface position information in a direction parallel to the optical axis of the movable body at a second measurement point in a predetermined relation with the measurement area, while moving the movable body holding the mask in a direction parallel to the first axis corresponding to the predetermined direction on a two-dimensional plane orthogonal to a substantial optical axis of the projection optical system in synchronous with the object; and measuring a third surface position information in a direction parallel to the optical axis of the projection optical system of the movable body at a third measurement point which is in the same positional relation as a positional relation between the measurement area and the second measurement point with respect to an irradiation area of the illumination light, when irradiating the pattern with the illumination light and projecting the pattern on the object with the projection optical system, while making the synchronous movement of the object and the movable body continue, and controlling a position in a direction parallel to the optical axis of the movable body based on results of the measurement and a relation between the first surface position information and the second surface position information.

According to this method, the first surface position information based on the second surface position information is measured (obtained) in advance, and when irradiating a pattern with the illumination light and projecting the pattern on the object by the projection optical system (on scanning exposure) while making the synchronized drive of the object and the movable body continue, the surface position of the movable body holding the mask in the direction parallel to the substantial optical axis of the projection optical system can be controlled, using the first surface position information based on the second surface position information which has been obtained beforehand, while obtaining the third surface position information using the second measurement system on exposure. This allows the pattern formed on the mask to be transferred precisely on the object via the projection optical system, while suppressing the occurrence of exposure defects due to defocus.

According to an eighth aspect of the present invention, there is provided a second exposure method in which a mask and an object is synchronously moved in a predetermined direction and a pattern formed on the mask is transferred onto the object, the method comprising: obtaining a positional information of a slider when the slider which holds the mask and moves in predetermined strokes in a direction parallel to a first axis corresponding to the predetermined direction on a surface plate is within a predetermined range including an irradiation area of an illumination light irradiated on the mask in a direction parallel to the first axis; and removing static electricity with which the mask mounted on the slider is charged, using a destaticizing apparatus which is provided on the surface plate on a carrier path of the mask positioned on one side of a direction parallel to the first axis in the irradiation area of the illumination light.

According to this method, static electricity with which the mask mounted on the slider is charged is removed, using a destaticizing apparatus which is provided on the surface plate on a carrier path of the mask positioned on one side of a direction parallel to the first axis in the irradiation area of the illumination light. Therefore, by the destaticizing apparatus, static electricity with which the mask mounted on the slider is charged is removed on the carrier path of the mask, or in other words, removed before the slider holding the mask moves to the irradiation area of the illumination light. Further, in this case, the destaticizing apparatus removes the static electricity with which the mask is charged from the surface plate side. Accordingly, the mask can be de-electrified effectively, without decreasing the throughput.

According to a ninth aspect of the present invention, there is provided a device manufacturing method, including forming a pattern on an object using one of the first and second exposure methods of the present invention; and processing the object on which the pattern is formed.

BRIEF DESCRIPTION OF THE DRAWINGS

In the accompanying drawings.

DESCRIPTION OF THE EMBODIMENTS

A First Embodiment

A first embodiment will be described below, with reference to FIGS. 1 to 6.

Figure 1:
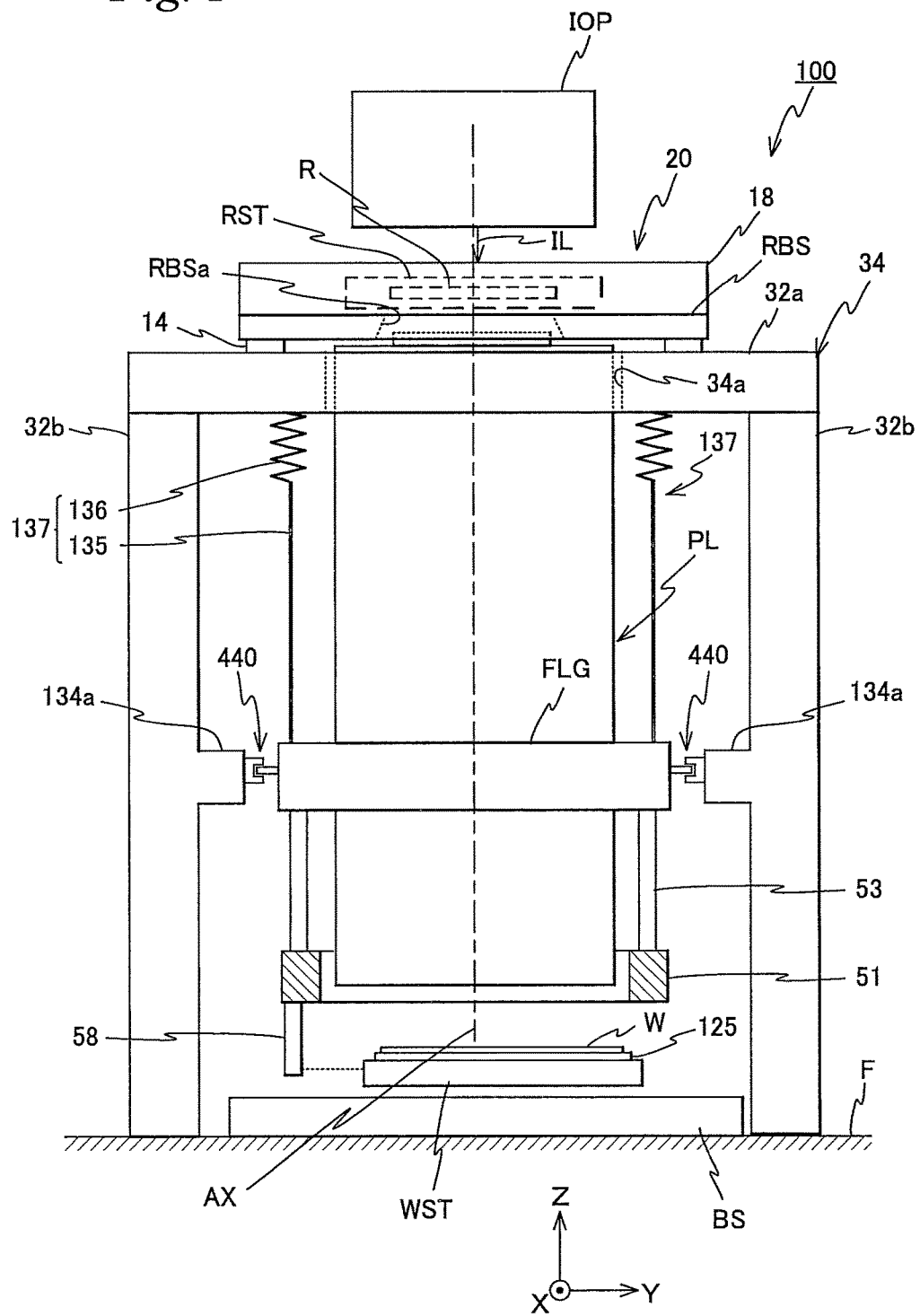
FIG. 1 is a schematic view that shows an exposure apparatus of a first embodiment.

FIG. 1 schematically shows a configuration of an exposure apparatus 100 in the first embodiment. Exposure apparatus 100 is a projection exposure apparatus by the step-and-scan method, or a so-called scanning stepper (also called a scanner) As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θx, θy, and θz directions, respectively.

Exposure apparatus 100 is equipped with an illumination unit IOP, a reticle stage device 20 including a reticle stage RST which moves within a plane parallel to an XY plane holding a reticle R, projection optical system PL, a wafer stage WST which drives a wafer W in an XY two-dimensional direction, a control systems of these sections, and a column 34 which holds reticle stage device 20 and projection optical system PL.

Illumination unit IOP includes a light source and an illumination optical system, irradiates an illumination light (exposure light) IL to an illumination area having a rectangular shape or a circular arc shape that is defined by a field stop (which is also called a masking blade or a reticle blind) placed inside illumination unit IOP, and illuminates reticle R on which a circuit pattern is formed with uniform illuminance. An illumination system similar to illumination unit IOP is disclosed in, for example, U.S. Pat. No. 5,534,970 and the like. In this case, as illumination light IL, for example, an ArF excimer laser light (wavelength: 193 nm) is to be used. Further, a part of illumination light IL is taken out by a beam splitter placed inside the illumination optical system, and illuminance signals from a power monitor which is also called an integrator sensor is provided to a main controller 50 (refer to FIG. 6).

Reticle stage device 20 is equipped with a reticle stage surface plate RBS placed substantially parallel below illumination unit IOP by a predetermined distance, a reticle stage RST placed on reticle stage surface plate RBS, a counter mass 18 made up of frame shaped member placed on reticle stage surface plate RBS in a state surrounding reticle stage RST, and a reticle stage drive system 340 (refer to FIG. 6) that drives reticle stage RST and the like.

Reticle stage surface plate RBS is supported almost horizontally on a top board section 32*a* of column 34 via a plurality of (e.g. three) vibration isolation units 14 (the vibration isolation units in the depth of the page surface of FIG. 1 is not shown), as shown in FIG. 1. Reticle stage RST is placed on reticle stage surface plate RBS, and reticle R is held on reticle stage RST. Incidentally, details on a concrete configuration of reticle stage device 20 will be described further later in the description.

As projection optical system PL, for example, a dioptric system is used, consisting of a plurality of lenses (lens elements) that has been disposed along optical axis AX, which is parallel to the Z-axis direction. Projection optical system PL is, for example, both-side telecentric and has a predetermined projection magnification (for example, ¼, or ⅕). Therefore, when the illumination area is illuminated by illumination light IL from illumination unit IOP, illumination light IL having passed through reticle R whose patterned surface is placed so as to conform to a first plane (an object plane) of projection optical system PL forms a reduced image of a circuit pattern (a projected image of part of the circuit pattern) of reticle R within the illumination area, on an area (an exposure area) that is conjugate with the illumination area on wafer W which is placed on the second plane (image plane) side of projection optical system PL and whose surface is coated with a resist (a sensitive agent), via projection optical system PL.

Then, by synchronously driving reticle stage RST and wafer stage WTS, reticle R is relatively driven in the scanning direction (the Y-axis direction) with respect to the illumination area (illumination light IL), and by also relatively moving wafer W in the scanning direction (the Y-axis direction) with respect to the exposure area (illumination light IL), scanning exposure of a shot area (divided area) on wafer W is performed, and a pattern of reticle R is transferred to the shot area. That is, in the embodiment, the pattern of reticle R is generated on wafer W according to illumination unit IOP and projection optical system PL, and then by the exposure of the sensitive layer (resist layer) on wafer W with illumination light IL, the pattern is formed on wafer W.

Around the center in a height direction of a barrel of projection optical system PL, a flange FLG is arranged.

Column 34 is equipped with a plurality of (e.g. three) leg sections 32*b* (the leg section in the depth of the page surface of FIG. 1 is not shown) whose lower end portions are fixed to a floor surface F and top board section 32*a* that is supported almost horizontally by the three leg sections 32*b*. An opening 34 is formed, penetrating the center portion of top board section 32*a* in a vertical direction (the Z-axis direction). An upper end of projection optical system PL is inserted in opening 34*a*.

The other end of three suspension support mechanisms 137 (however, the suspension support mechanism in the depth of the page surface of FIG. 1 is not shown) whose one end is fixed to the lower surface side of top board section 32*a*, is connected to flange FLG, and this allows projection optical system PL to be supported by suspension by top board section 32*a*. Each of the three suspension support mechanisms 137 includes, for example, a coil spring 136 that is a connecting member having a flexible structure and a wire 135. Since coil spring 136 vibrates like a pendulum in a direction perpendicular to optical axis (the Z-axis) of projection optical system PL, coil spring 136 has a vibration-free function (a function of preventing vibration of the floor from traveling to projection optical system PL) in the direction perpendicular to the optical axis. Further, coil spring 136 has a high vibration-free function also in a direction parallel to the optical axis. Incidentally, projection optical system PL can be supported, for example, by leg sections 32*b* of column 34 via flange FLG, without being supported by suspension. Further, projection optical system PL can be mounted, for example, on a support member (a frame member) referred to as a barrel platform or a metrology frame via flange FLG, and the support member can be supported by suspension by top board section 32*a*, or supported by leg sections 32*b* of column 34.

Further, in the vicinity of a center portion in the Z-axis direction of each leg section 32*b* of column 34, a protruding section 134*a* is provided projecting toward the inside, and between each protruding section 134*a* and the outer periphery section of flange FLG of projection optical system PL, a drive system 440 is arranged. Drive system 40, for example, includes a voice coil motor that drives projection optical system PL in a radius direction of the barrel, and a voice coil motor that drives projection optical system PL in the optical axis direction (the Z-axis direction). By the three drive systems 440 provided in the three leg sections 32*b*, projection optical system PL can be displaced in directions of six degrees of freedom.

On flange FLG of projection optical system PL, an acceleration sensor 234 (not shown in FIG. 1, refer to FIG. 6) used to detect the acceleration of projection optical system PL in directions of six degrees of freedom is arranged, and based on acceleration information detected by acceleration sensor 234, a controller 50 (not shown in FIG. 1, refer to FIG. 6) controls the voice coil motors of drive system 440 so that projection optical system PL is in a static state with respect to column 34 and floor surface F. Incidentally, instead of the acceleration sensor, other sensors such as a vibration sensor, a displacement sensor or the like can be used.

From a lower surface of flange FLG of projection optical system PL, a measurement mount 51 having a ring shape is supported by suspension via a plurality of (in this case, for example, three) support members 53 (however, the support member in the depth of the page surface is not shown). In actuality, the three support members 53 are each configured including a link member, which has a flexure section at its both end portions that can be displaced in directions of five degrees of freedom besides a longitudinal direction of support member 53, and can support measurement mount 51 with little reaction force generated between measurement mount 51 and flange FLG.

On measurement mount 51, a wafer interferometer 58, a wafer alignment system (hereinafter referred to as an alignment system) ALG (not shown in FIG. 1, refer to FIG. 6) serving as a mark detection system, a multipoint focal position detecting system (not shown), and the like are held. As alignment system ALG, an FIA system by an image processing method that is disclosed in, for example, U.S. Pat. No. 5,721,605 and the like can be used. Further, as the multipoint focal position detection system, a multipoint focal position detection system that is disclosed in, for example, U.S. Pat. No. 5,448,332 and the like can be used. Incidentally, when projection optical system PL is mounted on the support member (referred to as a metrology frame and the like) previously described, interferometer 58 or wafer alignment system ALG and the like can be held by the support member, without measurement mount 51 being provided.

Wafer stage WST is supported by levitation above the upper surface of stage surface plate BS that is horizontally placed below projection optical system PL, via an air bearing arranged on the bottom surface of wafer stage WST.

In this case, stage surface plate BS is directly installed on floor surface F, and the surface on the +Z side (the upper surface) is processed so that its flatness is extremely high so as to serve as a movement reference surface (a guide surface) of water stage WST. Incidentally, stage surface plate BS can be installed on floor F via a plurality of vibration isolation mechanisms.

Figure 6:
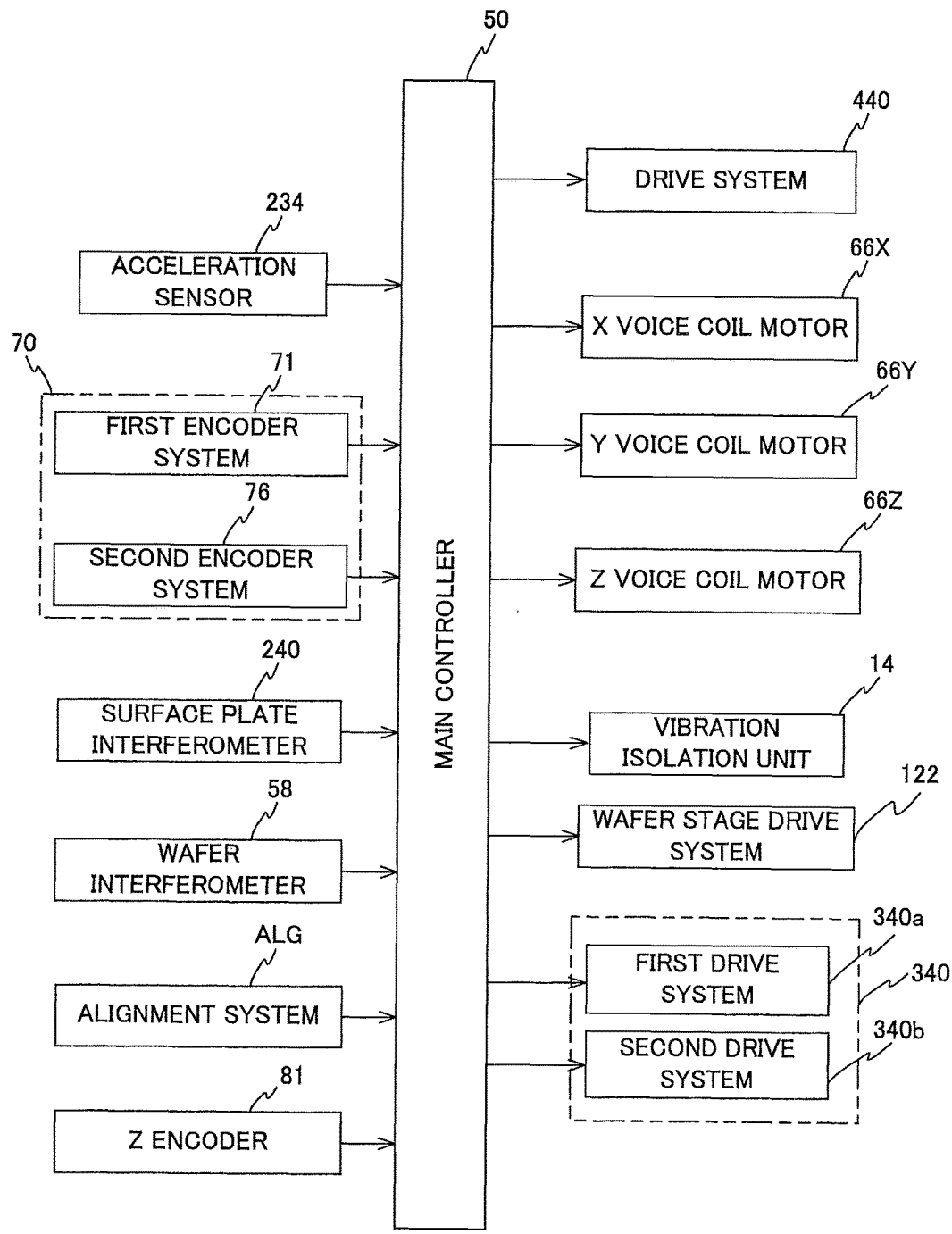
FIG. 6 is a block diagram that shows an input/output relation of a main controller, which centrally configures a control system of the exposure apparatus in FIG. 1.

Wafer stage WST holds wafer W by vacuum suction and the like via wafer holder 125, and can be freely driven within the XY plane along the upper surface of stage surface plate BS by main controller 50 via a wafer stage drive system 122 (not shown in FIG. 1, refer to FIG. 6). Incidentally, for example, a plane motor can be used as wafer stage drive system 122, and in this case, wafer stage WST can be supported by levitation on stage surface plate BS by a magnetic force.

Next, details of reticle stage device 20 and components in the vicinity of the device will be further described.

Figure 2:
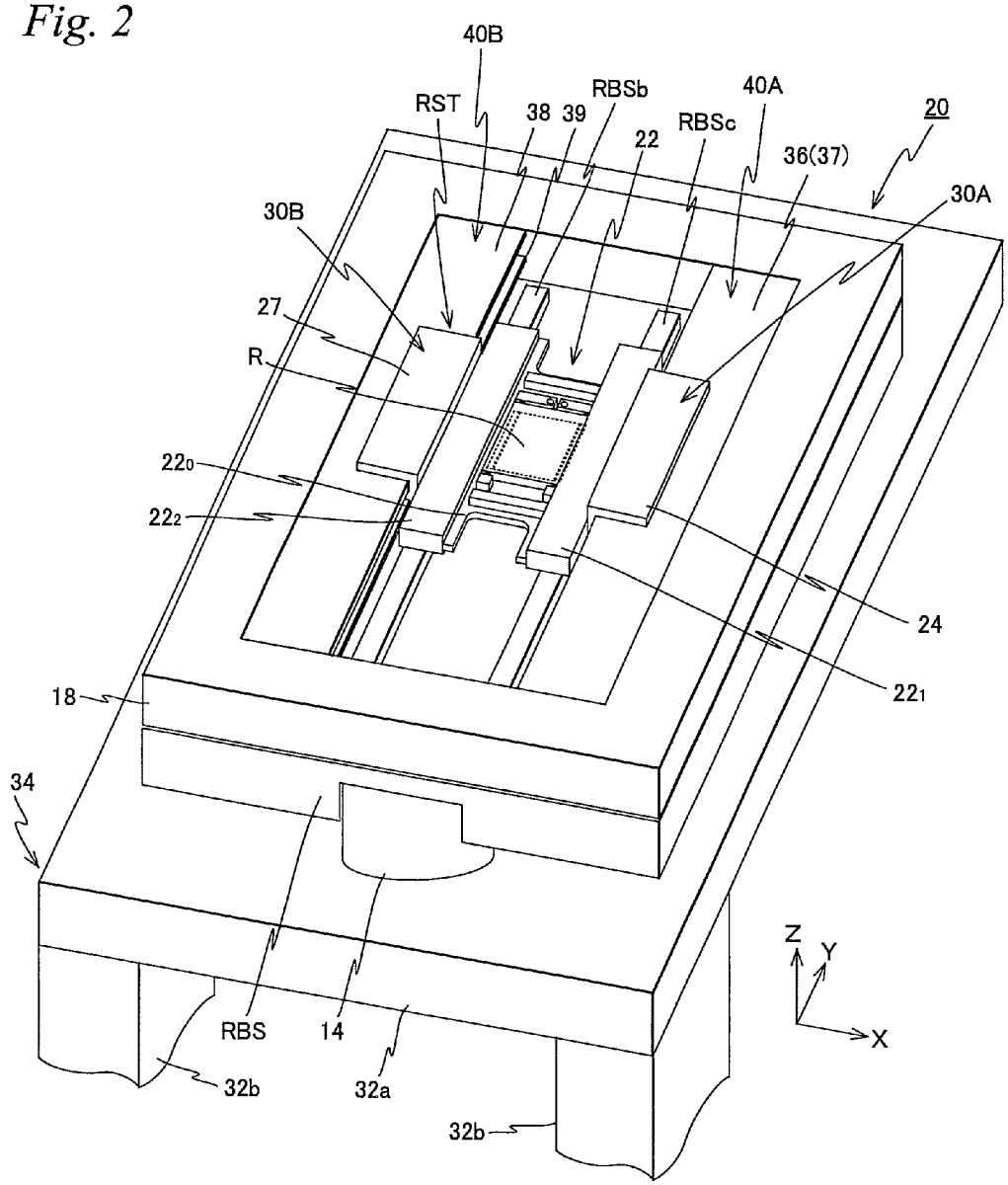
FIG. 2 is a perspective view that shows a reticle stage device.

FIG. 2 shows a perspective view of an outward appearance of reticle stage device 20. Reticle stage surface plate RBS consists of a plate shaped member which is roughly in the shape of a rectangle (in a planar view), and in the center section, an opening RBSa (refer to FIGS. 1 and 4B) which serves as a path of illumination light IL is formed. Opening RBSa is in a state where it communicates with opening 34a of top board section 32a previously described in Z-axis direction. Further, at positions on the upper surface of reticle stage surface plate RBS distanced equally from the center in the −X direction and in the +X direction, protruding shaped sections RBSb and RBSc (refer to FIG. 4B) are provided extending in the Y-axis direction. The upper surface (the surface on the +Z side) of protruding shaped sections RBSb and RBSc is processed so that its flatness is extremely high, and a guide surface which is used when reticle stage RST moves is formed.

Further, in the vicinity of the outer periphery of the upper surface of reticle stage surface plate RBS, although it is not shown, a plurality of air pads is fixed at a predetermined distance. Counter mass 18 is placed on the plurality of air pads. A part of these plurality of air pads, such as for example, the air pad in the four corners of reticle stage surface plate RBS, support counter mass 18 on the upper surface (the surface on the +Z side) of reticle stage surface plate RBS in a non-contact manner. In the remaining air pads, the balance between the vacuum suction force and the blow-out pressure can be adjusted, and the distance between the lower surface of counter mass 18 and the upper surface of reticle stage surface plate RBS is maintained at a predetermined distance.

The plurality of (for example, three) vibration isolation units shown in FIG. 1 provided between reticle stage surface plate RBS and top board section 32a, each includes a mechanical damper such as an air damper or a hydraulic damper and the like. According to such vibration isolation unit 14, propagation of relatively high frequency vibration to reticle stage RST can be avoided, for example, by the air damper or the hydraulic damper. Further, between reticle stage surface plate RBS and top board section 32a, an X voice coil motor 66X which applies a drive force in the X-axis direction, a Y voice coil motor 66Y which applies a drive force in the Y-axis direction, and a Z voice coil motor 66Z which applies a drive force in the Z-axis direction (none of which are shown in FIG. 2, refer to FIG. 6) are arranged.

As these voice coil motors, for example, at least one of two X voice coil motors 66X and two Y voice coil motors 66Y, and three Z voice coil motors 66Z can be provided. In other words, by providing at least one of two X voice coil motors 66X and two Y voice coil motors 66Y, reticle stage surface plate RBS can be finely driven not only in the X-axis direction and Y-axis direction, but also in the θz direction, and also by providing three Z voice coil motors 66Z, reticle stage surface plate RBS can be finely driven not only in the Z-axis direction, but also in the θx direction and the θy direction. Accordingly, by voice coil motors 66X, 66Y, and 66Z, reticle stage surface plate RBS can be finely driven in directions of six degrees of freedom. Incidentally, the position of reticle stage surface plate is measured by a surface plate interferometer 240 and a Z encoder 81 (both refer to FIG. 6), with projection optical system PL serving as a reference.

In this case, for example, the three Z voice coil motors 66Z are provided at three places that are not collinear between reticle stage surface plate RBS and top board section 32a. As well as these three Z voice coil motor 66Z, a plurality of deformation suppression members (e.g. voice coil motors and the like) may be placed between reticle stage surface plate RBS and top board section 32a. In such an arrangement, when reticle stage surface plate RBS is driven (displaced) only by voice coil motors 66Z in the Z-axis direction, the θx direction, and the θy direction, even in the case when a flexure or a torsion occurs because the point of action of the thrust of Z voice coil motors 66Z is spaced apart, main controller 50 controls the thrust generated in the plurality of deformation variation members (thrust distribution) in response to the thrust generated in the three Z voice coil motors 66Z, which makes it possible to drive (displace) reticle stage surface plate RBS in the Z, the θx, and the θy directions in the state where deformation is suppressed as much as possible.

Figure 4A:
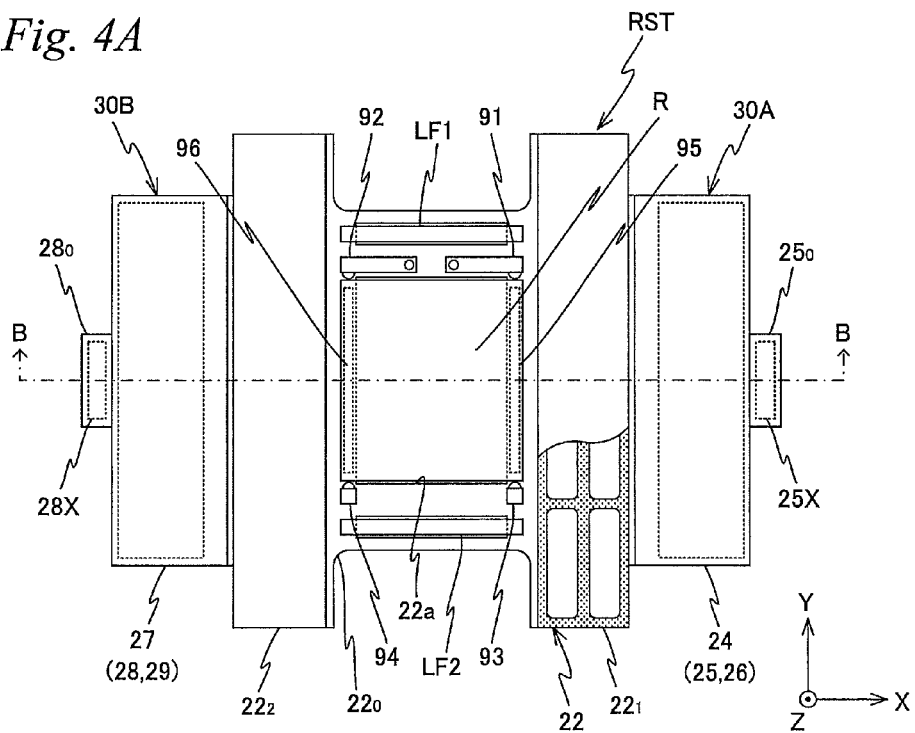
FIG. 4A is a planar view that shows a configuration of a reticle stage.

As shown in FIGS. 2 and 4A, reticle stage RST is equipped with reticle stage main body 22, and a pair of movers 30A and 30B fixed to both ends in the X-axis direction of reticle stage main body 22.

Reticle stage main body 22 has a rectangular plate shaped section 22$_0$, and air slider sections 22$_1$ and 22$_2$ having a rectangular-parallelepiped shape whose longitudinal direction is in the Y-axis direction and are fixed to the ±X ends of plate shaped section 22$_0$, respectively. In this case, in substantially the center of plate shaped section 22$_0$, an opening 22a (refer to FIG. 4B) which serves as a path of illumination light IL is formed.

On both sides in the X-axis direction of opening 22a on the upper surface of plate shape section 22$_0$, a pair of vacuum chucks 95 and 96 is placed which suctions and holds the rear surface of reticle R.

Further, on the −Y side of opening 22a on the upper surface of plate shaped section 22$_0$, a pair of stoppers (position setting members) 93 and 94 are fixed, placed apart by a predetermined distance (a distance slightly shorter than the width of reticle R in the X-axis direction) in the X-axis direction. These stoppers 93 and 94 push against the edge surface (side surface) on the −Y side of reticle R, and set the position of reticle R.

Further, on the +Y side of opening 22a on the upper surface of plate shaped section 22$_0$, clampers (pressing members) 91 and 92 made up of a pair of rotating arms are attached. Clampers 91 and 92 make a set with stoppers 93 and 94, respectively, and each configure a clamping device which clamps reticle R from one side and the other side of the Y-axis direction.

One clamper 91 whose longitudinal direction is in the X-axis direction, is attached pivotably to the plate shaped section $22_0$, with the −X end serving as a supporting point (rotation center). Further, on the +X end of the surface on the −Y side of clamper 91, a protruding section of a substantially hemispherical shape is provided facing stopper 93. And a force is constantly applied to this clamper 91 clockwise by an energizing member made up of a flat spiral spring and the like so that the protruding section presses against the edge surface on the +Y side of reticle R. While the other clamper 92 is symmetric, it is configured similar to clamper 91.

Reticle R is mounted on plate shaped section $22_0$ (reticle stage RST) in a state covering opening 22*a* from above. Then, reticle R is positioned with the surface on the −Y side of in contact with stoppers 93 and 94, and is fixed by clampers 91 and 92 which apply a predetermined pressing force to the surface on the +Y side. After reticle R is fixed by clampers 91 and 92 and stoppers 93 and 94 in the manner described above, vacuum chucks 95 and 96 suction both ends in the X-axis direction of the lower surface. In the case of unloading reticle R from reticle stage RST, after the suction has been released, clampers 91 and 92 are to be moved away from reticle R against the force which has been applied, and for example, the upper surface (a surface on the opposite side of the patterned surface) of reticle R is to be suctioned from above and lifted, using suction pads and the like. Or, the outside of the pattern area of reticle R is hooked and lifted with hooks and the like. Or reticle R can be lifted once from above with a vertical movement member as is described in a second embodiment to be described later on, and can be handed to a carrier arm from the vertical movement member. Incidentally, instead of the structure where a force is constantly applied to clampers 91 and 92, a structure where the hemispheric protruding section of clampers 91 and 92 can be switched between a first position in contact with reticle R and a second position where reticle R is moved away from reticle R can be employed. Further, as well as a rotating type clamper, a sliding type clamper can also be used.

In addition, on plate shaped section $22_0$, various measurement members are provided. For example, on the ±Y side of opening 22*a* of plate shaped section $22_0$, rectangular apertures whose longitudinal direction is in the X-axis direction is formed, respectively. In a state where these openings are covered, reticle fiducial mark plates (hereinafter shortly referred to as "reticle mark plates") LF1 and LF2 on which aerial image measurement marks are formed are placed in line with reticle R, and are fixed to plate shaped section $22_0$. Reticle mark plates LF1 and LF2 are made of the same material as reticle R, such as synthetic quarts, fluorite, lithium fluoride or other fluoride crystals. Details on the reticle mark plate are disclosed in, for example, U.S. Patent Application Publication No. 2002/0041377 and the like.

Figure 4B:
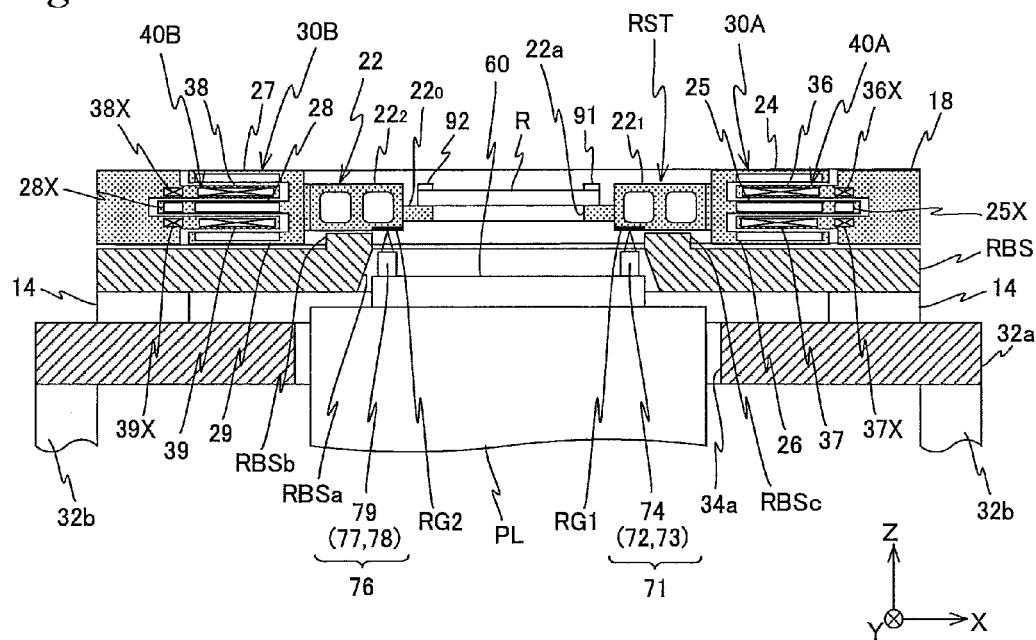
FIG. 4B is a longitudinal sectional view of a reticle stage device sectioned along a line B-B in FIG. 4A.

In the embodiment, as it can be seen from FIG. 4B, reticle R is supported in a state where the patterned surface (lower surface) roughly coincides with a neutral plane (a plane parallel to the XY plane which passes through the center of gravity of reticle stage main body 22) of reticle stage main body 22 (reticle stage RST).

Air slider sections $22_1$ and $22_2$, as a partially broken view of the upper surface of air slider section $22_1$ is shown in FIG. 4A, air slider section $22_1$ is made of a hollow member having a grid shaped rib provided inside to maintain its intensity, and to divide its internal space. In other words, air slider sections $22_1$ and $22_2$ are made of rectangular-parallelepiped shape members, which are lightened so that only the rib sections remain so as to attain lighter sections.

On the outer halves in the X-axis direction of the bottom surface of air slider sections $22_1$ and $22_2$, or in other words, on the sections facing protruding shaped sections RBSc and RBSb previously described of reticle stage surface plate RBS as shown in FIG. 4B, a gas supply groove and a pair of exhaust grooves (none of which are shown) on both sides in the X-axis direction of the gas supply groove are formed covering the entire length in the Y-axis direction. The gas supply groove has a main groove extending in the Y-axis direction, and a plurality of T-shaped surface drawing grooves that are in communication with the main groove on both sides in the X-axis direction and are also formed at a predetermined distance in the Y-axis direction. Facing at least a part of each of the gas supply groove and the pair of exhaust grooves, on reticle stage surface plate RBS, a gas supply opening and a pair of exhaust openings are formed on the upper surface of protruding sections RBSc and RBSb, respectively. As described, in the embodiment, a so called differential exhaust type static gas bearing of a surface plate gas supply type is used. Details on the differential exhaust type static gas bearing of the surface plate gas supply type, are disclosed in, for example, U.S. Pat. No. 7,489,389 and the like.

In this embodiment, reticle stage RST is supported by levitation in a non-contact manner via a clearance (distance/gap) of around several micron above protruding sections RBSc and RBSb, by a balance between a static pressure of pressurized gas supplied from the surface drawing grooves and blows out against the upper surface of protruding sections RBSc and RBSb via the gas supply opening and the self weight of the entire reticle stage RST. In this case, as the pressurized gas, rare gas such as clean dry air (CDA), nitrogen, or helium and the like is used.

Figure 3:
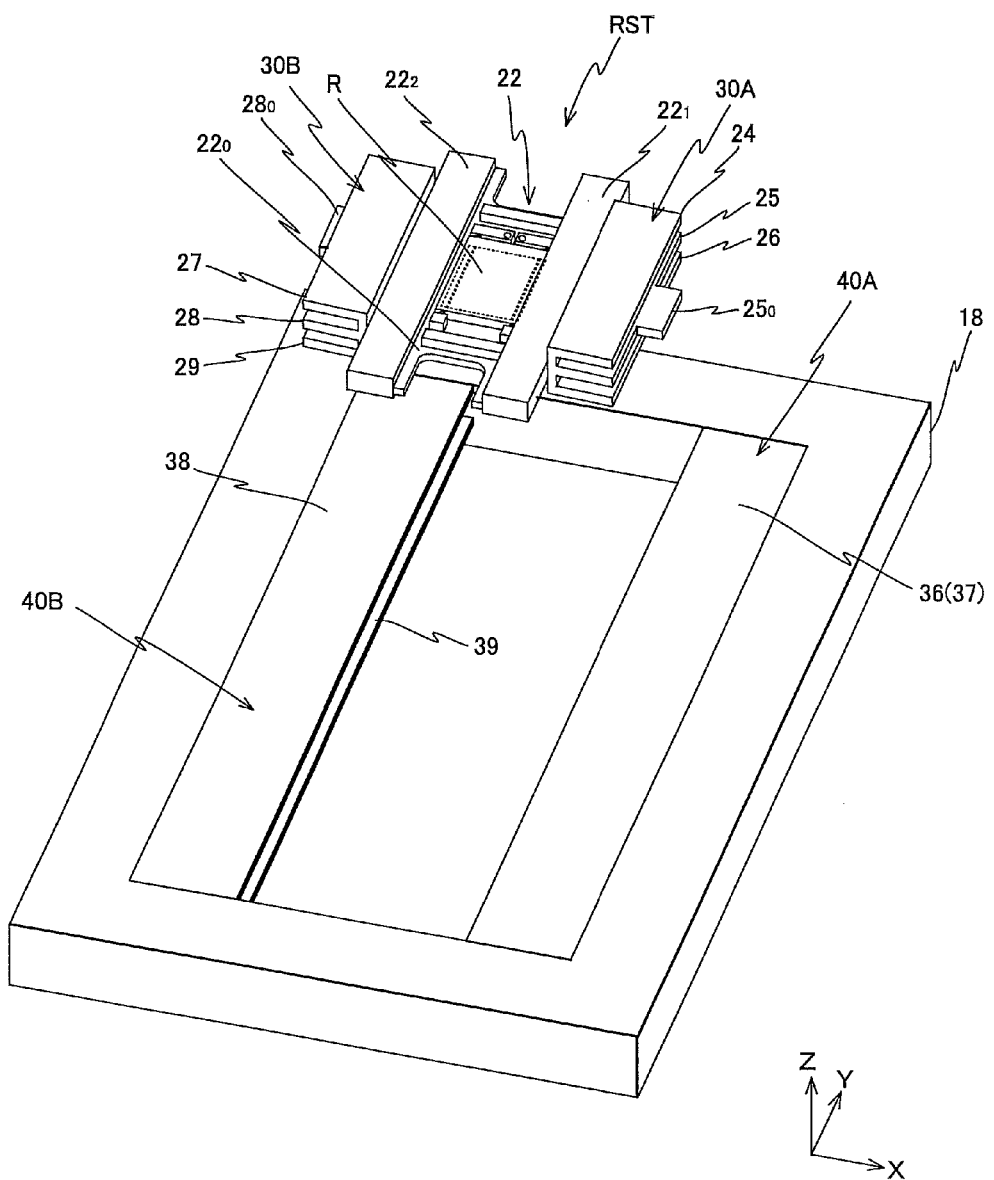
FIG. 3 is an exploded perspective view that shows a reticle stage and a counter mass in FIG. 2.

A pair of movers 30A and 30B are fixed to a surface on the +X side of air slider section $22_1$ and a surface on the −X side of air slider section $22_2$, respectively, as shown in FIGS. 3, 4A, and 4B.

One of the movers 30A include three mover sections 24, 25, and 26 which are placed parallel to one another at a predetermined distance in the Z-axis direction and whose longitudinal direction is in the Y-axis direction. In this case, the three mover sections 24, 25, and 26 are placed vertically symmetrical with a neutral plane (a plane which passes through the center of gravity, and is parallel to the XY plane) of reticle stage main body 22 serving as a reference, and a neutral plane located in the center of the mover section coincides with the neutral plane of reticle stage main body 22.

In each of mover sections 24, 25, and 26, as shown in FIG. 4B, a magnet unit is incorporated which has a plurality of permanent magnets arranged at a predetermined distance along the Y-axis direction. In the following description, these magnet units will also be described as magnet units 24, 25, and 26, using the same reference numerals as the corresponding mover sections. In each of the magnet units 24, 25, and 26, the plurality of permanent magnets are placed so that the polarity between the permanent magnets which are adjacent in the Y-axis direction alternately becomes a reverse polarity. Further, permanent magnets which are placed inside of magnet units 24, 25, and 26 and are adjacent in the vertical direction (the Z-axis direction) are to have the same polarity to one another.

Of magnet units 24, 25, and 26, in magnet unit 25, as shown in FIGS. 4A and 4B, protruding section 25$_O$ is provided in the center in the Y-axis direction. One permanent magnet 25X whose longitudinal direction is in the Y-axis direction is housed in protruding section 25$_O$.

The other mover 30B includes three mover sections 27, 28, and 29, and is configured in a similar manner as mover 30A, although being symmetrical. Accordingly, in each of mover sections 27, 28, and 29 as shown in FIG. 4B, a magnet unit is incorporated which has a plurality of permanent magnets arranged along the Y-axis direction. Of mover sections 27, 28, and 29, or more specifically, of magnet units 27, 28, and 29, in magnet unit 28, protruding section 28$_O$ is provided in the center in the Y-axis direction, and one permanent magnet 28X whose longitudinal direction is in the Y-axis direction is housed (as shown in FIGS. 4A and 4B) in protruding section 28$_O$.

Movers 30A and 30B each engage with stators 40A and 40B, respectively, as shown in FIG. 2.

One of the stators 40A includes a pair of stator sections 36 and 37, which are placed parallel at a predetermined distance in the Z-axis direction, as shown in FIG. 4B. As shown in FIG. 2, both ends in the longitudinal direction (the Y-axis direction) of stator sections 36 and 37 are fixed to an inner surface on the +Y side and an inner surface on the −Y side of counter mass 18, and one end (the +X end) in a direction (the X-axis direction) orthogonal to the longitudinal direction is fixed to an inner surface on one side (inner surface on the −X side) of counter mass 18 in the X-axis direction.

Inside stator sections 36 and 37, as shown in FIG. 4B, respectively, an armature unit is installed including a plurality of armature coils which are arranged along the Y-axis direction. In the following description, these armature units will also be described as armature units 36 and 37, using the same reference numerals as the corresponding stator sections.

In this case, when both ends (coil section) in the Y-axis direction of one armature coil (referred to as a first coil) faces two adjacent permanent magnets (referred to as a first and second magnet for the sake of convenience) in the Y-axis direction inside each of the magnet units 24, 25, and 26 at the same time, the distance of the armature coils in the Y-axis direction inside stator sections 36 and 37 is decided so that a space in the center (or the core) of a pair of armature coils (referred to as a second and third coil for the sake of convenience) adjacent to the first coil on one side and the other side in the Y-axis direction faces permanent magnets (referred to as a third and fourth magnet) which are adjacent to the first and second magnets on one side and the other side in the Y-axis direction.

Further, inside stator sections 36 and 37, as shown in FIG. 4B, individual coils 36X and 37X of a rectangular shape elongated in the Y-axis direction are house at the end on the +X side.

The other stator 40B includes a pair of stator sections 38 and 39 (also described as armature units 38 and 39), and is configured in a similar manner as stator 40A, although being symmetrical, as shown in FIG. 4B. Inside stator sections 38 and 39, as shown in FIG. 4B, individual coils 38X and 39X of a rectangular shape elongated in the Y-axis direction are housed at the end on the −X side.

In the embodiment, the four armature units 36 to 39 and the six magnet units 24 to 29 make up four sets of Y linear motors. More particularly, magnet units 24 and 25 and armature unit 36 whose upper surface and lower surface face the magnet units configure a moving magnet type Y linear motor (hereinafter described as Y linear motor 36, using the same reference numeral as the armature unit which configures the stator section). Similarly, magnet units 25 and 26 and armature unit 37 whose upper surface and lower surface face the magnet units configure a moving magnet type Y linear motor (hereinafter described as Y linear motor 37, using the same reference numeral as the armature unit which configures the stator section). In other words, magnet unit (mover section) 25 is used in common by an upper and lower pair of Y linear motors 36 and 37.

Similarly, magnet units 27 and 28 and armature unit 38 whose upper surface and lower surface face the magnet units configure a moving magnet type Y linear motor (hereinafter described as Y linear motor 38, using the same reference numeral as the armature unit which configures the stator section). Similarly, magnet units 28 and 29 and armature unit 39 whose upper surface and lower surface face the magnet units configure a moving magnet type Y linear motor (hereinafter described as Y linear motor 39, using the same reference numeral as the armature unit which configures the stator section). In other words, magnet unit (mover section) 28 is used in common by an upper and lower pair of Y linear motors 38 and 39.

And by each of these two pairs, or a total of the four Y linear motors 36, 37, 38, and 39, a first drive system 340$a$ (refer to FIG. 6) which drives reticle stage RST in the Y-axis direction and the θz direction is configured.

In the first drive system 340$a$, of the plurality of armature coils belonging to armature units 36 to 39 of stators 40A and 40B, by supplying equal (the same magnitude and direction) current to the armature coil (every other armature coil) facing the permanent magnet of the corresponding magnet unit (mover section), an equal drive force in the Y-axis direction acts on each of the mover sections 24 to 29. This allows reticle stage RST to be translationally driven in the Y-axis direction. In this case, because mover sections 24 to 29 are placed symmetrically with the neutral plane of reticle stage RST serving as a reference, the pitching moment hardly acts on reticle stage RST. Further, in this case, by varying the magnitude of the current supplied to the armature coils belonging to armature units 36 and 37 and the armature coils belonging to armature units 38 and 39 from each other, reticle stage RST can also be finely driven in a rotational direction (the θz direction) around the Z-axis.

Furthermore, of a plurality of armature coils belonging to armature units 36 and 37, by supplying current in opposite directions on the armature unit 36 side and the armature unit 37 side to the armature coils serving as subjects that face the permanent magnets of the magnet unit (mover section) to which the space in the center (or the core section) corresponds, mover 30A can also be finely driven in the +Z direction or the −Z direction with respect to stator 40A. The +Z direction and the −Z direction are determined, according to the direction of the current which is supplied. Similarly, of a plurality of armature coils belonging to armature units 38 and 39, by supplying current in opposite directions on the armature unit 38 side and the armature unit 39 side to the armature coils serving as subjects that face the permanent magnets of the magnet unit (mover section) to which the space in the center (or the core section) corresponds, mover 30B can also be finely driven in the +Z direction or the −Z direction with respect to stator 40B. Accordingly, the first drive system 340$a$ can also finely drive reticle stage RST in the Z-axis direction and the θy direction (the rotational direction around the Y-axis). Further, for example, when finely driving mover 30A with respect to stator 40A in the +Z direction or the −Z direction, by varying the magnitude (or the direction) of the current supplied to the armature coil belonging to the same armature unit according to the position of the armature coil in the Y-axis direction, mover 30A can also be finely driven in the θx direction (the rotational direction around the X-axis). Similarly, mover 30B can also be finely driven in the θx direction.

Further, an X voice coil motor (hereinafter, expressed as voice coil motor 25X, using the same reference numerals as the permanent magnet that configures the mover section) is configured including coils 36X and 37X, and permanent magnet 25X whose upper and lower magnetic pole faces oppose the coils. Similarly, an X voice coil motor (hereinafter, expressed as voice coil motor 28X, using the same reference numerals as the permanent magnet that configures the mover section) is configured including coils 38X and 39X, and permanent magnet 28X whose upper and lower magnetic pole faces oppose the coils.

And by these X voice coil motors 25X and 28, a second drive system 340b (refer to FIG. 6) which drives reticle stage RST in the X-axis direction is configured.

In the second drive system 340b configured in the manner described above, because mover sections (permanent magnets) 25X and 28X are placed on the neutral plane of reticle stage RST, the rolling moment hardly acts on reticle stage RST.

In the embodiment, reticle stage drive system 340 is configured including the first drive system 340a and the second drive system 340b.

Figure 5:
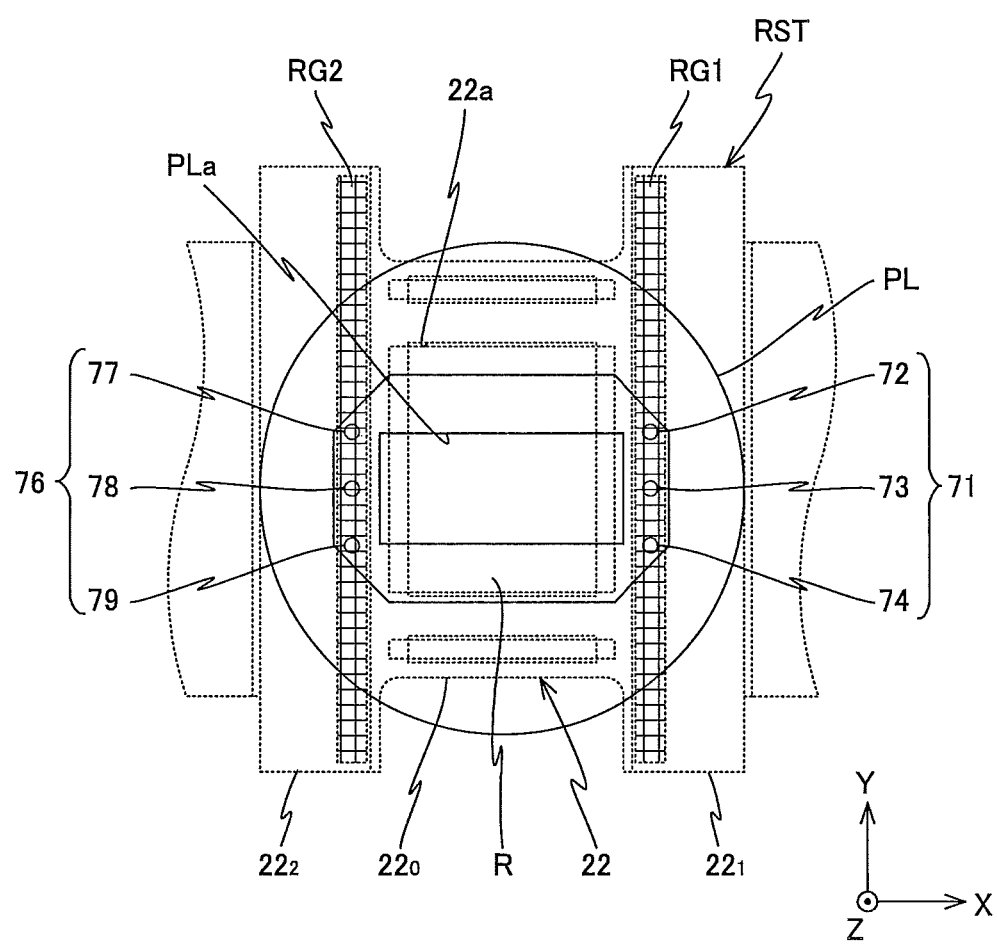
FIG. 5 is a view used to explain a configuration of a reticle encoder system.

On the bottom surface of air slider sections $22_1$ and $22_2$, as shown in FIG. 4B, gratings RG1 and RG2 are arranged, respectively, covering almost the entire length extending in the Y-axis direction (refer to FIG. 5). On each of the surfaces of gratings RG1 and RG2, a two-dimensional diffraction grating is formed whose periodic direction is in the X-axis direction and the Y-axis direction.

Incidentally, in the present embodiment, the reticle stage is not limited to the configuration described above, and for example, the reticle stage can be configured by fixing reticle stage surface plate RBS on top board section 32a (via the vibration isolation unit), and a coarse/fine movement stage moving on reticle stage surface plate RBS. As the coarse/fine movement stage in this case, the stage can be configured by a coarse movement stage which moves in each of the X-axis, the Y-axis, and the θz directions, and a fine movement stage which is placed on the coarse movement stage and can finely move holding reticle R in directions of six degrees of freedom. In this case, position measurement of reticle stage surface plate RBS is no longer required.

To the top surface of projection optical system PL, an upper surface member 60 of a hexagonal shape in a planar view as shown in FIG. 5 in which a rectangular opening PLa is formed in the center is fixed (refer to FIG. 4B). Opening PLa is an optical path (passage) of illumination light IL which transmits the patterned surface of reticle R, and has transmit opening RBSa of reticle stage surface plate RBS. On both ends (both sides of opening PLa) in the X-axis direction on the upper surface of upper surface member 60, three each of the encoder heads 72, 73, and 74, and 77, 78, and 79 are fixed. Encoder heads 72 and 77 are placed in the vicinity of the corner on the +Y side of opening PLa, encoder heads 74 and 79 are placed in the vicinity of the corner on the −Y side, and encoder heads 73 and 78 are placed at the same Y position as the center (in other words, the optical axis of projection optical system PL) of opening PLa.

Three each of the encoder heads 72, 73, and 74, and 77, 78, and 79 face gratings RG1 and RG2 previously described, respectively.

In the embodiment, as encoder heads 72 to 74 and 77 to 79, a two-dimensional encoder head is employed whose measurement direction is in two directions which are one direction (one period direction of the grating) parallel to the grating (measurement plane) and a direction perpendicular to the measurement plane. An example of such a head is disclosed in, for example, U.S. Pat. No. 7,561,280 and the like.

Here, the Y-axis direction and the Z-axis direction serve as the measurement directions of the four encoder heads 72, 74, 77, and 79, and the X-axis direction and Z-axis direction serve as the measurement directions of the two encoder heads 73 and 78.

As shown in FIG. 4B, encoder heads 72, 73, and 74 irradiate measurement beams on grating RG1 from below on the bottom surface of reticle stage RST (air slider section $22_1$) via opening RBSa of reticle stage surface plate RBS, receive a plurality of diffraction lights generated in grating RG1, and obtain (measure) positional information of grating RG1 (in other words, air slider section $22_1$ of reticle stage RST) in each of the measurement directions.

In this case, because both directions, which are the X-axis direction and the Y-axis direction serve as the periodic direction of gratings RG1 and RG2, by irradiating a coherent measurement beam (making the measurement beam enter), the diffraction lights are generated in both the X-axis direction and the Y-axis direction at a plurality of angles (diffraction angles). Therefore, encoder heads 72 and 74 receive the plurality of diffraction lights generated in the Y-axis direction, and with the irradiation point of each of the measurement beams serving as a measurement point, obtain (measure) the positional information of grating RG1 (in other words, air slider section $22_1$ of reticle stage RST) in the Y-axis direction and the Z-axis direction.

Encoder head 73 receives the plurality of diffraction lights generated in the X-axis direction, and with the irradiation point of the measurement beam serving as a measurement point, obtains (measures) the positional information of grating RG1 (in other words, air slider section $22_1$ of reticle stage RST) in the X-axis direction and the Z-axis direction.

Encoder heads 72, 73, and 74 configure a first encoder system 71 (refer to FIG. 6) whose measurement degree of freedom is in six degrees, which obtains (measures) the positional information of reticle stage RST in the X-axis direction, the Y-axis direction, and the Z-axis direction. Measurement information of the first encoder system 71 (encoder heads 72, 73, and 74) is sent to main controller 50 (refer to FIG. 6).

Similar to encoder heads 72, 73, and 74 described above, encoder heads 77, 78, and 79 irradiate measurement beams on grating RG2 from below on the bottom surface of reticle stage RST (air slider section $22_2$) via opening RBSa of reticle stage surface plate RBS, receive a plurality of diffraction lights generated in grating RG2, and obtain (measure) positional information of grating RG2 (air slider section $22_2$ of reticle stage RST) in each of the measurement directions.

Now, encoder heads 77 and 79 receive the plurality of diffraction lights generated in the Y-axis direction, and with the irradiation point of each of the measurement beams serving as a measurement point, obtain (measure) the positional information of grating RG2 (in other words, air slider section $22_2$ of reticle stage RST) in the Y-axis direction and the Z-axis direction. Encoder head 78 receives the plurality of diffraction lights generated in the X-axis direction, and with the irradiation point of the measurement beam serving as a measurement point, obtains (measures) the positional information of grating RG2 (in other words, air slider section $22_2$ of reticle stage RST) in the X-axis direction and the Z-axis direction.

Encoder heads 77, 78, and 79 configure a second encoder system 76 (refer to FIG. 6) whose measurement degree of freedom is in six degrees, which obtains (measures) the positional information of reticle stage RST in the X-axis direction, the Y-axis direction, and the Z-axis direction.

Measurement information of the second encoder system 76 (encoder heads 77, 78, and 79) is sent to main controller 50 (refer to FIG. 6).

Main controller 50 obtains (computes) the positional information in directions of six degrees of freedom of reticle stage RST, or in other words, the X-axis direction, the Y-axis direction, the Z-axis direction, the θx direction, the θy direction, and the θz direction, with the center (optical axis) of projection optical system PL serving as a reference, based on the measurement information of the first and second encoder systems 71 and 76 (encoder heads 72 to 74, and 77 to 79). Reticle encoder system 70 is configured (refer to FIG. 6) including the first and the second encoder systems 71 and 76.

Now, because reticle encoder system 70 of the embodiment comprises six two-dimensional encoder heads, twelve measurement information can be obtained. Therefore, main controller 50, for example, obtains a Y position ($Y_1$) of air slider section $22_1$ of reticle stage RST by an average of the measurement values of the position in the Y-axis direction measured by encoder heads 72 and 74, and obtains an X position ($X_1$) of air slider section $22_1$ of reticle stage RST from the measurement values of the position in the X-axis direction measured by encoder head 73. Similarly, main controller 50, obtains a Y position ($Y_2$) of air slider section $22_2$ of reticle stage RST by an average of the measurement values of the position in the Y-axis direction measured by encoder heads 77 and 79, and obtains an X position ($X_2$) of air slider section $22_2$ of reticle stage RST from the measurement values of the position in the X-axis direction measured by encoder head 78. Furthermore, by the average and difference of $Y_1$ and $Y_2$, main controller 50 obtains a Y position and a θz position (rotational amount in the θz direction, that is, yawing amount) of reticle stage RST, respectively, and obtains an X position of reticle stage RST from the average of $X_1$ and $X_2$.

Further, by the average and difference of the measurement values of the position in the Z-axis direction measured by encoder heads 73 and 78, main controller 50 obtains a Z position and a θy position (rotational amount in the θy direction, that is, rolling amount) of reticle stage RST. Further, the θx position ($θx_1$ ($θx_2$)) of air slider sections $22_1$ and $22_2$ is obtained from the difference between the measurement values of the position in the Z-axis direction measured by each of the encoder heads 72 and 74, and 77 and 79, and the θx position (rotational amount in the θx direction, that is, pitching amount) of reticle stage RST is obtained from the average of $θx_1$ and $θx_2$. In this case, the X, Y, and Ox positions of reticle stage RST can be obtained without averaging the two measurement values in each direction as is described above measured by encoder system 70, and either of the measurement values can be used without modification.

Based on the positional information in directions of six degrees of freedom of reticle stage RST obtained in the manner described above, main controller 50 drives (controls) reticle stage RST via reticle stage drive system 340 previously described.

FIG. 6 shows a block diagram showing an input/output relation of main controller 50, which centrally configures a control system of exposure apparatus 100 of the embodiment. Main controller 50 includes a so-called microcomputer (or workstation) consisting of a CPU (Central Processing Unit), ROM (Read Only Memory), RAM (Random Access Memory) and the like, and has overall control over the entire apparatus.

Next, a flow of an exposure operation according to exposure apparatus 100 configured in the manner described above will now be briefly described.

First of all, under the control of main controller 50, loading of reticle R by a reticle loader (not shown) on reticle stage RST and loading of wafer W by a wafer loader (not shown) on wafer stage WST are performed, and also using alignment system ALG (refer to FIG. 6) and a reticle alignment system (not shown) and the like, preparatory operations such as reticle alignment, baseline measurement of alignment system ALG and the like are performed according to a predetermined procedure like the one disclosed in, for example, U.S. Pat. No. 5,646,413 and the like. Incidentally, reticle alignment can be performed, using an aerial image measuring instrument (not shown) provided on wafer stage WST, instead of the reticle alignment system.

Then, main controller 50 performs wafer alignment such as EGA (enhanced global alignment) disclosed in, for example, U.S. Pat. No. 4,780,617 and the like, using alignment system ALG, and after the wafer alignment has been completed, an exposure operation by the step-and-scan method is performed. Because this exposure operation is similar to the conventional step-and-scan method, the explanation thereabout shall be omitted.

On this exposure operation, wafer stage WST and reticle stage RST are relatively driven in the Y-axis direction under the control of main controller 50. On this drive, main controller 50 controls reticle stage drive system 340 (Y linear motors 36, 37, 38, and 39, and voice coil motors 25X and 28X) and drives reticle stage RST, based on the measurement results of reticle encoder system 70.

Further, along with controlling X voice coil motor 66X and Y voice coil motor 66Y described above based on the measurement results of surface plate interferometer 240 so that reticle stage surface plate RBS maintains a predetermined state, main controller 50 also controls Z voice coil motor 66Z based on the measurement results of Z encoder 81, and by adjusting the position of reticle stage surface plate RBS in the Z direction, and the θx and the θy directions, indirectly adjusts the position of reticle R in the Z direction, and the θx and the θy directions.

As described above, according to reticle stage device 20 equipped in exposure apparatus 100 of the present embodiment, in stator 40A fixed to counter mass 18 and the corresponding mover 30A, of the three magnet units (mover sections), magnet unit (mover section) 25 positioned in the center in the Z-axis direction, magnet unit (mover section) 24 positioned on the +Z side, and armature unit (stator section) 36 configure Y linear motor 36 which drives reticle stage RST in the Y-axis direction. Further, in stator 40A and the corresponding mover 30A, magnet unit (mover section) 25, magnet unit (mover section) 26 positioned in the −Z side, and armature unit (fixed section) 37 configure Y linear motor 37 which drives reticle stage RST in the Y-axis direction.

Further, in stator 40A fixed to counter mass 18 and the corresponding mover 30A, of the three magnet units (mover sections), magnet unit (mover section) 28 positioned in the center in the Z-axis direction, magnet unit (mover section) 27 positioned on the +Z side, and armature unit (stator section) 38 configure Y linear motor 38 which drives reticle stage RST in the Y-axis direction. Further, in stator 40B and the corresponding mover 30B, magnet unit (mover section) 28, magnet unit (mover section) 29 positioned in the −Z side, and armature unit (fixed section) 39 configure Y linear motor 39 which drives reticle stage RST in the Y-axis direction. Accordingly, by these two pairs of Y linear motors 36 and 37, and 38 and 39, reticle stage RST can be driven in a direction parallel to the Y-axis with a high output.

Further, according to reticle stage device 20, because magnet unit (mover section) 25 is used in common by Y linear motors 36 and 37, and magnet unit (mover section) 28 is used in common by Y linear motors 38 and 39, the weight of the mover section of reticle stage device 20 can be reduced when compared with the case when each pair of Y linear motors 36 and 37 and Y linear motors 38 and 39 are completely separate. This allows a much higher acceleration of reticle stage RST and reticle R held by the stage and an improvement in position controllability.

Further, according to reticle stage device 20 of the embodiment, reticle encoder system 70 is employed which obtains (measures) positional information of reticle stage RST by irradiating a measurement beam from directly below on gratings RG1 and RG2 provided on the bottom surface of reticle stage RST (air slider sections $22_1$ and $22_2$), using encoder heads 72 to 74, and 77 to 79 set in projection optical system PL. By employing a position measurement system having this structure, a highly precise position measurement of reticle stage RST becomes possible. As well as this, because it no longer becomes necessary to provide a reflection surface used by the interferometer on reticle stage RST, it becomes possible to place magnet units (mover sections) 25 and 28 previously described at a position at the height of the neutral plane, which, as a consequence, makes it possible to employ reticle stage drive system 340 having the structure described above.

Further, according to exposure apparatus 100 of the embodiment, because it becomes possible to drive reticle R with high precision by reticle stage device 20, it becomes possible to precisely transfer the pattern formed on reticle R onto wafer W with good precision by scanning exposure.

Incidentally, in the embodiment above, while the same but symmetric configuration in the Y-axis direction was employed between both the drive system on +X side of reticle stage RST including mover 30A and stator 40A and the drive system on +X side of reticle stage RST including mover 30B and stator 40B, besides this, a structure (hereinafter referred to as a configuration of sharing mover sections related to the present invention) can be employed where an upper and lower pair of stator sections (the armature unit in the embodiment above) share a mover section (the magnet unit in the embodiment above) positioned in the center in the Z-axis direction in at least one of the drive systems. In the case of employing the configuration of sharing mover sections related to the present invention in only one of the drive systems, a reflection surface can be provided on an end surface on the other drive system side in a direction parallel to a second axis of a movable body, and the position in the second axis direction of the movable body can be measured by the interferometer.

A Second Embodiment

Next, a second embodiment of the present invention will be described, with reference to FIGS. 7 to 12. Here, the same reference numerals will be used for the same or similar sections as in the first embodiment previously described, and a detailed description thereabout will be simplified or omitted.

Figure 7:
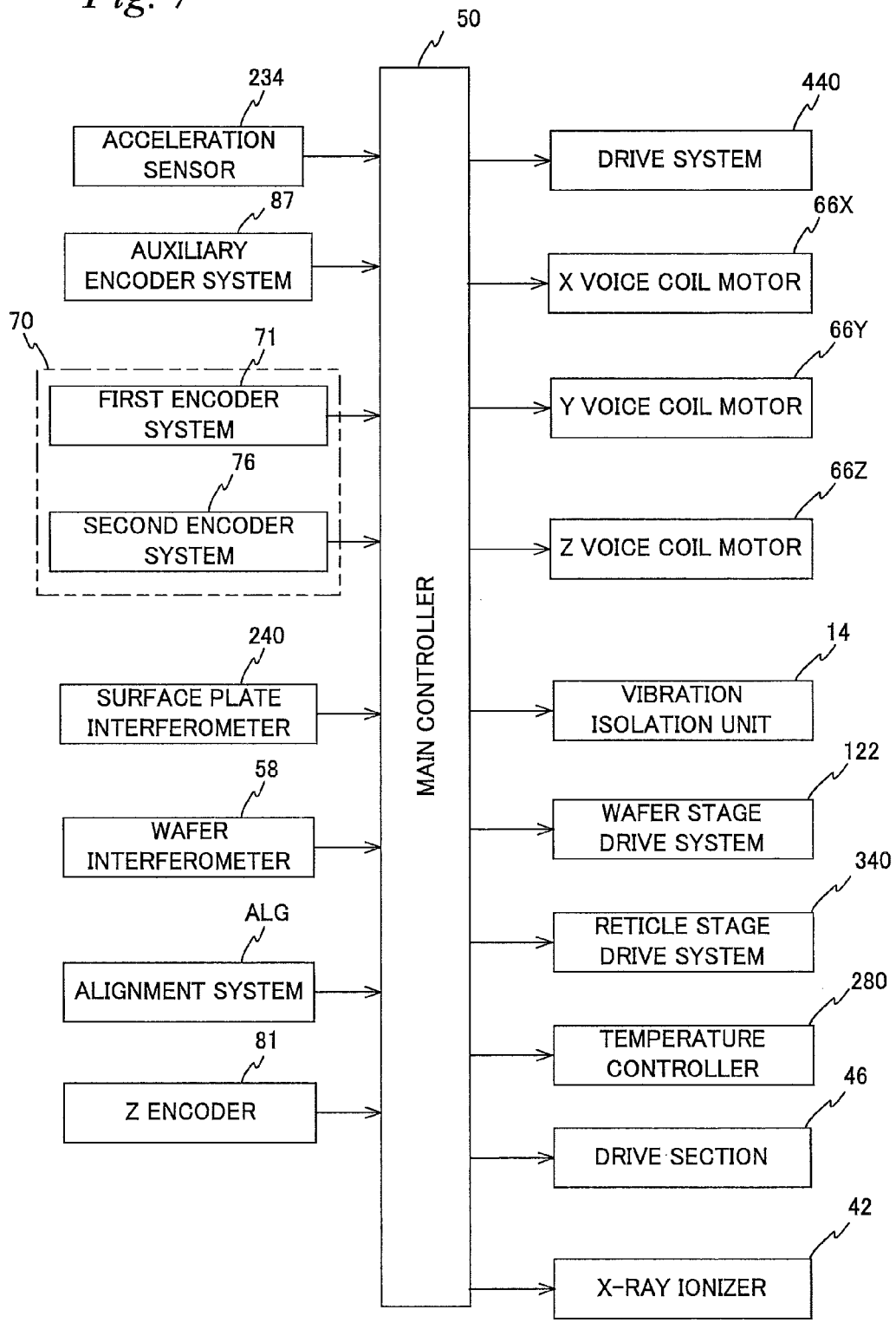
FIG. 7 is a block diagram that shows an input/output relation of a main controller, which centrally configures a control system of an exposure apparatus of a second embodiment in FIG. 7.

FIG. 7 shows a block diagram showing an input/output relation of main controller 50, which centrally configures a control system of the exposure apparatus of the second embodiment. As is obvious when comparing FIGS. 6 and 7, in the exposure apparatus of the second embodiment, components similar to the first embodiment previously described are connected to main controller 50, and further, an auxiliary encoder system 87, a temperature controller 280, a drive section 46, and an X-ray ionizer 42 are connected. The description below includes these auxiliary encoder system 87, temperature controller 280, drive section 46, X-ray ionizer 42, and the embodiment will be described focusing mainly on the difference with the first embodiment.

Figure 9A:
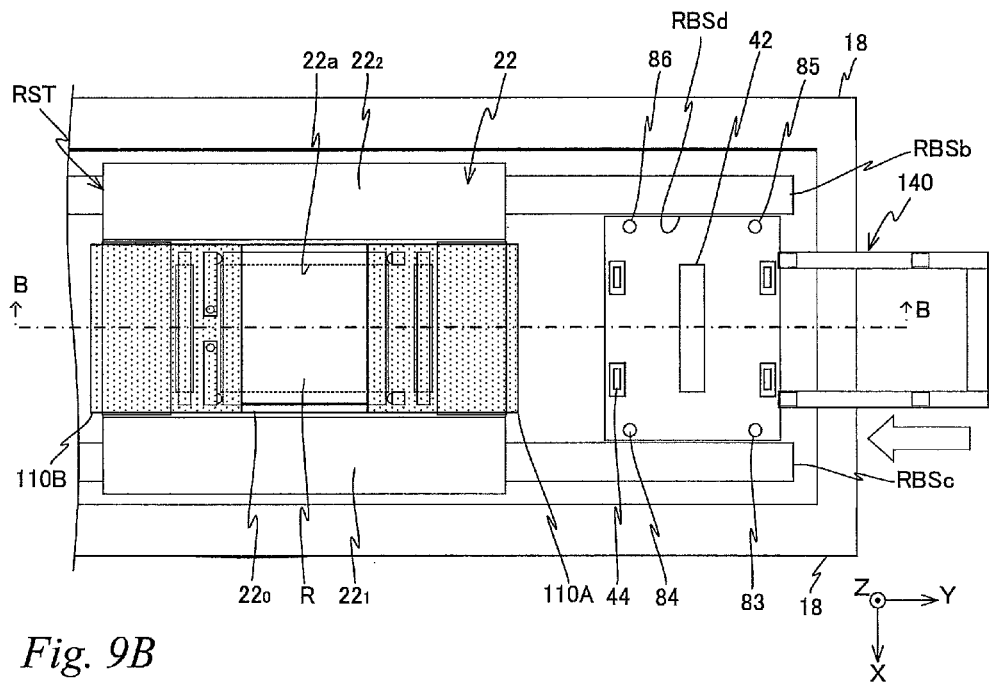
FIG. 9A is a planar view that shows a vicinity of the reticle stage device of the exposure apparatus in the second embodiment.
Figure 9B:
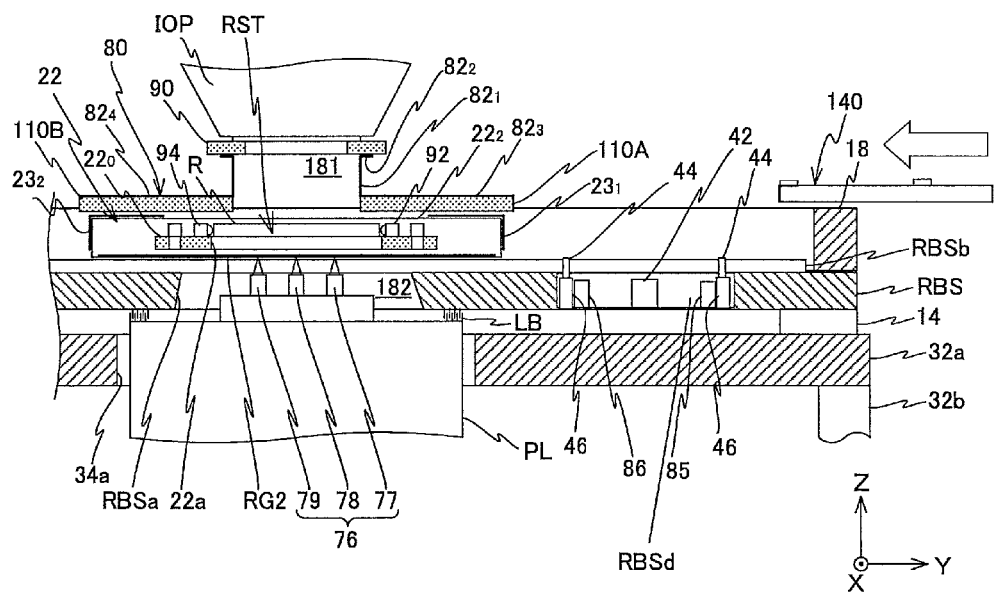
FIG. 9B is a longitudinal sectional view of the vicinity of the reticle stage device sectioned along a line B-B in FIG. 9A.

In the exposure apparatus of the second embodiment, as shown in FIG. 9B, a purge cover 80 is arranged below a ring shaped fixed member 90 which fixes a light transmitting window member (for example, a glass plate or a lens) located on the lower end (outgoing end) of illumination unit IOP to the housing of illumination unit IOP. Purge cover 80 has a cylindrical portion $82_1$ which has an elongated rectangular shape in the X-axis direction in a planar view, a flange portion $82_2$ provided on the upper end of cylindrical portion $82_1$, and a pair of plate sections $82_3$ and $82_4$ which are provided extending in the +Y direction and the −Y direction, respectively, from the lower end of cylindrical portion $82_1$.

The upper surface of flange portion $82_2$ is fixed to the lower surface of fixed member 90. Cylindrical portion $82_1$ surrounds an irradiation area of illumination light IL emitted from illumination unit IOP. The length of cylindrical portion $82_1$ in the X-axis direction is set slightly shorter than the distance between the outer periphery of air slider sections $22_1$ and $22_2$ of reticle stage RST in the X-axis direction.

Plate section $82_3$ is a plate shaped portion which is parallel to the XY plane extending to the +Y side from the lower end on the +Y side of cylindrical portion $82_1$. A thin plate-shaped proximity cooling device 110A is fixed to the lower surface of this plate section $82_3$. The lower surface of proximity cooling device 110A is located at a position slightly higher than the upper end surface of reticle stage RST.

Plate section $82_4$ is a plate shaped portion which is parallel to the XY plane extending to the −Y side from the lower end on the −Y side of cylindrical portion $82_1$. A thin plate-shaped proximity cooling device 110B is fixed to the lower surface of this plate section $82_4$. The lower surface of proximity cooling device 110B is positioned on the same XY plane as the lower surface of proximity cooling device 110A.

Further, to the end on the +Y side of reticle stage RST, an end cover $23_1$ is attached which has an L shape when viewed from the side and covers the upper end and the tip of the end on the +Y side. Similarly, to the end on the −Y side of reticle stage RST, an end cover $23_2$ is attached which has an L shape when viewed from the side and covers the upper end and the tip of the end.

In this case, end cover $23_1$ covers the end surface on the +Y side and the upper surface of the +Y end of air slider sections $22_1$ and $22_2$, and end cover $23_2$ covers the end surface on the −Y side and the upper surface of the −Y end of air slider sections $22_1$ and $22_2$. Therefore, the space on which reticle R is mounted is surrounded all around in every direction by end covers $23_1$ and $23_2$ and air slider sections $22_1$ and $22_2$.

A predetermined clearance (clearance gap/ distance/gap/ spatial distance), such as, for example, a clearance (clearance gap/distance/gap/spatial distance) of several μm to several mm (3 mm at the greatest) is formed between the lower surface of proximity cooling device 110A and end cover $23_1$, and the lower surface of proximity cooling device 110B and end cover $23_2$, respectively.

The length of proximity cooling devices 110A and 110B in the X-axis direction is set to the same level or slightly shorter than the length of cylindrical portion $82_1$ in the X-axis direction. Further, the length in the Y-axis direction and setting position of proximity cooling device 110A are set so that at least a part of the lower surface of proximity cooling device 110A faces end cover $23_1$ within the moving range in the Y-axis direction of reticle stage RST at the time of scanning exposure regardless of its position. Similarly, the length in the Y-axis direction and the setting position of proximity cooling device 110B is set so that at least a part of the lower surface of proximity cooling device 110B faces end cover $23_2$ within the moving range in the Y-axis direction of reticle stage RST at the time of scanning exposure regardless of its position.

In the manner described above, in the present embodiment, a space 181 of a substantially airtight state is formed by purge cover 80, proximity cooling devices 110A and 110B, end covers $23_1$ and $23_2$, air slider sections $22_1$ and $22_2$, and reticle R. In this space 181, for example, clean dry air (CDA) whose humidity is 1% or less is supplied as the purge gas from a supply opening (not shown), and is exhausted outside via a exhaust opening. In other words, internal gas (air) of space 181 is purged with CDA. The ratio of moisture which is a substance accelerating the reaction of haze generation on a reticle (mask) included in CDA is extremely small when compared with the case of normal air. Space 181 becomes a purge chamber which is in a substantially airtight state. Hereinafter, this space will be referred to as a first purge space 181. In this case, the first purge space 181 is in an airtight state where the control accuracy of the humidity inside can be maintained to a predetermined level, such as for example, the humidity being maintained to around 2% in the case the inside is purged with CDA having a humidity of 1%. Further, the first purge space 181 is in an airtight state where fog generation of the optical members such as the lens of the illumination unit in contact with space 181 resulting from the presence of moisture can be suppressed, such as for example, an airtight state where the fog generation is suppressed to a level so that exposure can be carried out without any problems. The second purge space 182 is also set to the same level of airtight state as the first purge space 181 previously described.

Proximity cooling devices 110A and 110B are to be cooled by a heat exchange with a coolant which passes through a cooling piping (not shown). The temperature of proximity cooling devices 110A and 110B are monitored by a temperature sensor (not shown), and the temperature signals are sent to temperature controller 280 (refer to FIG. 7), and is controlled to a desired value as it will be described later on. The temperature control of proximity cooling devices 110A and 110B can be achieved by changing the temperature of the coolant, or the temperature control can also be achieved by installing a semiconductor Peltier element (not shown) between proximity cooling devices 110A and 110B and the coolant, and controlling the current supplied to the Peltier element so that a heat transmission amount is actively controlled. In the latter case, there is the advantage that the response of temperature control of proximity cooling devices 110A and 110B become quicker. In the second embodiment, proximity cooling devices 110A and 110B performs cooling of reticle R and reticle stage RST in a non-contact manner. In other words, reticle R (and reticle stage RST) is cooled by proximity cooling devices 110A and 110B by a radiative heat transfer.

Figure 8A:
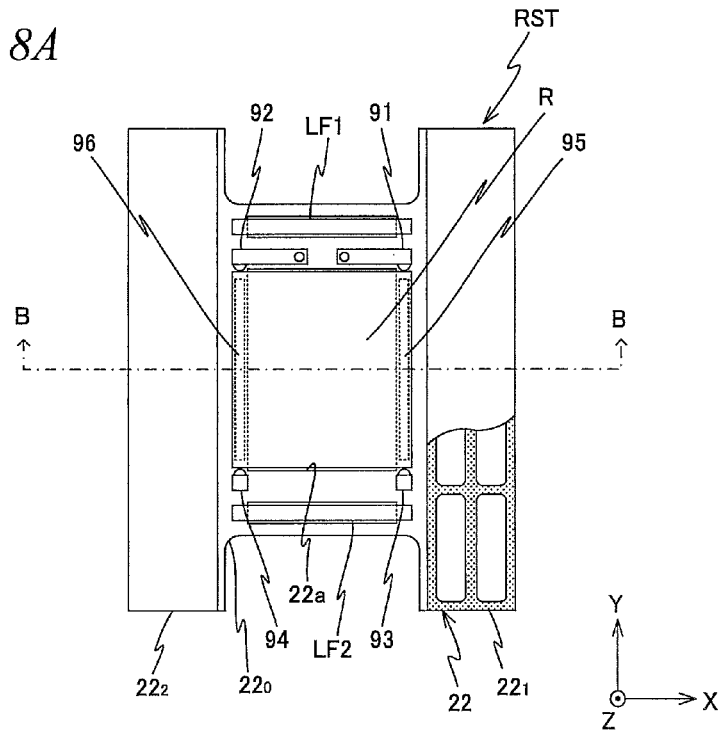
FIG. 8A is a planar view that shows a configuration of a reticle stage device of the exposure apparatus in the second embodiment.
Figure 8B:
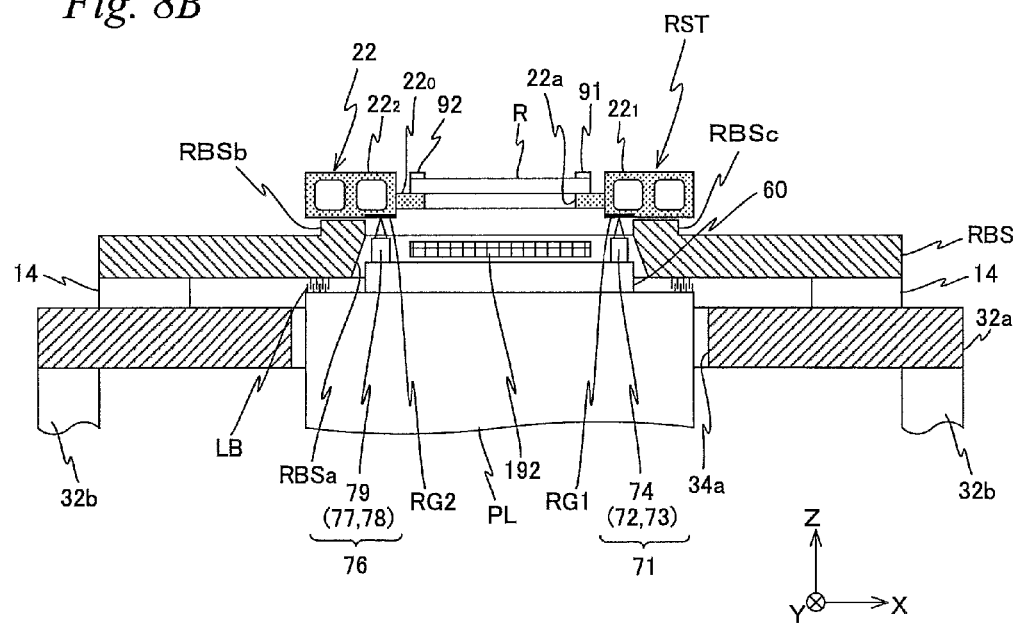
FIG. 8B is a longitudinal sectional view of the reticle stage device sectioned along a line B-B in FIG. 8A.
Figure 10:
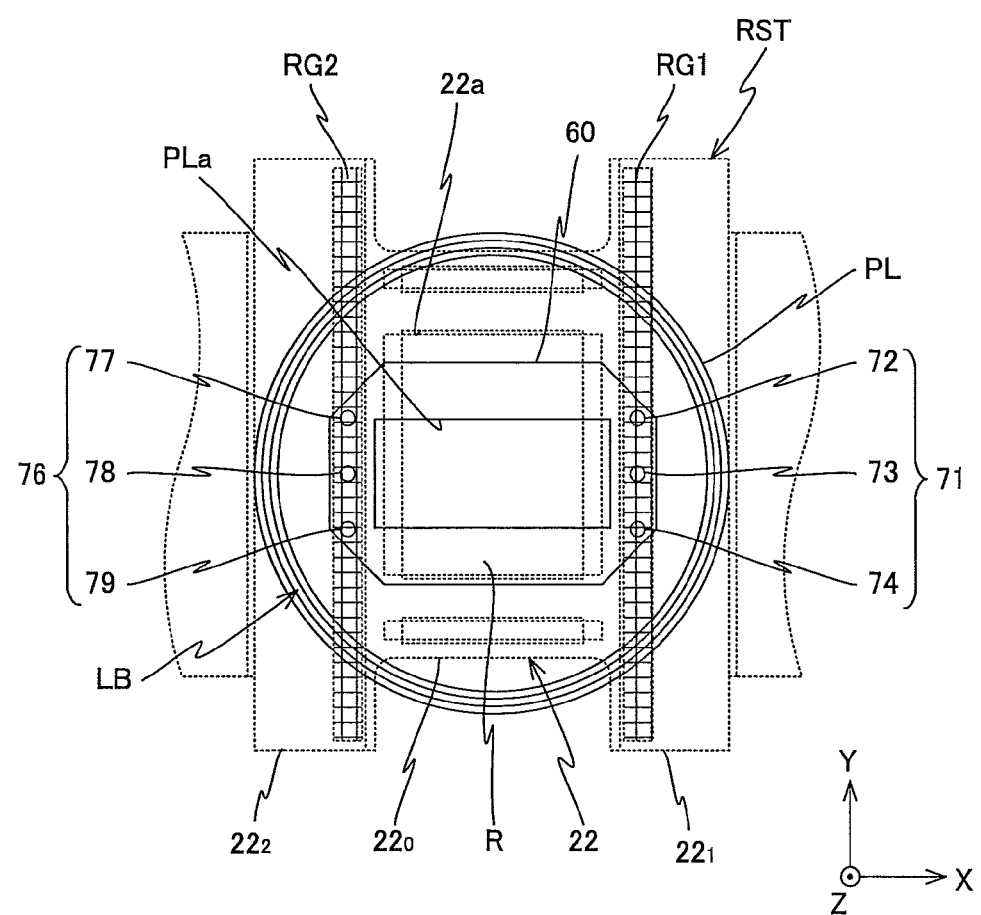
FIG. 10 is a view that shows a configuration of a reticle encoder system and a labyrinth seal of the exposure apparatus in the second embodiment.

Further, reticle stage surface plate RBS and projection optical system PL are sealed together, for example, via a labyrinth seal LB, which is a type of a non-contact seal as shown in FIGS. 8 and 10. Incidentally, in FIG. 8, illustration of linear motors (30A, 40A) and (40A, 40B) that drive reticle stage RST, and counter mass 18 and the like is omitted (refer to FIG. 5).

Labyrinth seal LB shown in FIG. 8 is set between reticle stage surface plate RBS and projection optical system PL, in a state surrounding the periphery of opening RBSa. In this case, labyrinth seal LB has a loop shaped upper member whose upper end is fixed to the lower surface of reticle stage surface plate RBS in a state surrounding the periphery of opening RBSa, and a lower member which engages with the upper member in a non-contact manner and whose lower surface is fixed to the upper surface of projection optical system PL in a state surrounding an upper surface member 60. The upper member has multiple projection portions which are concentric when viewed from the −Z direction (refer to FIG. 10), and the lower member has multiple projection portions which are positioned slightly outside of the upper member, engage with the upper member in a non-contact manner, and are concentric when viewed from the +Z direction. However, the two projection portions engage with each other constantly in a non-contact manner, without being in contact, even if reticle stage surface plate RBS is finely driven.

Therefore, in the exposure apparatus of the second embodiment, as shown in FIGS. 8 and 9B, a space 182 of a substantially airtight state is formed, divided by reticle R and reticle stage main body 22, the inner wall surface of opening RBSa of reticle stage surface plate RBS, the upper surface of projection optical system PL, and labyrinth seal LB. CDA is supplied from an air outlet 192 (refer to FIG. 8) provided in a part of the inner wall surface of opening RBSa of reticle stage surface plate RBS inside such space 182, and is exhausted outside via an exhaust opening (not shown). In other words, internal gas (air) of space 182 is purged with CDA. Space 182 becomes a purge chamber which is in a substantially airtight state. Hereinafter, this space will be referred to as a second purge space 182.

Furthermore, in the second embodiment, on the upper surface of reticle stage surface plate RBS a predetermined distance away in the +Y direction from the second encoder system (encoder heads 77, 78, and 79) positioned within opening RBSa of reticle stage surface plate RBS, a rectangular recess section RBSd of a predetermined depth is formed as shown in FIGS. 9A and 9B, adjacent to protruding shaped sections RBSb and RBSc. At the end on the +X side inside recess section RBSd, a pair of encoder heads 83 and 84 are placed on the same straight line in the Y-axis direction as encoder heads 77, 78, and 79 previously described. Further, at the end on the −X side inside recess section RBSd, a pair of encoder heads 85 and 86 are placed, in a placement symmetric to the pair of encoder heads 83 and 84. Encoder heads 85 and 86 are placed on the same straight line in the Y axis direction as encoder heads 72, 73, and 74 previously described.

As encoder heads 83, 84, 85, and 86, two-dimensional encoder heads similar to encoder heads 72 to 74 previously described are used. Here, the Y-axis direction and the Z-axis direction serve as the measurement directions of the two encoder heads 83 and 85, and the X-axis direction and Z-axis direction serve as the measurement directions of the two encoder heads 84 and 86.

Figure 12:
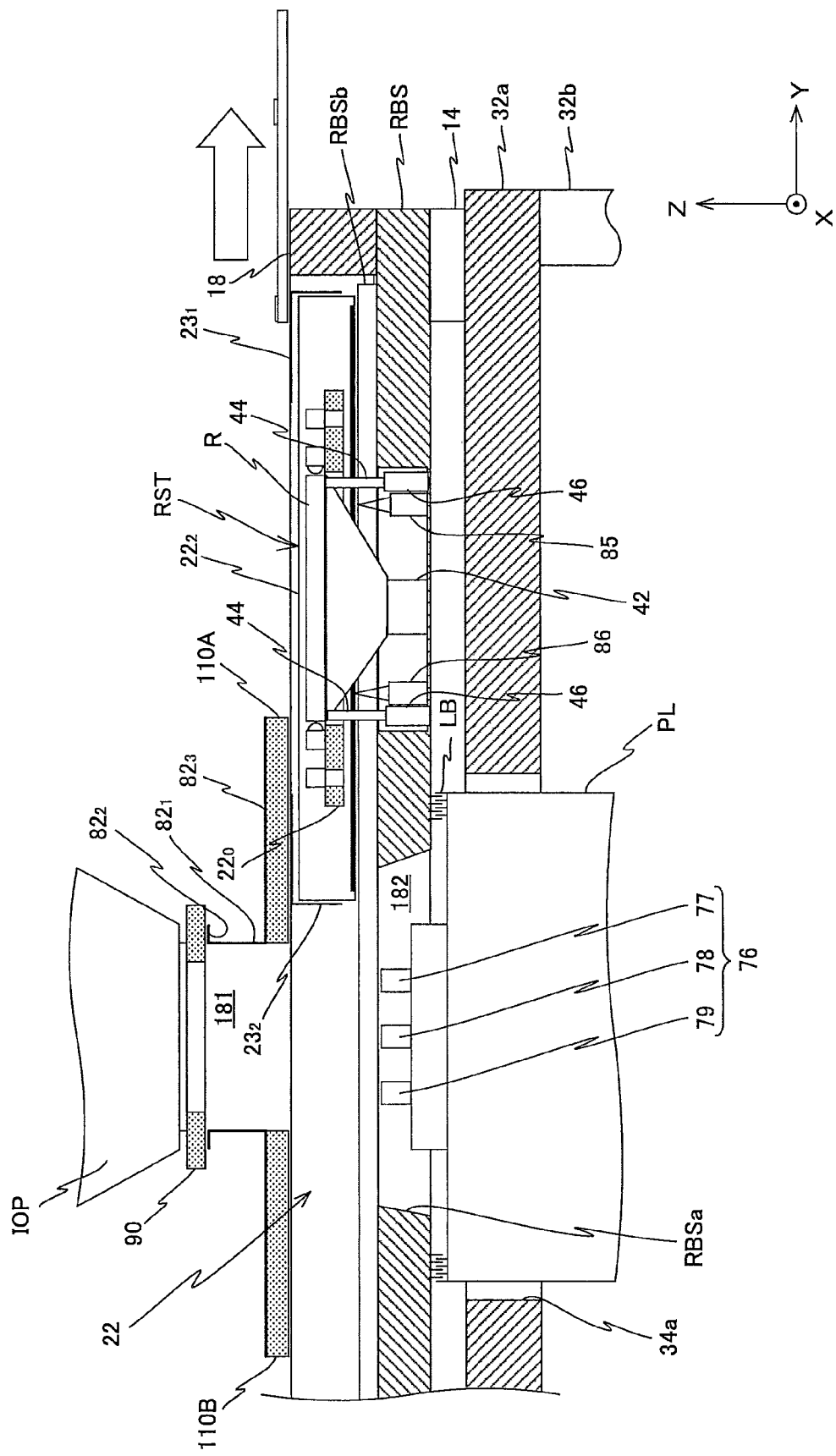
FIG. 12 is a view (No. 2) used to explain a flow of an operation in the exposure apparatus of the second embodiment.

As shown in FIG. 12, encoder heads 85 and 86 irradiate measurement beams on grating RG2 from below on the bottom surface of reticle stage RST (air slider section $22_2$), receive a plurality of diffraction lights generated in grating RG2, and obtain (measure) positional information of grating RG2 (air slider section $22_2$ of reticle stage RST) in each of the measurement directions.

Similar to encoder heads 85 and 86 described above, encoder heads 83 and 84 irradiate measurement beams on grating RG1 from below on the bottom surface of reticle stage RST (air slider section $22_1$), receive a plurality of diffraction lights generated in grating RG1, and obtain (measure) positional information of grating RG1 (air slider section $22_1$ of reticle stage RST) in each of the measurement directions. Encoder heads 83, 84, 85, and 86 configure auxiliary encoder system 87 which performs measurement of the position of reticle stage RST when reticle stage RST moves away in the +Y direction from a measurement range of at least a part of encoder heads of the first encoder system 71 and the second encoder system 76. The measurement information of each encoder head of auxiliary encoder system 87 is sent to main controller 50 (refer to FIG. 7).

Further, in the center of recess section RBSd, an X-ray ionizer 42 of a rectangular shape elongated in the X-axis direction in a planar view is fixed, with the head facing upward, as shown in FIGS. 9A and 9B. As this X-ray ionizer 42, for example, a photoionization system is used, which utilizes an ion generation method (photoionization). In this photoionization system, because ion generation balance is equal, molecules in the vicinity of the charged body are ionized and de-electrified without a reverse charge occurring, the de-electrifying efficiency is extremely high. Further, dust, electromagnetic noise, ozone and the like are not generated. X-ray ionizer 42 is controlled by main controller 50 (refer to FIG. 7), including the on and off operation.

Furthermore, inside recess section RBSd, as shown in FIGS. 9A and 9B, a pair each of vertical movement members 44 is arranged at both ends in the Y-axis direction, with X-ray ionizer 42 in between. Each of the vertical movement members 44 is driven in the Z-axis direction by drive section 46. These four vertical movement members 44 are placed in a positional relation so that when reticle stage RST comes directly above the movement members, the movement members can appear above plate shaped section $22_0$ of reticle stage main body 22 via opening 22a. Further, four vertical movement members 44 are each placed at a position facing both of the outer sides in the Y-axis direction of the pattern area of reticle R mounted on reticle stage main body 22. Accordingly, when reticle stage RST holding reticle R comes to the position right above the four vertical movement members 44, suction of reticle R by vacuum chucks 95 and 96 previously described is released, and by the four vertical movement members being driven upward in a state where fixation of reticle R by clampers 91 and 92 has been released, reticle R is lifted upward of reticle stage main body 22. Drive section 46 of the four vertical movement members 44 is controlled by main controller 50 (refer to FIG. 7).

Furthermore, in the second embodiment, as shown in FIGS. 9A and 9B, a carrier arm 140 which has a U-shape in a planar view is provided within a carriage path of reticle R. This carrier arm 140 is reciprocally driven in the Y-axis direction by a drive system (not shown). Delivery of reticle R is performed between this carrier arm 140 and the four vertical movement members 44, in the manner described below. The drive system (not shown) of carrier arm 140 is also controlled by main controller 50.

Figure 11:
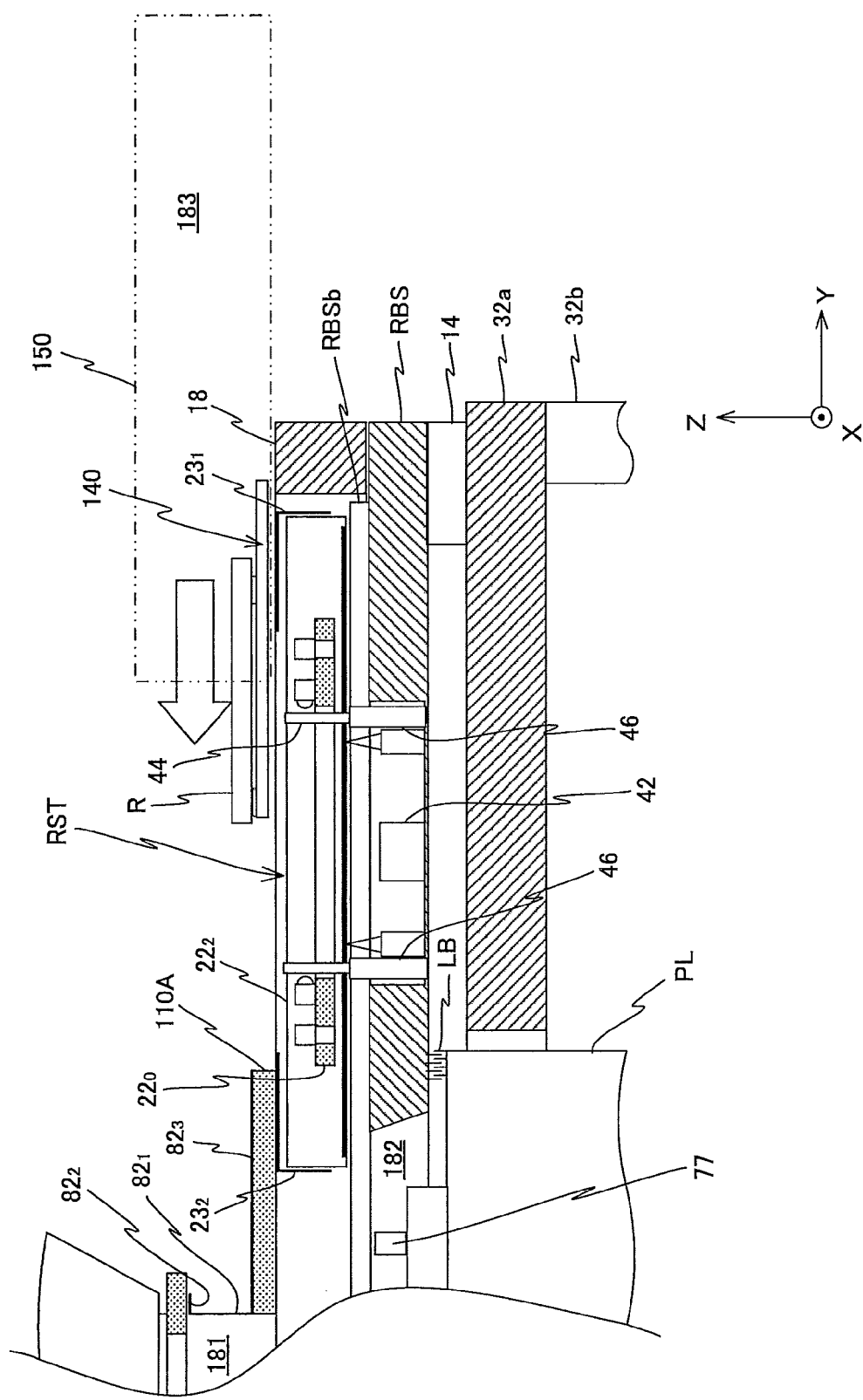
FIG. 11 is a view (No. 1) used to explain a flow of an operation in the exposure apparatus of the second embodiment.

In the embodiment, at least apart downstream (the side that is near to illumination unit IOP) of the carrier path of reticle R including the movement path of carrier arm 140 is covered with a cover 150 as shown in FIG. 11, and the inside is a purge space 183 which is purged with clean dry air (CDA).

In the exposure apparatus of the second embodiment, the configuration for other sections is the same as exposure apparatus 100 of the first embodiment previously described.

Next, a flow of an operation according to the exposure apparatus of the second embodiment configured in the manner described above will now be briefly described.

First of all, by main controller 50 performs loading of reticle R on reticle stage RST in the following manner.

As shown in FIG. 11, main controller 50 controls the drive system (not shown) of carrier arm 140, and carrier arm 140 holding reticle R proceeds in the −Y direction toward the area above reticle stage RST which is waiting at a reticle exchange position, via purge space 183. During this movement, the air around carrier arm 140 and reticle R is purged with CDA. This effectively suppresses the occurrence of haze during the carriage of reticle R.

In parallel with the movement of carrier arm 140, main controller 50 drives the four vertical movement members 44 upward to a position shown in FIG. 7 via drive section 46. Then, when carrier arm 140 which holds reticle R comes to a position right above reticle stage main body 22, main controller 50 stops carrier arm 140 at the position and drives the four vertical movement members 44 further upward. During the upward drive of the four vertical movement members 44, reticle R is delivered to the four vertical movement members 44 from carrier arm 140, and the four vertical movement members 44 are further driven upward, and then are stopped.

Next, main controller 50 starts a drive in the +Y direction to return carrier arm 140 to the original position. Then, main controller 50 drives the four vertical movement members 44 downward when carrier arm 140 has withdrawn from above reticle stage RST. This loads reticle R supported by the four vertical movement members 44 on reticle stage RST (reticle stage main body 22), as shown in FIG. 12. Then, at the same time or just before reticle R is mounted on reticle stage main body 22, main controller 50 activates X-ray ionizer 42 and begins to de-electrify reticle R, or in other words, starts to eliminate static electricity with which reticle R is charged.

In this case, in the second embodiment, because the space of the carrier path is purged with CDA to control the generation of haze of reticle R which is being carried, the low humidity atmosphere when reticle R is delivered from carrier arm 140 to vertical movement members 44 can easily cause static charge due to charge separation. Therefore, to de-electrify reticle R immediately after the delivery of reticle R from carrier arm 140 to vertical movement member 44 is very useful. Further, in the second embodiment, because reticle R is de-electrified from the patterned surface side by an ion generation method, an effective de-electrifying can be performed.

In parallel with the de-electrifying described above, main controller 50 performs suction of reticle R using vacuum chucks 95 and 96, a downward drive of vertical movement members 44, and position measurement of reticle stage RST using encoder heads 83 to 86.

Then, main controller 50 drives reticle stage RST in the −Y direction by a predetermined distance, and when it becomes possible to perform position measurement of reticle stage RST using a part of the encoder heads of retile encoder system 70 and encoder heads 83 to 86, performs linkage of measurement values of encoder heads 83 to 86 and measurement values of reticle encoder system 70, and stops reticle stage RST at a predetermined position.

In parallel with the series of reticle load operations described above, loading of wafer W on wafer stage WST is performed, by a wafer loader (not shown). And, as in the first embodiment previously described, main controller 50 performs preparatory operations such as reticle alignment and baseline measurement of alignment system ALG, wafer alignment such as EGA (enhanced global alignment) and the like, and exposure operation by the step-and-scan method.

On this exposure operation, while wafer stage WST and reticle stage RST are relatively driven in the Y-axis direction under the control of main controller 50, on the drive, main controller 50 controls reticle stage drive system 340 and drives reticle stage RST, based on the measurement results of reticle encoder system 70. On this drive, while reticle stage RST reciprocally moves within a predetermined range in the Y-axis direction, by this movement, the airtight state is maintained in purge space 181, as well as in purge space 182, and the CDA purge is effectively performed. Further, in the exposure operation by the step-and-scan method, while reticle stage RST repeats the reciprocal movement operation in the Y-axis direction, temperature controller 280 effectively cools reticle R and reticle stage RST by radiative heat transfer, via the pair of proximity cooling devices 110A and 110B which are provided distanced apart in the Y-axis direction.

Main controller 50 calculates an exposure ratio (duty ratio of an opening and closing of a shutter) based on illuminance signals from the power monitor (integrator sensor) previously described, and computes an exposure energy based on the calculation results and a known illuminance and data such as a pattern opening ratio of reticle R, reflectivity and the like, and predicts heat quantity Q given to reticle R based on the computation results. Then, main controller 50 decides a temperature target value of proximity cooling devices 110A and 110B using a predetermined formula so that heat quantity Q coincides with a heat amount q given to proximity cooling devices 110A and 110B from reticle R at the time of radiational cooling, and conveys a command value to temperature controller 280. This allows temperature controller 280 to control the temperature of proximity cooling devices 110A and 110B, which allows the temperature of reticle R to be adjusted within a predetermined range.

As is described above, according to the exposure apparatus of the second embodiment, an equivalent effect can be obtained as in the first embodiment previously described. As well as this, according to the exposure apparatus of the second embodiment, various kinds of effects as in the description below can be obtained.

In other words, the exposure apparatus of the second embodiment is equipped with X-ray ionizer 42, which is placed on reticle stage surface plate RBS, on the carrier path of reticle R positioned on one side (the +Y side) in the Y-axis direction of the irradiation area of illumination light IL. Therefore, X-ray ionizer 42 removes the static electricity with which reticle R mounted on reticle stage RST is charged on the carrier path of the reticle, or in other words, before reticle stage RST holding reticle R moves to the irradiation area of illumination light IL. Further, in this case, X-ray ionizer 42 removes the static electricity with which reticle R was charged from the reticle stage surface plate RSB side (from the patterned surface side of reticle R). Accordingly, the reticle can be de-electrified effectively, without decreasing the throughput.

Further, the exposure apparatus of the second embodiment is equipped with proximity cooling devices 110A and 110B which are placed facing a plane on the +Z side of reticle stage RST and reticle R (the side of illumination unit IOP) via a predetermined clearance (clearance gap/ distance/ gap/spatial distance), in an area between illumination unit IOP and reticle R where illumination light IL is not interrupted. And, space 181 serves as a first purge space, which includes the optical path of illumination light IL between illumination unit IOP and projection optical system PL and is purged with a purge gas such as, for example, CDA, and proximity cooling devices 110A and 110B also serve as a partition wall which isolates the first purge space 181 against the outside air. Therefore, by proximity cooling devices 110A and 110B, temperature control (cooling) of reticle R held by reticle stage RST during the exposure operation by the step-and-scan method can be performed. Especially, in the embodiment, because the apparatus is equipped with proximity cooling devices 110A and 110B placed on both sides in the Y-axis direction with respect to the illumination area, it becomes possible to control the temperature distribution of reticle R, such as for example, to control the temperature so that the entire surface of reticle R becomes a uniform temperature.

Further, by setting the clearance with reticle stage RST, or to be more precise, the clearance (clearance gap/ distance/ gap/spatial distance) between end covers $23_1$ and $23_2$ and proximity cooling devices 110A and 110B to a minute dimension which nearly blocks the gas flow, the first purge space 181 which is in a substantially airtight state enclosed by purge cover 80, proximity cooling devices 110A and 110B, and reticle stage RST and/or reticle R can be created. In other words, it no longer becomes necessary to surround reticle stage RST holding reticle R with a large air-tight shielding container. Further, because the space in the substantially airtight state described above is the first purge space 181 with which the purge gas is purged, various kinds of benefits responding to the characteristic of the purge gas occur. For example, in the case of using CDA as the purge gas, haze of reticle R can be effectively prevented. Furthermore, because proximity cooling devices 110A and 110B also serve as a partition wall which isolates purge space 181 from the outside air, in this point as well, the space where purge is performed can be secured without increasing the size of the device more than necessary.

In the exposure apparatus of the second embodiment, because temperature control (cooling) of reticle R held by reticle stage RST during the exposure operation by the step-and-scan method can be performed as described above, generation of distortion of the pattern due to thermal expansion of the reticle can be suppressed without bringing about a decrease in throughput, which as a consequence, causes expectations on improvement in the overlay accuracy. Further, because cooling of reticle R is performed by proximity cooling devices 110A and 110B using radiative heat transfer, generation of defects and the like of circuit elements such as raising particles (so-called dust), adhesion of particles on the reticle and the like can be suppressed. In addition, because haze of reticle R can be effectively prevented, it becomes possible to stop the generation of pattern defects and variation of CD (Critical Dimension) beforehand which occur due to haze that has grown on the reticle being transferred onto the wafer. Further, because it is not necessary to perform inspection on the reticle frequently to prevent such defects, as a consequence, productivity can be kept from decreasing, which in turn makes it possible to improve the productivity.

Incidentally, in the second embodiment above, with regard to reticle stage RST having a pair of slider sections $22_1$ and $22_2$ which is fixed to main body section 22 and to both ends in the X-axis direction of main body section 22, and the length in the Y-axis direction is longer than main body section 22, the case has been described where end covers 23$_1$ and 23$_2$ are used to surround the +Y end and the −Y end of air slider sections 22$_1$ and 22$_2$. However, as well as this, the end covers do not necessarily have to be provided if a structure is employed where reticle stage RST surrounds reticle R with side-walls all around in every direction. The point is, any structure is possible as long as a substantially air tight space can be formed above reticle R and below illumination unit IOP, by a pair of cover members (proximity cooling devices 110A and 110B in the second embodiment above is equivalent) facing the upper surface of the reticle stage via a predetermined clearance (clearance gap/ distance/ gap/spatial distance). Incidentally, the pair of cover members does not have to be a proximity cooling device, and any member can be used as long as it has a plane of a predetermined area which can face an upper surface of the reticle stage via a predetermined clearance (clearance gap/ distance/ gap/spatial distance). This member does not have to be a member whose entire surface is flat, and only has to have a planar section which does not interfere with the movement of the reticle stage at the time of scanning exposure and whose length in the X-axis direction is enough to substantially maintain the air-tightness between reticle stage RST at the time of such movement. In other words, the section outside the planar section in the X-axis direction can be bent downward or upward, or can be protruded.

Further, in the second embodiment described above, while the case has been described where the first purge space 181, the second purge space 182, and the third purge space 183 inside cover 150 were all purged with CDA whose humidity is 1% or less, CDA whose humidity is 10% or less can also be used as the purge gas. Further, as well as this, in one or two of the purge spaces 181, 182, and 183, the type of purge gas to be used may be different from other purge spaces. Further, while gas such as CDA whose ratio of moisture is small when compared to normal air can be used as the purge gas, as well as this, rare gas such as nitrogen and helium which do not include substances responsible for haze, such as for example, ammonium sulfate or ammonium carbonate, hydrocarbon, carboxylic acid, cyanuric acid, or molecular contaminants such as other carbon-based molecules, and also hardly absorbs illumination light IL can be used as the purge gas.

Incidentally, in the second embodiment, the measurement system used to measure the positional information of reticle stage RST is not limited to the encoder system, and can also be other measurement systems such as an interferometer system. Further, a destaticizing apparatus such as X-ray ionizer 42 does not necessarily have to be used together. Further, proximity cooling devices 110A and 110B do not have to serve as a partition wall of the purge space, do not have to be used together with the gas purge by CDA and the like of the space above the reticle stage, and the carrier path of reticle R including the movement path of carrier arm 140 does not have to be turned into a purge space which is purged with CDA. The point is, the encoder system used to measure the positional information of reticle stage RST, the destaticizing apparatus, the cooling device, the gas purge of the space above the reticle stage with CDA, and the purge with CDA during the carriage of the reticle can be performed independently, or by optionally combining at least two of the operations together.

Further, in the second embodiment above, while the case has been described where proximity cooling devices 110A and 110B are installed in the illumination area, on both sides in the Y-axis direction of the irradiation area of illumination light IL, being provided only on one side is also acceptable. Further, the size of the cooling surface of proximity cooling devices 110A and 110B can be equal to the reticle, or can be equal to the patterned area of the reticle. During the non-exposure operation (for example, during wafer exchange and the like), reticle stage RST can be moved to make reticle R face one of the proximity cooling devices so that reticle R can be cooled. Further, in this case, because there is no risk of the proximity cooling device and reticle R coming into contact and the like, the cooling can be performed by making proximity cooling device and reticle R move closer than at the time of exposure.

Incidentally, by cooling (controlling the temperature of) the reticle using the cooling device, as well as preventing deformation caused by thermal expansion of the reticle, the displacement of the patterned surface in the Z-axis direction which accompanies the deformation can also be prevented.

A Third Embodiment

Next, a third embodiment will be described, with reference to FIGS. 13 to 15C. Here, the same reference numerals will be used for the same or similar sections as in the first embodiment previously described, and a detailed description thereabout will be simplified or omitted.

Figure 13:
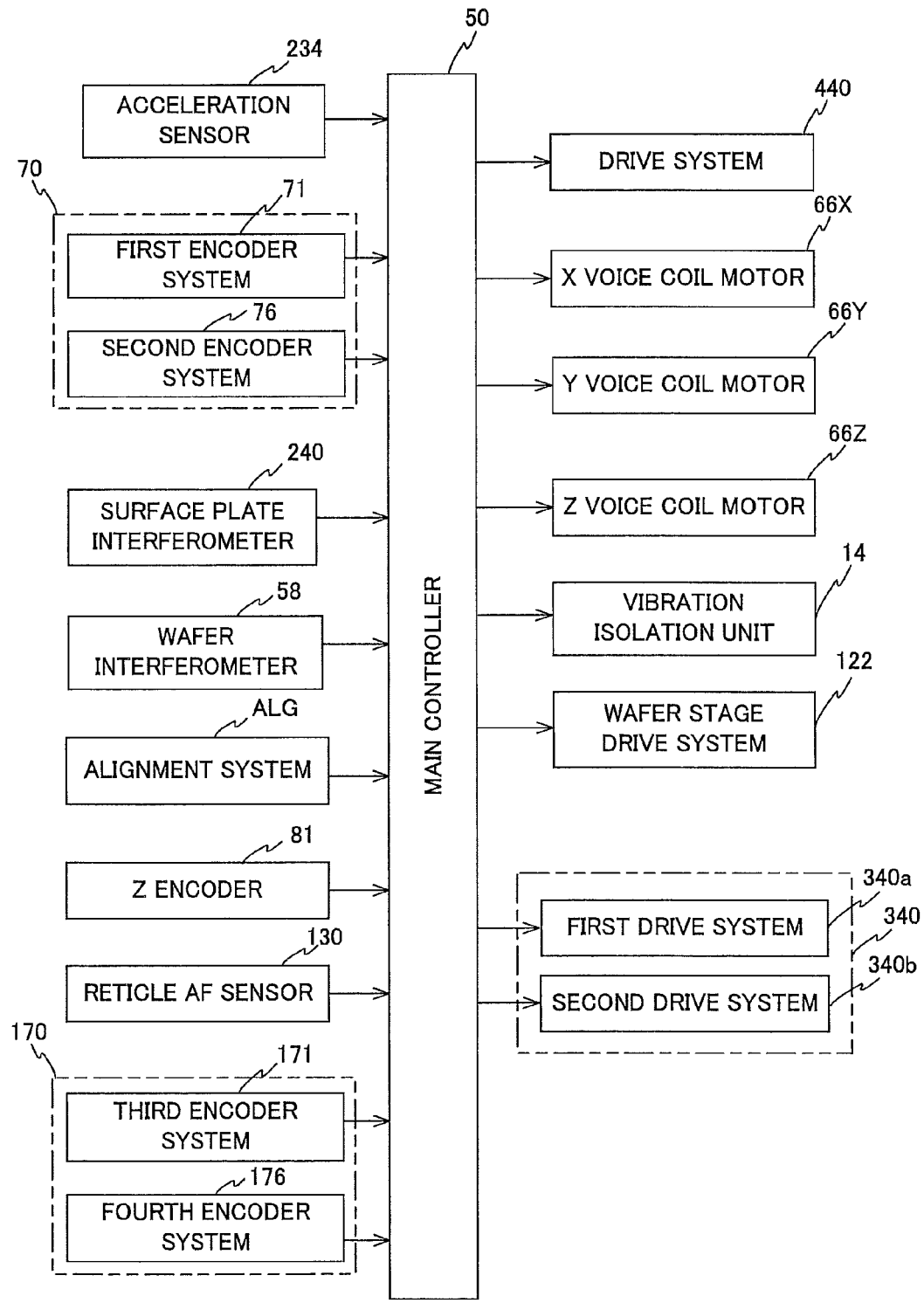
FIG. 13 is a block diagram that shows an input/output relation of a main controller, which centrally configures a control system of an exposure apparatus in a third embodiment.

FIG. 13 shows a block diagram showing an input/output relation of main controller 50, which centrally configures a control system of the exposure apparatus of the third embodiment. As is obvious when comparing FIGS. 13 and 6, in the exposure apparatus of the third embodiment, components similar to the first embodiment previously described are connected to main controller 50, and further, a reticle AF sensor 130, and an auxiliary encoder system 170 are connected. In the description below, these reticle AF sensor 130 and auxiliary encoder system 170 are included, and the embodiment will be described focusing mainly on the difference with the first embodiment.

Figure 14A:
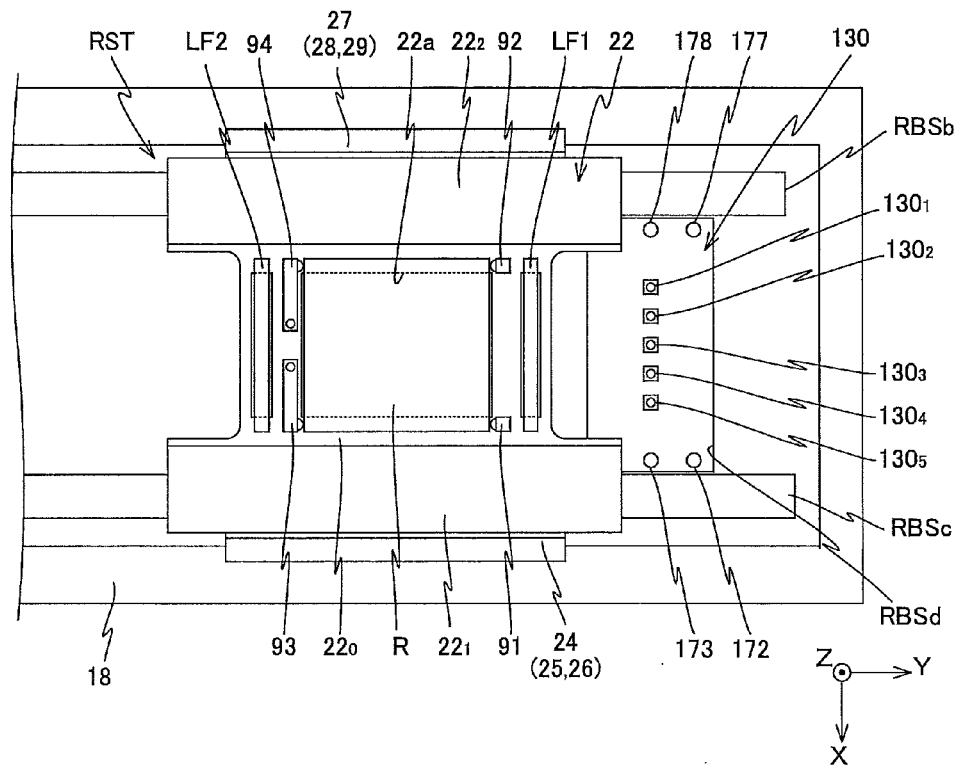
FIG. 14A is a planar view that shows a placement of a reticle AF sensor.
Figure 14B:
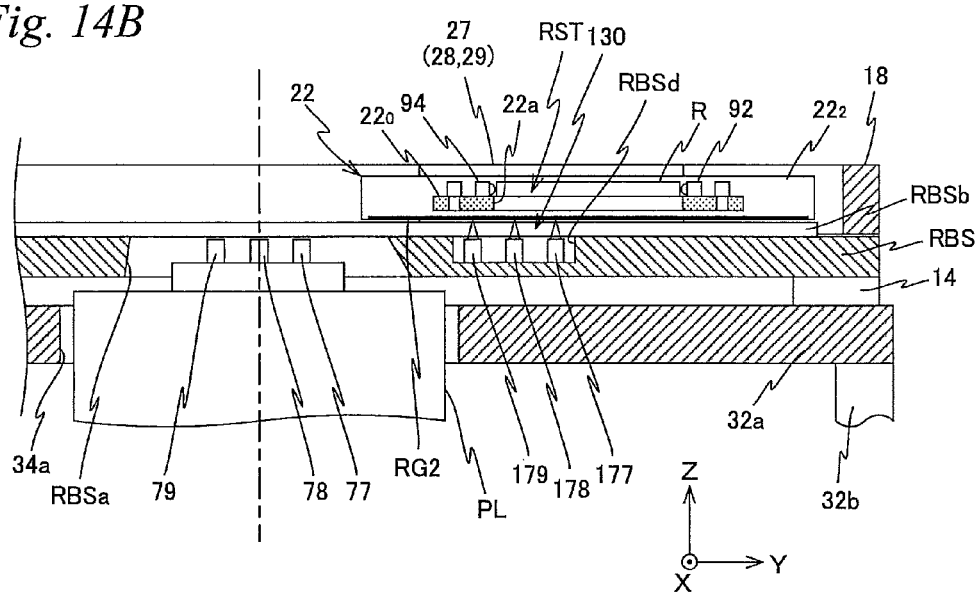
FIG. 14B is a longitudinal sectional view of components in the vicinity of the reticle stage device when the reticle stage moves by a predetermined distance in the +Y direction from the state in FIG. 14A.

FIGS. 14A and 14B show a configuration (including a placement of each component) of reticle AF sensor 130 and auxiliary encoder system 170 in a planar view and a side view, respectively.

Reticle AF sensor 130 is equipped with five Z interferometers 130$_1$ to 130$_5$ which are placed inside of recess section RBSd formed on the +Y side of opening RBSa of reticle stage surface plate RBS. Z interferometers 130$_1$ to 130$_5$ are installed with the outgoing end of the heads facing the +Z side, so that the Z interferometers can face the patterned surface (−Z surface) of reticle R mounted on reticle stage RST. Z interferometer 130$_1$ to 130$_5$ are arranged on a straight line in a direction (the X-axis direction) besides the scanning direction, which is perpendicular to the scanning direction (the Y-axis direction), spaced equally apart. Now, the X position of Z interferometer 130$_3$ located in the center of Z interferometers 130$_1$ to 130$_5$ approximately coincides with the center in the X-axis direction of reticle stage RST (in other words, reticle R which is mounted on reticle stage RST). Further, the arrangement distance (the separation distance between Z interferometer 130$_1$ which is located outermost on the −X side and Z interferometer 130$_5$ located outermost on the +X side) of Z interferometers 130$_1$ to 130$_5$ are slightly shorter than the width in the X-axis direction of aperture 22$a$ formed in reticle stage RST (reticle stage main body 22), and is approximately equal to the width in the X-axis direction of the illumination area of reticle R illuminated by illumination light IL.

As Z interferometers 130$_1$ to 130$_5$, an interferometer system disclosed in, for example, PCT International Publication No. 2007/087301 can be adopted. Each of Z interferometers 130$_1$ to 130$_5$ irradiates a measurement beam on a patterned surface of reticle R, and by receiving a reflection beam from the patterned surface, measures a surface position (a position in the Z-axis direction) of the patterned surface at the irradiation point of the measurement beam.

Measurement information of reticle AF sensor 130 (Z interferometers $130_1$ to $130_5$) is sent to main controller 50 (refer to FIG. 13). Details on focus mapping to make a focus map will be described later in the description.

Auxiliary encoder system 170 (refer to FIG. 13) are used to obtain (measure) positional information of reticle stage RST in the case of an AF mapping. Auxiliary encoder system 170 is equipped with a third and fourth reticle encoder system (hereinafter referred to as a third and fourth encoder system) 171 and 176 (refer to FIG. 13).

Figure 15A:
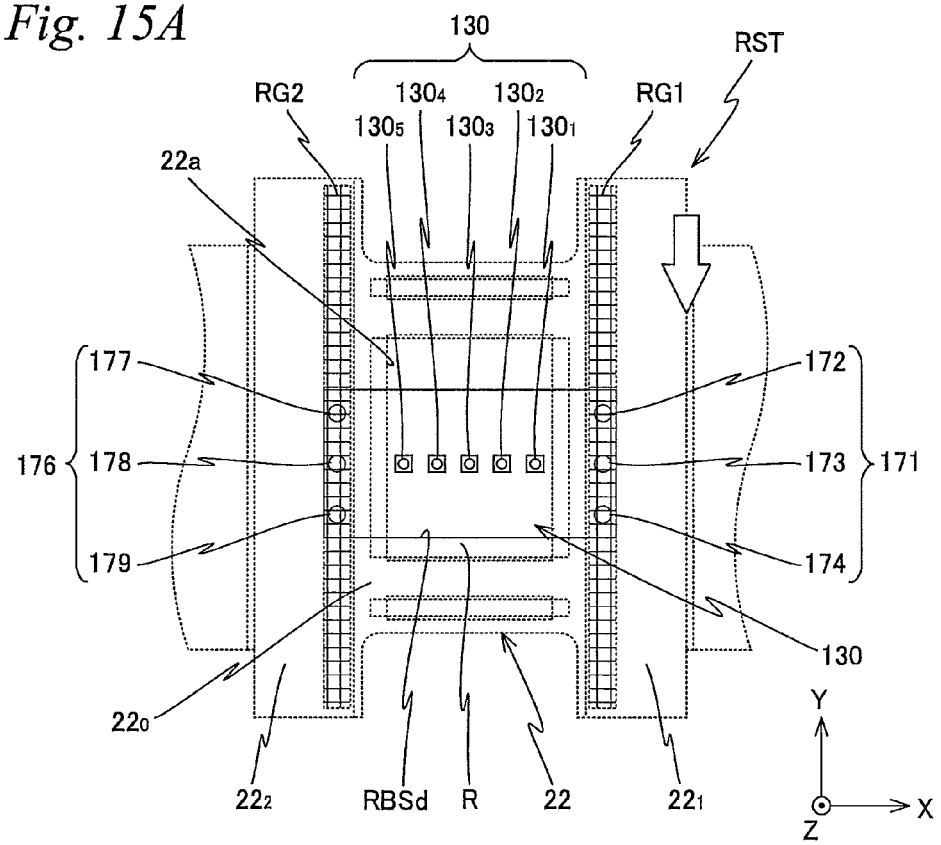
FIGS. 15A and 15B are views used to describe a configuration of the reticle AF sensor.

FIG. 15A shows placement (positional relation) of encoder heads 172, 173, 174, 177, 178, and 179 equipped in the third and fourth encoder systems 171 and 176, and gratings RG1 and RG2 (reticle stage RST) which are subject to measurement of encoder heads 172 to 174, and 177 to 179, respectively.

Encoder heads 172 to 174, and 177 to 179 are installed in recess section RBSd of reticle stage surface plate RBS. In this case, three encoder heads 172 to 174 are placed on the +X side of reticle AF sensor 130 (Z interferometers $130_1$ to $130_5$), and the remaining three encoder heads 177 to 179 are placed on the −X side. Encoder heads 173 and 178 are placed at the same Y position as reticle AF sensor 130 (Z interferometers $130_1$ to $130_5$).

The separation distance in the X-axis direction between encoder heads 172 to 174 and 177 to 179 is approximately equal to the separation distance in the X-axis direction between gratings RG1 and RG2 provided on the bottom surface of air slider sections $22_1$ and $22_2$ of reticle stage RST. Accordingly, when reticle stage RST is within a predetermined measurable range in the Y-axis direction, encoder heads 172 to 174 face grating RG1, together with encoder heads 177 to 179 that face grating RG2.

As encoder heads 172 to 174 and 177 to 179, a two-dimensional encoder head similar to encoder heads 72 to 74 and 77 to 79 previously described is employed. Here, the Y-axis direction and the Z-axis direction serve as the measurement directions of the four encoder heads 172, 174, 177, and 179, and the X-axis direction and Z-axis direction serve as the measurement directions of the two encoder heads 173 and 178.

Encoder heads 172 to 174 equipped in the third encoder system 171 irradiate a measurement beam on grating RG1 provided on the bottom surface of reticle stage RST (air slider section $22_1$). This generates a plurality of diffraction beams from grating RG1. Encoder heads 172 and 174 receive the plurality of diffraction lights generated at grating RG1 within the YZ plane (in the Y-axis direction), and with the irradiation point of each of the measurement beams serving as a measurement point, measure the position of grating RG1 (in other words, air slider section $22_1$ of reticle stage RST) in the Y-axis direction and the Z-axis direction. Encoder head 173 receives the plurality of diffraction lights generated within the XZ plane (in the X-axis direction), and with the irradiation point of the measurement beam serving as a measurement point, measures the position of grating RG1 (in other words, air slider section $22_1$ of reticle stage RST) in the X-axis direction and the Z-axis direction.

Encoder heads 177 to 179 equipped in the fourth encoder system 176 irradiate a measurement beam on grating RG2 provided on the bottom surface of reticle stage RST (air slider section $22_1$), like encoder heads 172 to 174 described above. This allows encoder heads 177 and 179 and encoder head 178 to receive the plurality of diffraction lights generated from grating RG2, respectively, as is the case with encoder heads 172 and 174, and encoder head 173. And, encoder heads 177 and 179 and encoder head 178 measure a position of grating RG2 (in other words, air slider section $22_2$ of reticle stage RST) in the Y-axis direction and the Z-axis direction and a position of grating RG2 (in other words, air slider section $22_2$ of reticle stage RST) in the X-axis direction and the Z-axis direction, respectively, with the irradiation point of each of the measurement beams serving as a measurement point.

Measurement information of the third and the fourth encoder systems 171 and 176 (encoder heads 172 to 174, and 177 to 179) is sent to main controller 50 (refer to FIG. 13).

Main controller 50 obtains a position in directions of six degrees of freedom (X, Y, Z, θx, θy, and θz) of reticle stage RST, based on the measurement information of the third and the fourth encoder systems 171 and 176 (encoder heads 172 to 174, and 177 to 179).

The positional relation of encoder heads 172 to 174 and 177 to 179 herein with respect to the center (measurement point of Z interferometer $130_3$ (irradiation point of the measurement beam)) of reticle AF sensor 130 is equal to the positional relation of encoder heads 72 to 74 and 77 to 79 equipped in reticle encoder system 70 with respect to the optical axis of projection optical system PL. Therefore, in the manner previously described, main controller 50 obtains a position in directions of six degrees of freedom of reticle stage RST from the measurement information of auxiliary encoder system 170 (encoder heads 172 to 174, and 177 to 179) at least in the AF mapping operation.

In the exposure apparatus of the third embodiment, the configuration for other sections is the same as exposure apparatus 100 of the first embodiment previously described.

Next, a focus mapping to make a surface position distribution (focus map) of the patterned surface of reticle R which is performed in the exposure apparatus of the third embodiment will be described.

Prior to the focus mapping, main controller 50 controls reticle stage drive system 340 based on measurement information of reticle encoder system 70 and moves reticle stage RST in the Y-axis direction so that plate shaped section $22_0$ is located above reticle AF sensor 130 on reticle stage surface plate RBS. By the movement of reticle stage RST, the irradiation point of the measurement beams of encoder heads 177 to 179 (172 to 174) comes to be positioned on grating RG2 (RG1). Then, main controller 50 obtains (measures) the positional information of reticle stage RST using auxiliary encoder system 170. In this case, when the position of reticle stage RST just before was measured by reticle encoder system 70, the position measurement will be switched from the position measurement using reticle encoder system 70 to a position measurement using auxiliary encoder system 170.

Figure 15B:
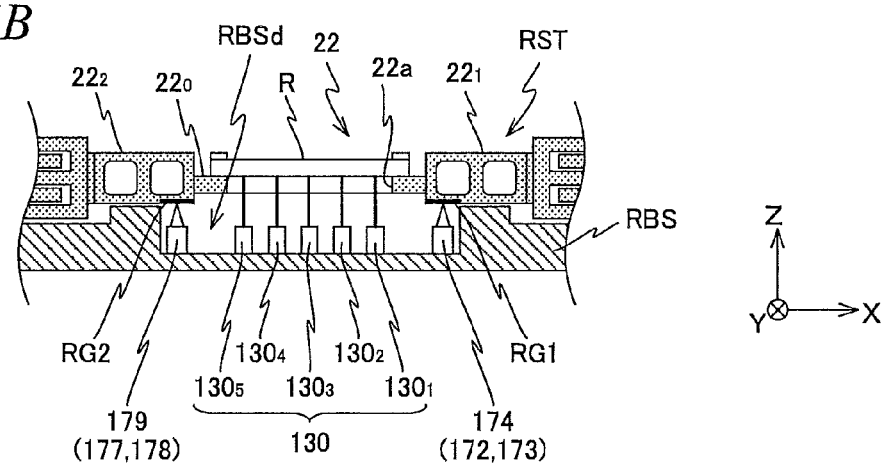

When reticle stage RST moves to the area above reticle AF sensor 130, main controller 50 starts scanning (scan) reticle stage RST in the −Y direction (a direction shown by an arrow in FIG. 15A) as shown in FIG. 15A. Furthermore, after the scanning begins, main controller 50 moves reticle stage RST in the −Y direction and has reticle AF sensor 130 (Z interferometers $130_1$ to $130_5$) activated (turned on), by the time the irradiation point of the measurement beam of reticle AF sensor 130 (Z interferometers $130_1$ to $130_5$) enters the patterned surface of reticle R mounted on reticle stage RST. This allows the measurement beam of Z interferometers $130_1$ to $130_5$ to be irradiated on the patterned surface of reticle R, as shown in FIG. 15B.

During the scanning (scan) of reticle stage RST, main controller 50 collects (performs a sampling of) surface position information (positional information in the Z-axis direction) of gratings RG1 and RG2 measured by encoder heads 173 and 178 equipped in auxiliary encoder system 170 and surface position information (positional information in the Z-axis direction) of the patterned surface of reticle R measured by reticle AF sensor 130 (Z interferometers $130_1$ to $130_5$) at a predetermined sampling interval, while associating the information with the XY positional information of reticle stage RST measured by auxiliary encoder system 170. Main controller 50 sequentially records the measurement information which has been collected in a memory (not shown).

When the irradiation point of the measurement beam of Z interferometers $130_1$ to $130_5$ moves off from the patterned surface of reticle R, main controller 50 completes the sampling described above.

Main controller 50 makes a surface position distribution (a focus map) of the patterned surface of reticle R, based on the measurement information collected above. The focus map is made by converting the surface position information of the patterned surface of reticle R measured by reticle AF sensor 130 (Z interferometers $130_1$ to $130_5$) into surface position information based on the surface position information of gratings RG1 and RG2 measured by encoder heads 173 and 178.

Figure 15C:
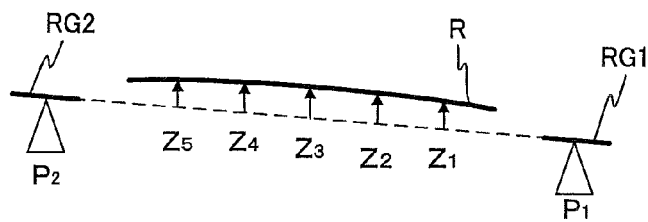
FIG. 15C is a view used to describe a making principle of a focus map.

More specifically, as shown in FIG. 15C, main controller 50 decides the reference of the surface position from a straight line (the broken line in FIG. 15C) which joins the surface position of grating RG1 measured by encoder head 173, or in other words, the measurement results of the surface position of grating RG1 at an irradiation point (a first reference point $P_1$) of the measurement beam of encoder head 173, and the surface position of grating RG2 measured by encoder head 178, or in other words, the measurement results of the surface position of grating RG2 at an irradiation point (a second reference point $P_2$) of the measurement beam of encoder head 178. And, main controller 50 converts each of the measurement results of Z interferometers $130_1$ to $130_5$ into surface position data $Z_1$ to $Z_5$, which serves as a displacement from the reference of the surface position.

Main controller 50 performs the conversion described above for all the surface position information that has been obtained. Furthermore, by using the XY positional information of reticle stage RST measured by auxiliary encoder system 170, main controller 50 edits the surface position data $Z_1$ to $Z_5$ which have been converted as a function of a position of an irradiation point on the patterned surface of the measurement beams of the corresponding Z interferometers $130_1$ to $130_5$. In this case, surface position data $Z_1$ to $Z_5$ is obtained for a finite number of dispersion points on the patterned surface. Therefore, surface position data $Z_1$ to $Z_5$ which has been obtained can be compensated as necessary, and can be converted into a continuous function of the position on the patterned surface. Thus, a focus map of the patterned surface of reticle R is made.

The focus map which is made in the manner described above is used, for example, in the case of exposure. Main controller 50 uses encoder heads 73 and 78 equipped in reticle encoder system 70 to measure the Z position (the surface position of gratings RG1 and RG2 provided in reticle stage RST) of reticle stage RST at the first and second reference points $P_1$ and $P_2$. Main controller 50 obtains a reference of the surface position of the patterned surface of reticle R using these results. By applying this reference to a focus map, the focus map can be used as a focus map of the patterned surface of reticle R mounted on reticle stage RST. Main controller 50 controls the surface position (Z position, tilts θx and θy) of the patterned surface of reticle R, by controlling the Z position and tilts θx and θy of reticle stage RST via reticle stage drive system 340, based on the focus map to which the reference has been applied. This allows the pattern formed on the patterned surface to be transferred precisely on wafer W via projection optical system PL.

Incidentally, by driving reticle stage RST (applying a drive force to reticle stage RST) for scanning exposure, reticle R mounted on reticle stage RST may be distorted. Now, in the case the distortion of reticle R cannot be ignored when comparing with the surface position distribution (in other words unevenness) of the patterned surface of reticle R described above, focus mapping should be performed also taking into account the distortion of reticle R. In such a case, in the case of focus mapping, main controller drives reticle stage RST with the same drive force as the time of scanning exposure. Further, main controller 50 makes a focus map for each of the scanning direction (the +Y direction (a plus scan) and the −Y direction (a minus scan)). Or, a focus map is made for each of a plurality of drive conditions including a drive force, scanning direction and the like. Then, main controller 50 controls the surface position of the patterned surface of reticle R based on the focus map which was made under the same conditions as at the time of scanning exposure.

Furthermore, the relation between the distortion of reticle R and the drive force of reticle stage RST can be measured in advance, and by driving reticle stage RST applying an appropriate drive force based on the results and the focus map, the distortion of reticle R can be canceled.

Further, in the case measurement results of reticle AF sensor 130 (Z interferometers $130_1$ to $130_5$) changes (when a change cannot be ignored) due to pitching (rotation around the X-axis) θx of reticle stage RST, main controller 50 performs a pitching correction of the focus map. To be more concrete, main controller 50 measures pitching θx of reticle stage RST using encoder heads 172, 174, 177, and 179 equipped in auxiliary encoder system 170 in the case of focus mapping, and by controlling reticle stage drive system 340 based on the results, maintains pitching θx of reticle stage RST at the time of scanning exposure. Or, in the case of focus mapping, main controller 50 measures pitching θx of reticle stage RST, and samples the measurement result with the surface position information of the patterned surface of reticle R measured by reticle AF sensor 130 (Z interferometers $130_1$ to $130_5$). Then, when converting the surface position information, main controller 50 corrects the surface position information to a surface position information based on pitching θx at the time of scanning exposure, using the measurement results of pitching θx. A focus map is made, based on the surface position information which has been corrected.

In the exposure apparatus of the third embodiment, similar to exposure apparatus 100 of the first embodiment previously described, loading of reticle R onto reticle stage RST and loading of wafer W onto wafer stage WST are performed under the control of main controller 50, and a focus mapping operation of reticle R and the like described above is also performed as preparatory operations. And, following this, reticle alignment and base line measurement of alignment system ALG are performed as preparatory operations. Then, main controller 50 performs an exposure operation by the step-and-scan method, after wafer alignment such as EGA and the like has been performed.

In the exposure operation above, wafer stage WST and reticle stage RST are relatively driven in the Y-axis direction under the control of main controller 50, and in doing so, main controller 50 controls the surface position of the patterned surface of reticle R based on the focus map of reticle R which was made earlier, as is previously described. Further, along with controlling X voice coil motor 66X and Y voice coil motor 66Y described above based on the measurement results of surface plate interferometer 240 so that reticle stage surface plate RBS maintains a predetermined state, main controller 50 also controls Z voice coil motor 66Z based on the measurement results of Z encoder 81, and indirectly adjusts the position of reticle R in the Z direction, and the θx and the θy directions, as is previously described.

As is described above, according to the exposure apparatus of the third embodiment, an equivalent effect can be obtained as in the first embodiment previously described. Adding to this, according to the exposure apparatus of the third embodiment, various kinds of effects as in the description below can be obtained.

In other words, according to the exposure apparatus of the third embodiment, encoder heads 172 to 174, and 177 to 179 equipped in auxiliary encoder system 170 are placed inside of recess section RBSd, in a placement where a positional relation within the XY plane with respect to the center of reticle AF sensor 130 becomes equal to the positional relation of encoder heads 72 to 74, and 77 to 79 within the XY plane with respect to optical axis AX of projection optical system PL. Therefore, main controller 50 sets the surface position of gratings RG1 and RG2 measured by encoder heads 173 and 178 prior (in advance) to exposure, or in other words, the irradiation point of the measurement beams of encoder heads 173 and 178 as a first and second reference point $P_1$ and $P_2$, and obtains a surface position information (information on distribution of the Z position, or in other words, a surface position distribution (focus map) of the patterned surface of reticle R) of reticle R based on the surface position information of these first and second reference points $P_1$ and $P_2$. And, in the case of exposure, main controller 50 uses encoder heads 73 and 78 equipped in reticle encoder system 70 to measure the Z position (the surface position (Z position) of gratings RG1 and RG2 provided in reticle stage RST) of reticle stage RST at the first and second reference points $P_1$ and $P_2$, and obtains the surface position of the patterned surface of reticle R using the measurement results. By applying this reference to a focus map, the focus map can be used as a focus map of the patterned surface of reticle R mounted on reticle stage RST. Main controller 50 controls the surface position (Z position, tilts θx and θy) of the patterned surface of reticle R, by controlling the Z position and tilts θx and θy of reticle stage RST via reticle stage drive system 340, based on the focus map to which the reference has been applied. This allows the pattern formed on reticle R to be transferred with good precision (precisely) on wafer W via projection optical system PL, while suppressing the occurrence of exposure defects due to defocus.

Incidentally, in the third embodiment above, the reference of the surface position of the focus map can be obtained, with an average of the surface position (Z position) of grating RG1 measured by encoder heads 172 to 174 being the surface position at the first reference point $P_1$, and an average of the surface position (Z position) of grating RG1 measured by encoder heads 177 to 179 being the surface position at the second reference point $P_2$.

Further, in the third embodiment above, when the loading position where loading of a reticle to reticle stage RST and unloading of a reticle from reticle stage RST are performed is near an end of reticle stage surface plate RBS on the +Y side, focus mapping of the reticle loaded on reticle stage RST can be performed in a procedure similar to the one previously described at the loading position, prior to, or in parallel with moving reticle stage RST to the area above projection optical system PL.

Incidentally, in the third embodiment above, while the case has been described where reticle AF sensor 130 is equipped with Z interferometers 130₁ to 130₅, as well as this, reticle AF sensor 130 can be configured by other sensors besides the interferometer. Further, at least a part of the configuration of the encoder system used to measure the positional information of reticle stage RST, the destaticizing apparatus, the cooling device, the gas purge of the space above the reticle stage with CDA, and the purge with CDA during the carriage of the reticle described in the second embodiment earlier, can be used together.

A Fourth Embodiment

Next, a fourth embodiment will be described, with reference to FIGS. 16 to 18B. Here, the same reference numerals will be used for the same or similar sections as in the first and third embodiments previously described, and a detailed description thereabout will be simplified or omitted.

Figure 16:
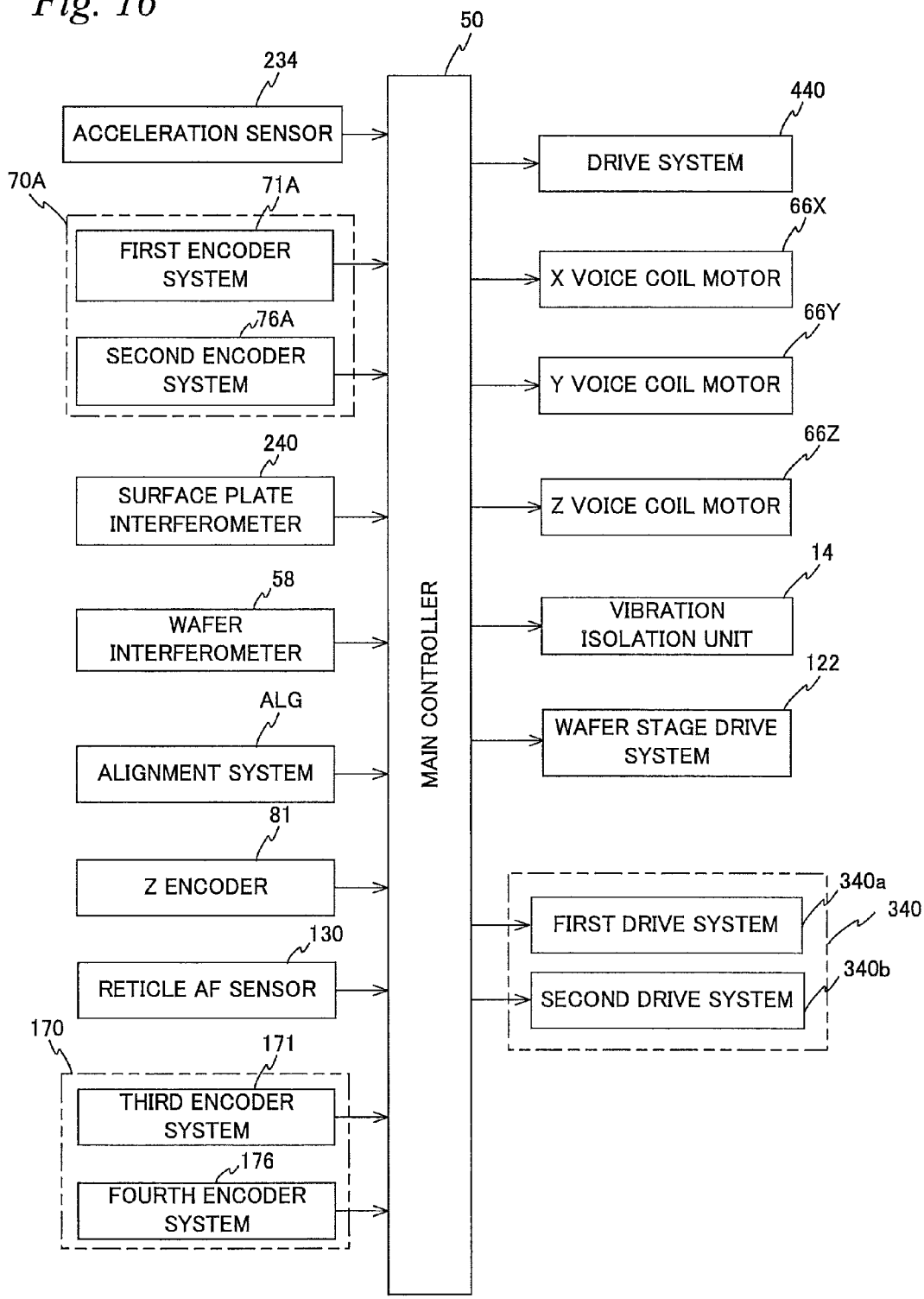
FIG. 16 shows a block diagram showing an input/output relation of a main controller that centrally configures a control system of an exposure apparatus in a fourth embodiment.

FIG. 16 shows a block diagram showing an input/output relation of main controller 50, which centrally configures a control system of the exposure apparatus of the fourth embodiment. As is obvious when comparing FIGS. 16 and 13, in the exposure apparatus of the fourth embodiment, instead of reticle encoder system 70 related to the third embodiment, a reticle encoder system 70A is provided. The description below includes reticle encoder system 70A, and the description will be made, focusing mainly on such differences with the third embodiment previously described.

Figure 17:
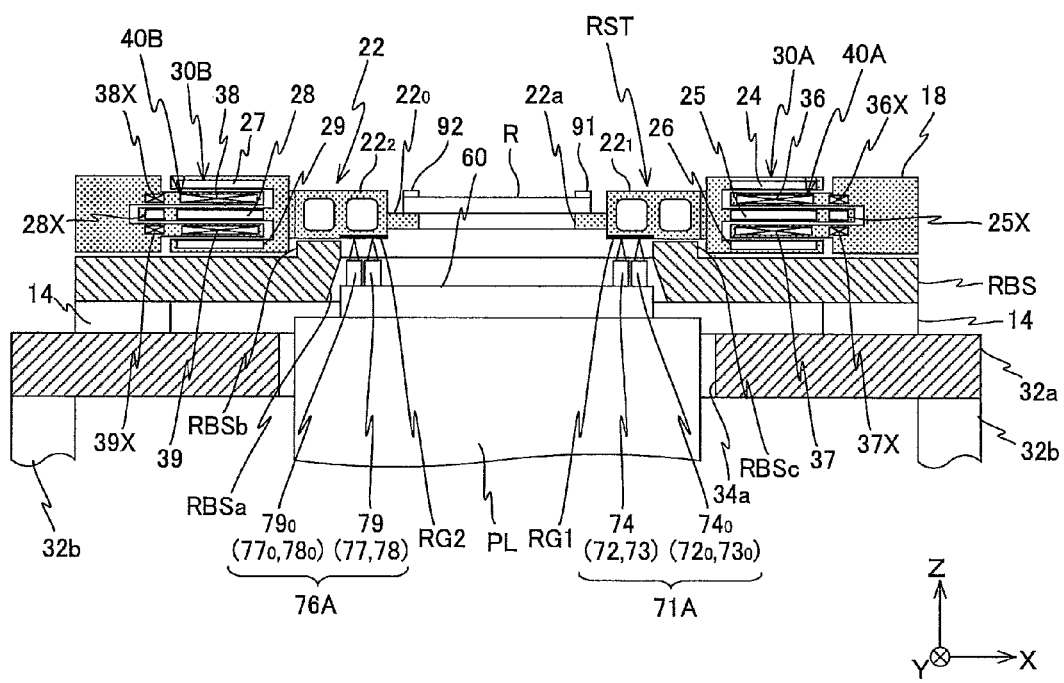
FIG. 17 is a longitudinal sectional view of a reticle stage device in the fourth embodiment.
Figure 18A:
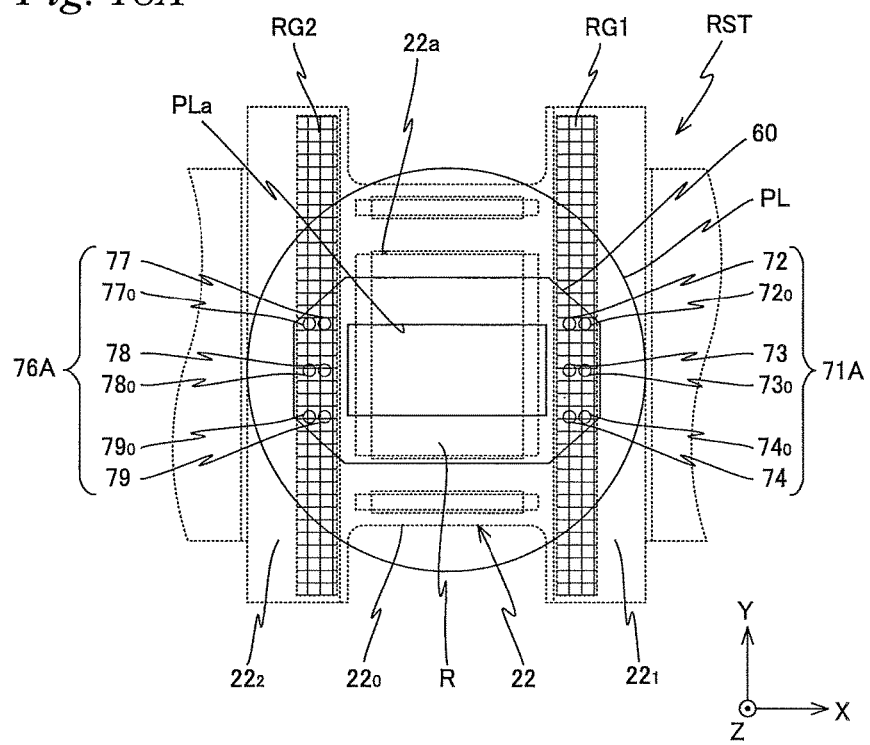
FIG. 18A is a view used to describe a configuration of a reticle encoder system in the fourth embodiment.
Figure 18B:
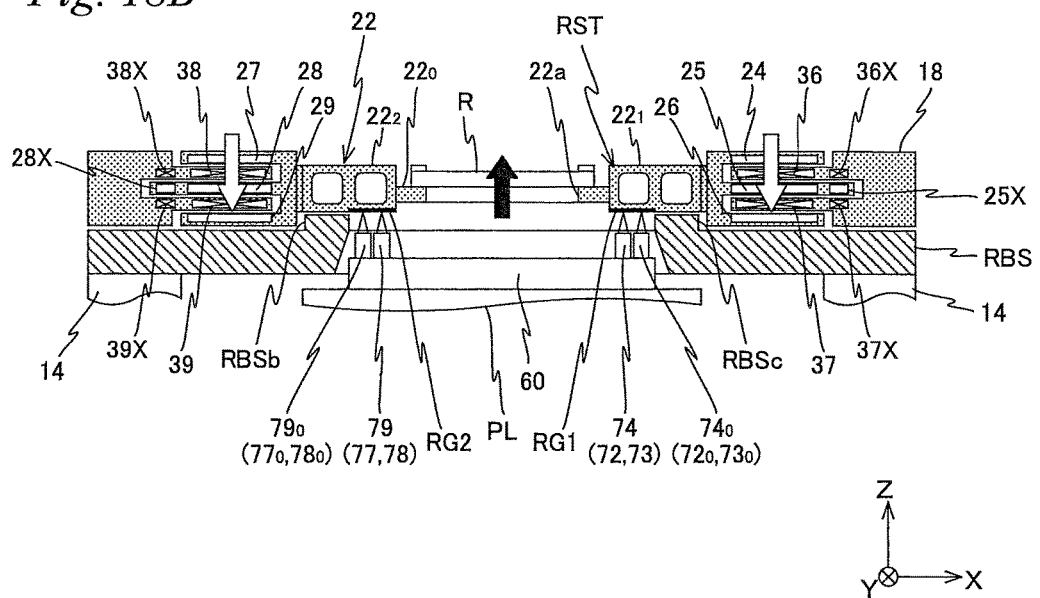
FIG. 18B is a view used to describe a deforming method of a reticle mounted on the reticle stage.

In the exposure apparatus of the fourth embodiment, as in the first and third embodiments, an upper surface member 60 of a hexagonal shape in a planar view having a rectangular opening PLa formed in the center, which is an optical path (passage) of illumination light IL having passed through opening RBSa of reticle stage surface plate RBS, is fixed to the top surface of projection optical system PL, as shown in FIGS. 17 and 18A.

As shown in FIG. 18A, on both ends (both sides of opening PLa) in the X-axis direction of the upper surface of upper surface member 60, six encoder heads each, which are encoder heads 72, 73, 74, 72₀, 73₀, and 74₀ and 77, 78, 79, 77₀, 78₀, and 79₀, are fixed in the shape of a three by two matrix. Of these heads, encoder heads 72 and 77 are placed in the vicinity of the corner on the +Y side of opening PLa, encoder heads 74 and 79 are placed in the vicinity of the corner on the −Y side, and encoder heads 73 and 78 are placed at the same Y position as the center (in other words, the optical axis of projection optical system PL) of opening PLa.

Encoder heads 72₀, 73₀, and 74₀ are placed at the same Y position as encoder heads 72, 73, and 74, respectively, equally distanced apart on the +X side. Encoder heads 77₀, 78₀, and 79₀ are placed at the same Y position as encoder heads 77, 78, and 79, respectively, equally distanced apart on the −X side.

As previously described, grating RG1 and RG2 are provided on the bottom surface of air slider sections 22₁ and 22₂ of reticle stage RST placed above of projection optical system PL. The separation distance in the X-axis direction between encoder heads 72 to 74 and 77 to 79 is set approximately equal to the separation distance in the X-axis direction between gratings RG1 and RG2. Therefore, concurrently with encoder heads 72 to 74 facing grating RG1, encoder heads 77 to 79 are made to face grating RG2 (for example, refer to FIG. 17).

Further, the width in the X-axis direction of grating RG1 is larger than the separation distance between encoder heads 72 to 74 and encoder heads 72$_0$ to 74$_0$. Similarly, the width in the X-axis direction of grating RG2 is larger than the separation distance between encoder heads 77 to 79 and encoder heads 77$_0$ to 79$_0$. Accordingly, with encoder heads 72 to 74, encoder heads 72$_0$ to 74$_0$ face grating RG1. At the same time, with encoder heads 77 to 79, encoder heads 77$_0$ to 79$_0$ face grating RG2.

Here, the Y-axis direction and the Z-axis direction serve as the measurement directions of the four encoder heads 72, 74, 77, and 79, and the X-axis direction and Z-axis direction serve as the measurement directions of the two encoder heads 73 and 78. Further, as encoder heads 72$_0$ to 74$_0$, and 77$_0$ to 79$_0$, an encoder head is employed whose measurement direction is at least in a direction perpendicular to the measurement plane (gratings RG1 and RG2). In the embodiment, as encoder heads 72$_0$ to 74$_0$, and 77$_0$ to 79$_0$, two-dimensional encoder heads similar to encoder heads 72 to 74, and 77 to 79 are to be used.

As shown in FIG. 17, encoder heads 72, 73, 74, 72$_0$, 73$_0$, and 74$_0$ irradiate measurement beams on grating RG1 from below on the bottom surface of reticle stage RST (air slider section 22$_1$) via opening RBSa of reticle stage surface plate RBS, receive a plurality of diffraction lights generated in grating RG1, and obtain (measure) positional information of grating RG1 (in other words, air slider section 22$_1$ of reticle stage RST) in each of the measurement directions.

In this case, because both directions, which are the X-axis direction and the Y-axis direction serve as the periodic direction of gratings RG1 and RG2, by irradiating a coherent measurement beam (making the measurement beam enter), the diffraction lights are generated in both the X-axis direction and the Y-axis direction at a plurality of angles (diffraction angles). Therefore, encoder heads 72, 74, 72$_0$, and 74$_0$ receive the plurality of diffraction lights generated in the Y-axis direction, and with the irradiation point of each of the measurement beams serving as a measurement point, obtain 72$_0$ (measure) the positional information of grating RG1 (in other words, air slider section 22$_1$ of reticle stage RST) in the Y-axis direction and the Z-axis direction.

Encoder heads 73 and 73$_0$ receive the plurality of diffraction lights generated in the X-axis direction, and with the irradiation point of the measurement beam serving as a measurement point, obtain (measure) the positional information of grating RG1 (in other words, air slider section 22$_1$ of reticle stage RST) in the X-axis direction and the Z-axis direction.

In the embodiment, six encoder heads 72, 73, 74, 72$_0$, 73$_0$, and 74$_0$ configure a first encoder system 71A (refer to FIG. 16) whose measurement degree of freedom is in six degrees, which obtains (measures) the positional information of reticle stage RST in the X-axis direction, the Y-axis direction, and the Z-axis direction. Measurement information of the first encoder system 71A (encoder heads 72, 73, 74, 72$_0$, 73$_0$, and 74$_0$) is sent to main controller 50 (refer to FIG. 16).

Similar to encoder heads 72, 73, 74, 72$_0$, 73$_0$, and 74$_0$ described above, encoder heads 77, 78, 79, 77$_0$, 78$_0$, and 79$_0$ irradiate measurement beams on grating RG2 from below on the bottom surface of reticle stage RST (air slider section 22$_2$) via opening RBSa of reticle stage surface plate RBS, receive a plurality of diffraction lights generated in grating RG2, and obtain (measure) positional information of grating RG2 (air slider section 22$_2$ of reticle stage RST) in each of the measurement directions.

Now, encoder heads 77, 79, 77$_0$, and 79$_0$ receive the plurality of diffraction lights generated in the Y-axis direction, and with the irradiation point of each of the measurement beams serving as a measurement point, obtain (measure) the positional information of grating RG2 (in other words, air slider section 22$_2$ of reticle stage RST) in the Y-axis direction and the Z-axis direction. Encoder heads 78 and 78$_0$ receive the plurality of diffraction lights generated in the X-axis direction, and with the irradiation point of the measurement beam serving as a measurement point, obtain (measure) the positional information of grating RG2 (in other words, air slider section 22$_2$ of reticle stage RST) in the X-axis direction and the Z-axis direction.

In the embodiment, six encoder heads 77, 78, 79, 77$_0$, 78$_0$, and 79$_0$ configure a second encoder system 76A (refer to FIG. 16) whose measurement degree of freedom is in six degrees, which obtains (measures) the positional information of reticle stage RST in the X-axis direction, the Y-axis direction, and the Z-axis direction.

Measurement information of the second encoder system 76A (encoder heads 77, 78, 79, 77$_0$, 78$_0$, and 79$_0$) is sent to main controller 50 (refer to FIG. 16).

Main controller 50 obtains (computes) the positional information in directions of six degrees of freedom of reticle stage RST, or in other words, the X-axis direction, the Y-axis direction, the Z-axis direction, the θx direction, the θy direction, and the θz direction, with the center (optical axis) of projection optical system PL serving as a reference, based on the measurement information of the first and second encoder systems 71A and 76A (encoder heads 72 to 74 and 72$_0$ to 74$_0$, and 77 to 79 and 77$_0$ to 79$_0$). Reticle encoder system 70A is configured (refer to FIG. 16) including the first and the second encoder systems 71A and 76A.

Now, because reticle encoder system 70A of the fourth embodiment comprises two-dimensional encoder heads 72 to 74, and 77 to 79, a total of twelve measurement information can be obtained as in the first embodiment previously described. Therefore, main controller 50 obtains a Y position ($Y_1$) and an X position ($X_1$) of air slider section 22$_1$ of reticle stage RST, using the measurement values encoder heads 72, 74, and 73, as in the first embodiment previously described. Further, main controller 50 obtains a Y position ($Y_2$) and an X position ($X_2$) of air slider section 22$_2$ of reticle stage RST, using the measurement values encoder heads 77, 79, and 78, as in the first embodiment previously described.

Furthermore, by the average and difference of $Y_1$ and $Y_2$, main controller 50 obtains a Y position and a θz position (rotational amount in the θz direction, that is, yawing amount) of reticle stage RST, respectively, and obtains an X position of reticle stage RST from the average of $X_1$ and $X_2$.

Further, by the average and difference of the measurement values of the position in the Z-axis direction measured by encoder heads 73 and 78, main controller 50 obtains a Z position and a θy position (rotational amount in the θy direction, that is, rolling amount) of reticle stage RST. Further, the θx position ($θx_1$ ($θx_2$)) of air slider sections 22$_1$ and 22$_2$ is obtained from the difference between the measurement values of the position in the Z-axis direction measured by each of the encoder heads 72 and 74, and 77 and 79, and the θx position (rotational amount in the θx direction, that is, pitching amount) of reticle stage RST is obtained from the average of $θx_1$ and $θx_2$. In this case, the Z position of reticle stage RST can be obtained without averaging the two measurement values in each direction as is described above measured by encoder heads 73 and 78, and either of the measurement values can be used without modification.

Furthermore, in addition to the six two-dimensional encoder heads 72 to 74 and 77 to 79, because reticle encoder system 70A of the embodiment is equipped with another six two-dimensional encoder heads $72_0$ to $74_0$ and $77_0$ to $79_0$ located on the outer side in the X-axis direction of each of the two-dimensional encoder heads 72 to 74 and 77 to 79, measurement information (positional information) in an additional twelve degrees of freedom can be obtained. Therefore, main controller 50 obtains a bend (flexure) in the X-axis direction of reticle stage RST, for example, using measurement information (positional information in the Z-axis direction) by encoder heads 73, $73_0$, 78, and $78_0$. Incidentally, the bend (flexure) of reticle stage RST can be obtained from the measurement information (positional information which has been measured) by the three encoder heads which are distanced apart from one another in the X-axis direction. Incidentally, in the description below, measurement information by the encoder heads will also be referred to as measurement results.

Main controller 50 can also obtain the bend (flexure) in the X-axis direction of reticle stage RST from each of the measurement results of encoder heads 72, $72_0$, 77, and $77_0$ and the measurement results of encoder heads 74, $74_0$, 79, and $79_0$ in a similar manner, and from the three bend (flexure) information which has been obtained, the main controller can obtain the torsion of reticle stage RST in the Y-axis direction.

Further, main controller 50 can obtain tilt θx ($θx_{10}$ ($θx_{20}$)) of air slider section $22_1$ (air slider section $22_2$) from a difference of measurement results of encoder heads $72_0$ and $74_0$ ($77_0$ and $79_0$), and can also obtain torsion of reticle stage RST in the X-axis direction from $θx_{10}$, $θx_{20}$ (or $θx_1$, $θx_2$, and one of $θx_{10}$ and $θx_{20}$) together with $θx_1$ and $θx_2$ previously described.

Based on the positional information in directions of six degrees of freedom of reticle stage RST obtained in the manner described above and shape information including bend and torsion of reticle stage RST, main controller 50 drives (controls) reticle stage RST via reticle stage drive system 340.

In the exposure apparatus of the fourth embodiment, the configuration for other sections is the same as the exposure apparatus of the third embodiment previously described.

An active deformation (or in other words, flexure correction) of reticle R, which is performed by main controller 50 in the exposure apparatus of the fourth embodiment based on the shape (measurement results) of reticle stage RST measured by reticle encoder system 70A, will now be briefly described.

In other words, main controller 50 alters (adjusts) the shape of the patterned surface of reticle R held by reticle stage RST by deforming reticle stage RST, via reticle stage drive system 340. Main controller 50 finely drives reticle stage RST in the −Z direction, as shown in, for example, FIG. 18B, or more specifically, finely drives mover sections 24 to 29, which are fixed to the ends of reticle stage RST with respect to stator sections 36 to 39 fixed to counter mass 18, in the −Z direction, as shown by an outlined arrow in FIG. 18B. This causes a counterclockwise and clockwise bending moment to act on the −X side end and the +X side end of reticle stage main body 22, with protruding shaped sections RBSc and RBSb of reticle stage surface plate RBS supporting reticle stage RST in a non-contact manner serving as a supporting point, respectively, which lifts the center of reticle R held on reticle stage main body 22 in the +Z direction as shown by the black arrow in FIG. 18B, and the patterned surface bends (flexures) to take a convex shape on the +Z side.

Further, on the contrary, by finely driving mover sections 24 to 29 fixed to the ends of reticle stage RST with respect to stator sections 36 to 39 in the +Z direction, reticle stage main body 22 and the patterned surface of reticle R mounted on the main body bends (flexures) to take a convex shape on the −Z side. Main controller 50 controls the shape (flexure) of the patterned surface of reticle R by controlling the drive of reticle stage RST in the Z-axis direction, based on measurement results of the shape (flexure) of reticle stage RST by a focus map and reticle encoder system 70A. This allows the pattern formed on the patterned surface to be transferred precisely on wafer W via projection optical system PL.

As is described above, according to the exposure apparatus of the fourth embodiment, an equivalent effect can be obtained as in the third embodiment previously described. Adding to this, according to the exposure apparatus of the fourth embodiment, various kinds of effects as in the description below can be obtained.

More specifically, according to the exposure apparatus of the fourth embodiment, main controller 50 deforms the patterned surface of reticle R held by reticle stage RST by deforming reticle stage RST using reticle stage drive system 340, based on the shape (measurement results) of reticle stage RST which is measured by reticle encoder system 70A. This allows main controller 50 to deform the patterned surface of reticle R to a desired shape corresponding to the shape of reticle stage RST which has been measured, and for example, the patterned surface of reticle R can also be deformed to an ideal plane which is parallel to the XY plane. This allows the pattern formed on reticle R to be transferred with good precision (precisely) on wafer W via projection optical system PL, while suppressing distortion of the pattern image caused by deformation of the patterned surface and the occurrence of exposure defects due to defocus.

Incidentally, according to the exposure apparatus of the fourth embodiment, not only can reticle encoder system 70A measure the flexure of reticle stage RST, but also the torsion. Therefore, reticle stage RST can be deformed taking into consideration the torsion as well. Further, encoder heads 72 to 74 and 77 to 79 equipped in reticle encoder system 70A form a pair with encoder heads $72_0$ to $74_0$ and $77_0$ to $79_0$, respectively. Therefore, it is also possible to compute positional information of reticle stage RST, using an average of the measurement results of two each of the encoder heads that form a pair.

Incidentally, in the case the exposure apparatus of the fourth embodiment is equipped with a correction device which corrects a formation state of a projected image of the pattern by projection optical system PL, main controller 50 can deform reticle stage RST, taking into consideration the correction performance of the correction device. In other words, main controller 50 can deform reticle R via reticle stage RST so that distortion and the like in the projected image of the pattern of the patterned surface after the deformation can be corrected using the correction device.

Further, according to the exposure apparatus of the fourth embodiment, because reticle encoder system 70A is equipped with a total of twelve two-dimensional encoder heads, reticle encoder system 70A can measure not only the flexure but also the torsion in the shape of reticle stage RST.

When only flexure is taken into consideration in the shape of reticle stage RST, for example, the apparatus only has to be equipped with encoder heads 72 to 74 and 77 to 79, and the two encoder heads $73_0$ and $78_0$ which are used for position measurement of reticle stage RST.

Incidentally, while the fourth embodiment described above was described as a modified example of the third embodiment to simplify the description, the fourth embodiment does not necessarily have to be combined with the characteristic configuration (AF sensors) of the third embodiment as a premise, and the fourth embodiment can also be combined with the first of the second embodiment.

Further, in the fourth embodiment, while the case has been described where the active deformation of reticle R performed based on the shape (measurement results) of reticle stage RST measured by reticle encoder system 70A was used for deflection correction of the reticle, the active deformation of reticle R can also be used together for autofocus control of the wafer at the time of exposure.

Incidentally, because reticle encoder system 70 or 70A related to each of the first to fourth embodiments described above is equipped with six two-dimensional encoder heads, twelve measurement results can be obtained. Therefore, it is possible to measure not only the position of reticle stage RST in directions of six degrees of freedom (X, Y, Z, θx, θy, and θz) as is previously described, but is also possible, for example, to measure torsion of reticle stage RST around an axis passing through the center and is parallel to the X-axis, flexure of air slider sections $22_1$ and air slider sections $22_2$ in the Y-axis direction and the like.

Further, in each of the embodiments described above, while an example has been introduced where a permanent magnet which configures the second drive system 340b was installed in a part of the mover section which configures first drive system 340a, the present invention is not limited to this. Further, in a movable body device, the component corresponding to the second drive system 340b of the embodiments described above does not necessarily have to be provided.

Further, in each of the embodiments described above, while the case has been described where a surface (a measurement plane) on which gratings RG1 and RG2 were formed was arranged in reticle stage RST (a movable body), and a plurality of heads 72 to 74 and 77 to 79 were arranged outside of reticle stage RST, the embodiments are not limited to this. In each of the embodiments above, a plurality of heads, which irradiate measurement beams parallel to an axis perpendicular to a movement plane, on a measurement plane that is placed outside of the movable body and is parallel to a two-dimensional plane (the movement plane of the movable body), and receive the beams from the measurement surface, can be can be placed on a movable body. Further, the encoder head is not limited to a two-dimensional head (a 2DOF sensor), and can also be a one-dimensional head (a 1DOF sensor) or a three-dimensional head (a 3DOF sensor) whose measurement direction is in three directions which are the X-axis, the Y-axis, and the Z-axis directions.

Incidentally, in each of the embodiments above, while an example has been described where the positional information of reticle stage RST within the XY plane is obtained (measured) by a reticle encoder system, besides this, instead of the encoder system, or along with the encoder system, an interferometer system can be used to measure the positional information.

Further, of the first to fourth embodiments described above, two or more arbitrary embodiments can be combined. In this case, rather than all configurations in each of the embodiments above, only a part of the configuration can be combined with other embodiments.

Incidentally, in each of the embodiments described above, while the case has been described where the exposure apparatus was a dry type exposure apparatus that performs exposure of wafer W without liquid (water), as well as this, as is disclosed in, for example, PCT International Publication No. 99/49,504, EP Patent Application Publication No. 1,420,298, PCT International Publication No. 2004/055803, each of the embodiments described above can also be applied to an exposure apparatus which has a liquid immersion space including an optical path of the illumination light between a projection optical system and a wafer, and exposes the wafer with the illumination light via the projection optical system and the liquid in the liquid immersion space. Further, each of the embodiments described above can be applied to a liquid immersion exposure apparatus and the like whose details are disclosed in, for example, U.S. Patent Application Publication No. 2008/0088843 and the like.

Further, in each of the embodiments described above, while a case has been described where the exposure apparatus was a scanning exposure apparatus by a step-and-scan method, as well as this, each of the embodiments above can also be applied to a reduction projection exposure apparatus by a step-and-stitch method that synthesizes a shot area and a shot area, an exposure apparatus by a proximity method, a mirror projection aligner and the like. Moreover, each of the embodiments described above can also be applied to a multi-stage type exposure apparatus equipped with a plurality of wafer stages, as is disclosed in, for example, U.S. Pat. Nos. 6,590,634, 5,969,441, 6,208,407 and the like. Further, each of the embodiments described above can also be applied to an exposure apparatus equipped with a measurement stage including a measurement member (for example, a reference mark, and/or a sensor and the like) different from the wafer stage, as disclosed in, for example, International Publication No. 2005/074014.

Further, the magnification of the projection optical system in the exposure apparatus of each of the embodiments described above is not limited only to a reduction system, but also can be either an equal magnifying system or a magnifying system, and the projection optical system is not limited only to a dioptric system, but also can be either a catoptric system or a catadioptric system, and the projected image can be either an inverted image or an upright image.

Further, illumination light IL is not limited to the ArF excimer laser beam (wavelength 193 nm), and a far ultraviolet light such as the KrF excimer laser beam (wavelength 248 nm) and the like, not to mention vacuum ultraviolet light such as the $F_2$ laser beam (wavelength 157 nm), or an extra-high pressure mercury lamp that generates an emission line (such as the g-line having a wavelength 436 nm or the i-line having a wavelength of 365 nm) can also be used. Further, as the vacuum ultraviolet light, as is disclosed in, for example, U.S. Pat. No. 7,023,610, a harmonic wave, which is obtained by amplifying a single-wavelength laser beam in the infrared or visible range emitted by a DFB semiconductor laser or fiber laser, with a fiber amplifier doped with, for example, erbium (or both erbium and ytterbium), and by converting the wavelength of the harmonic wave into a wavelength of the ultraviolet range using a nonlinear optical crystal, can also be used.

Further, in each of the embodiments described above, illumination light IL of the exposure apparatus is not limited to the light having a wavelength equal to or more than 100 nm, and it is needless to say that the light having a wavelength less than 100 nm can be used. For example, in recent years, in order to expose a pattern equal to or less than 70 nm, an EUV exposure apparatus that makes an SOR or a plasma laser as a light source generate an EUV (Extreme Ultraviolet) light in a soft X-ray range (e.g. a wavelength range from 5 to 15 nm), and uses a total reflection reduction optical system designed under the exposure wavelength (e.g. 13.5 nm) and the reflective mask has been developed. In the EUV exposure apparatus, the arrangement in which scanning exposure is performed by synchronously scanning a mask and a wafer using a circular arc illumination can be considered, and therefore, each of the embodiments above can also be suitably applied to such an exposure apparatus. In addition, each of the embodiments described above can also be applied to an exposure apparatus that uses charged particle beams such as an electron beam or an ion beam.

Further, as is disclosed in, PCT International Publication No. 2001/035168, each of the embodiments above can also be applied to an exposure apparatus (lithography system) that forms line-and-space patterns on a wafer by forming interference fringes on the wafer.

Moreover, as disclosed in, for example, U.S. Pat. No. 6,611,316, each of the embodiments above can also be applied to an exposure apparatus that synthesizes two reticle patterns via a projection optical system and almost simultaneously performs double exposure of one shot area by one scanning exposure.

Incidentally, in the embodiment above, the object (an object subject to exposure which is irradiated with an energy beam) on which the pattern is to be formed is not limited to wafers, and other objects can also be used such as glass plates, ceramic substrates, or mask blanks.

Further, the exposure apparatus of the embodiment above is manufactured by assembling various subsystems, which include the respective constituents that are recited in the claims of the present application, so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits, and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

Incidentally, the disclosures of all publications, the Published PCT International Publications, the U.S. patent applications and the U.S. patents that are cited in the description so far related to exposure apparatuses and the like are each incorporated herein by reference.

Electronic devices such as semiconductor devices are manufactured through the steps of; a step where the function/performance design of the device is performed, a step where a reticle based on the design step is manufactured, a step where a wafer is manufactured from silicon materials, a lithography step where the pattern of a mask (the reticle) is transferred onto the wafer by the exposure apparatus (pattern formation apparatus) and the exposure method in each of the embodiments previously described, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, in the lithography step, because the device pattern is formed on the wafer by executing the exposure method previously described using the exposure apparatus in each of the embodiments above, a highly integrated device can be produced with good productivity.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that has an illumination optical system configured to illuminate a mask with an illumination light and a projection optical system configured to project a pattern image of the mask onto a substrate, and performs scanning exposure of the substrate by moving each of the mask and the substrate relative to the illumination light, the apparatus comprising:
  a body mechanism having a metrology frame and a surface plate, the metrology frame supporting the projection optical system, and the surface plate being placed above the projection optical system and having an opening through which the illumination light passes;
  a stage that has a slider and is placed on the surface plate, the slider having a chuck member that holds the mask in an opening through which the illumination light passes, the slider being movable in a first direction orthogonal to an optical axis of the projection optical system, and the mask being moved in the first direction in the scanning exposure;
  a drive system that has a motor and moves the stage on the surface plate, a part of the motor being provided at the stage;
  an encoder system that has a plurality of heads and measures positional information of the stage, the plurality of heads being placed apart in a second direction perpendicular to the first direction within a predetermined plane orthogonal to the optical axis of the projection optical system;
  a controller that is coupled to the encoder system and the drive system, and controls the drive system based on the positional information measured with the encoder system; and
  a partition wall member that forms a first space containing an optical path of the illumination light, between the illumination optical system and the stage,
  wherein the partition wall member has a cylindrical section and a pair of plate shaped sections, the cylindrical section surrounding the optical path, and the pair of plate shaped sections being placed on a lower end side of the cylindrical section and being provided extending on one side and an other side of the cylindrical section in the first direction, respectively, the pair of plate shaped sections each have a lower surface facing an upper surface of the stage that is moved below the pair of plate shaped sections in the scanning exposure, and are each placed so that the lower surface is substantially parallel to the predetermined plane, and in the scanning exposure, the stage is moved while the upper surface of the stage is in proximity to the lower surfaces of the pair of plate shaped sections so that the first space is substantially airtightly formed by the partition wall member, the stage and the mask.

2. The exposure apparatus according to claim 1, wherein in the scanning exposure, the stage is moved while an upper surface of the slider in which the opening is formed is in proximity to the lower surfaces of the pair of plate shaped sections.

3. The exposure apparatus according to claim 1, wherein the slider has a cover member having an upper surface on each of one end side and an other end side of the first direction, and in the scanning exposure, the stage is moved while the upper surfaces of the cover members are in proximity to the lower surfaces of the pair of plate shaped sections.

4. The exposure apparatus according to claim 1, wherein the cylindrical section has an upper end side connected to the illumination optical system, and the first space serves as a purge space into which a gas having a humidity of 10% or less than 10% is supplied.

5. The exposure apparatus according to claim 1, wherein the first space serves as a purge space into which clean dry air having a humidity of 1% or less than 1% is supplied.

6. The exposure apparatus according to claim 5, further comprising:

a second partition wall member that forms a second space containing an optical path of the illumination light, between the projection optical system and the stage, wherein the second space is formed substantially airtightly by the second partition wall member, the surface plate, the stage and the mask.

7. The exposure apparatus according to claim 6, wherein the second partition wall member has an upper end side connected to the surface plate and a lower end side connected to the projection optical system, and the second space serves as a purge space into which clean dry air having a humidity of 1% or less than 1% is supplied.

8. The exposure apparatus according to claim 6, further comprising:

a carrier system that carries a mask to an exchange position which is set on one side in the first direction with respect to the optical path of the illumination light and on which the stage is placed by the drive system; and a third partition wall member that forms substantially airtightly at least a part of a carrier path of the mask by the carrier system, as a third space, the at least the part of the carrier path including the exchange position.

9. The exposure apparatus according to claim 8, wherein the positional information of the stage placed at the exchange position is measured by the encoder system.

10. The exposure apparatus according to claim 6, further comprising:

a carrier system that carries a mask to an exchange position which is set on one side in the first direction with respect to the optical path of the illumination light and on which the stage is placed by the drive system; and a destaticizing device that is placed on a carrier path of the mask and removes static electricity of the mask, the mask being moved through the carrier path to an illumination area of the mask by the illumination light.

11. The exposure apparatus according to claim 1, wherein the encoder system has the plurality of heads provided on an upper end side of the projection optical system, and irradiates a measurement surface from below with a measurement beam from each of the plurality of heads via the opening of the surface plate, the measurement surface being placed on a lower surface side of the slider, and a reflection type grating being formed on the measurement surface.

12. The exposure apparatus according to claim 11, wherein the measurement surface is placed on both sides of the opening of the slider in the second direction, being provided extending in the first direction, and the measurement surface is provided at the slider to be placed lower than a lower surface of a mask held by the slider.

13. The exposure apparatus according to claim 12, wherein a two-dimensional grating is formed on the measurement surface, and the encoder system measures positional information of the stage in directions of six degrees of freedom including the first and the second directions.

14. The exposure apparatus according to claim 13, wherein each of the plurality of heads is a two-dimensional head that is capable of measuring positional information of the stage in two directions, the two directions being one direction parallel to the measurement surface and one direction perpendicular to the measurement surface.

15. The exposure apparatus according to claim 14, further comprising:

a fixing member that is placed on an upper end side of the projection optical system and is provided with the plurality of heads, wherein each of the plurality of heads is provided at the fixing member to be placed in the opening of the surface plate.

16. The exposure apparatus according to claim 15, further comprising:

a countermass having a frame shape that is placed on the surface plate and surrounds the slider, wherein the motor has a pair of movers placed with the opening of the slider between the pair of movers in the second direction and a pair of stators placed at the countermass, and is capable of moving the stage in a plurality of directions including the first direction.

17. The exposure apparatus according to claim 16, wherein the stage and the countermass are each supported by levitation above the surface plate.

18. The exposure apparatus according to claim 17, wherein the drive system has another motor different from the motor, the another motor being capable of moving the stage in the second direction.

19. The exposure apparatus according to claim 17, wherein the controller is capable of deforming a mask held by the slider, with the motor.

20. The exposure apparatus according to claim 17, wherein
the chuck member has a pair of vacuum chucks that are placed apart in the second direction in the opening of the slider and each hold a lower surface of the mask,
the stage has a fixing device that is placed at the slider and presses the mask at a plurality of points, and
the mask is held by the slider using the pair of vacuum chucks and the fixing device.

21. The exposure apparatus according to claim 17, further comprising:
a detection system that detects positional information of the mask in a third direction orthogonal to the first and the second directions, by irradiating the mask from below with a plurality of measurement beams, wherein
in a detection operation of the mask by the detection system, the positional information of the stage is measured by the encoder system.

22. The exposure apparatus according to claim 17, wherein
the surface plate is provided via a plurality of vibration isolation units, and
the exposure apparatus further comprises:
a plurality of actuators that drive the surface plate supported by the plurality of vibration isolation units.

23. A device manufacturing method, comprising:
exposing a substrate using the exposure apparatus according to claim 1; and
developing the substrate that has been exposed.

24. A method of making an exposure apparatus that has an illumination optical system configured to illuminate a mask with an illumination light and a projection optical system configured to project a pattern image of the mask onto a substrate, and performs scanning exposure of the substrate by moving each of the mask and the substrate relative to the illumination light, the method comprising:
providing a body mechanism having a metrology frame and a surface plate, the metrology frame supporting the projection optical system, and the surface plate being placed above the projection optical system and having an opening through which the illumination light passes;
providing a stage that has a slider and is placed on the surface plate, the slider having a chuck member that holds the mask in an opening through which the illumination light passes, the slider being movable in a first direction orthogonal to an optical axis of the projection optical system, and the mask being moved in the first direction in the scanning exposure;
providing a drive system that has a motor and moves the stage on the surface plate, a part of the motor being provided at the stage;
providing an encoder system that has a plurality of heads and measures positional information of the stage, the plurality of heads being placed apart in a second direction perpendicular to the first direction within a predetermined plane orthogonal to the optical axis of the projection optical system;
providing a controller that controls the drive system based on the positional information measured with the encoder system; and
providing a partition wall member that forms a first space containing an optical path of the illumination light between the illumination optical system and the stage,
wherein the partition wall member has a cylindrical section and a pair of plate shaped sections, the cylindrical section surrounding the optical path, and the pair of plate shaped sections being placed on a lower end side of the cylindrical section and being provided extending on one side and an other side of the cylindrical section in the first direction, respectively,
the pair of plate shaped sections each have a lower surface facing an upper surface of the stage that is moved below the pair of plate shaped sections in the scanning exposure, and are each placed so that the lower surface is substantially parallel to the predetermined plane, and
in the scanning exposure, the stage is moved while the upper surface of the stage is in proximity to the lower surfaces of the pair of plate shaped sections so that the first space is substantially airtightly formed by the partition wall member, the stage and the mask.

* * * * *